(12) United States Patent
Kaeriyama et al.

(10) Patent No.: US 9,716,440 B2
(45) Date of Patent: Jul. 25, 2017

(54) RECEIVING CIRCUIT AND SIGNAL RECEIVING METHOD

(75) Inventors: Shunichi Kaeriyama, Kanagawa (JP);
Kouichi Yamaguchi, Kanagawa (JP);
Koichi Nose, Kanagawa (JP)

(73) Assignee: RENASAS ELECTRONICS CORPORATION, Tokyo (JP)

( * ) Notice: Subject to any disclaimer, the term of this patent is extended or adjusted under 35 U.S.C. 154(b) by 849 days.

(21) Appl. No.: 14/117,760

(22) PCT Filed: Apr. 5, 2012

(86) PCT No.: PCT/JP2012/002403
§ 371 (c)(1),
(2), (4) Date: Nov. 14, 2013

(87) PCT Pub. No.: WO2012/157180
PCT Pub. Date: Nov. 22, 2012

(65) Prior Publication Data
US 2014/0085951 A1    Mar. 27, 2014

(30) Foreign Application Priority Data

May 18, 2011    (JP) ................................. 2011-111615

(51) Int. Cl.
*H02M 7/06* (2006.01)
*H04B 3/50* (2006.01)
(Continued)

(52) U.S. Cl.
CPC ............... *H02M 7/06* (2013.01); *H04B 3/50* (2013.01); *H04L 25/4902* (2013.01);
(Continued)

(58) Field of Classification Search
CPC .................................................. H04L 25/0266
See application file for complete search history.

(56) References Cited

U.S. PATENT DOCUMENTS 4,823,364 A * 4/1989 Herzog ............... H04L 25/0266
                                                        333/20
5,838,722 A * 11/1998 Consi ..................... H04L 25/02
                                                        326/82
(Continued)

FOREIGN PATENT DOCUMENTS

CN       101189786 A      5/2008
JP       61-218210 A      9/1986
(Continued)

OTHER PUBLICATIONS

Chinese Office Action received in corresponding Chinese Application No. 201280023531.1 dated Jun. 23, 2015.
(Continued)

*Primary Examiner* — Fritz M Fleming
*Assistant Examiner* — David Shiao
(74) *Attorney, Agent, or Firm* — Mattingly & Malur, PC

(57) ABSTRACT

Provided is a receiving circuit that operates in a power supply system different from a transmitting circuit outputting a transmission signal and receives the transmission signal through an AC coupling device where a primary coil through which the transmission signal flows and a secondary coil having a center tap to which a specified voltage is supplied from an external terminal are magnetically coupled, which includes a pulse width amplifier circuit that holds pulse signals appearing at both ends of the secondary coil for a specified period of time and outputs them as hold signals, respectively, and a differential amplifier that compares a voltage of the hold signal and a voltage of the hold signal and outputs a comparison result.

10 Claims, 45 Drawing Sheets

(51) Int. Cl.
*H04L 25/49* (2006.01)
*H04B 5/00* (2006.01)
*H04L 25/02* (2006.01)

(52) U.S. Cl.
CPC ............... *H01L 2224/451* (2013.01); *H01L 2224/48137* (2013.01); *H01L 2924/12032* (2013.01); *H01L 2924/13091* (2013.01); *H04B 5/0031* (2013.01); *H04L 25/0266* (2013.01)

(56) References Cited

U.S. PATENT DOCUMENTS

| | | |
|---|---|---|
| 6,262,600 B1 | 7/2001 | Haigh et al. |
| 6,873,065 B2 | 3/2005 | Haigh et al. |
| 7,064,442 B1 | 6/2006 | Lane et al. |
| 7,075,329 B2 | 7/2006 | Chen et al. |
| 7,113,587 B1 | 9/2006 | Fischer et al. |
| 7,302,247 B2 | 11/2007 | Dupuis |
| 2003/0042571 A1* | 3/2003 | Chen .................. H01F 17/0006 257/531 |
| 2006/0109918 A1* | 5/2006 | Brown .................... H04B 3/02 375/258 |
| 2008/0267301 A1* | 10/2008 | Alfano .................. H01L 23/48 375/258 |

FOREIGN PATENT DOCUMENTS

| | | |
|---|---|---|
| JP | 2002-118605 A | 4/2002 |
| JP | 2003-523147 A | 7/2003 |
| WO | 2010/089974 A1 | 8/2010 |

OTHER PUBLICATIONS

Shindo, Tomonori, "Renesas Develops New Type of Isolator with Photocoupler-Less Power Circuit", Nikkei Electronics, Issue of Sep. 6, 2010, pp. 12-13.

* cited by examiner

US 9,716,440 B2

RECEIVING CIRCUIT AND SIGNAL RECEIVING METHOD

TECHNICAL FIELD

The present invention relates to a receiving circuit and a signal receiving method and, particularly, to a receiving circuit and a signal receiving method that receive a signal through an AC coupling device.

BACKGROUND ART

When transmitting a signal between a plurality of semiconductor chips with different power supply voltages, if the signal is transmitted directly through a wire, it can cause damage to the semiconductor chips or a problem in signal transmission due to a voltage difference generated in the DC voltage component of the transmitted signal. Thus, when transmitting a signal between a plurality of semiconductor chips with different power supply voltages, the semiconductor chips are connected via an AC coupling device, so that only an AC signal is transmitted. As the AC coupling device, a capacitor or a transformer can be used.

The transformer is an AC coupling device where a primary coil and a secondary coil are magnetically coupled. In the case of using the transformer as the AC coupling device, by adjusting the winding ratio of the primary coil and the secondary coil of the transformer, a signal (received signal) with an appropriate voltage amplitude is transmitted to the semiconductor chip on the receiving end regardless of the voltage amplitude of a signal (transmission signal) transmitted from the semiconductor chip on the transmitting end. Therefore, by performing communication between the semiconductor chips operating at different power supply voltages through the transformer, there is no need to adjust the voltage amplitude of the transmission signal or the received signal on the semiconductor chip. In the following description, the transformer that is formed on the semiconductor chip is referred to as "on-chip transformer" according to several cases.

Examples of signal transmission techniques using a transformer are disclosed in Patent Literatures 1 to 6 and Non Patent Literature 1.

Patent Literatures 1 and 2 disclose the technique that uses two on-chip transformers and sends out a pulse signal to a first transformer when the value of data changes from a first value to a second value, and sends out the pulse signal to a second transformer when the value of data changes from the second value to the first value.

Patent Literature 3 discloses the structure in which a transformer is formed on another chip placed between a first semiconductor chip and a second semiconductor chip.

Patent Literature 4 discloses the technique that sends out a signal composed of one pulse to an on-chip transformer when the value of data changes from a first value to a second value, and sends out a signal composed of two pulses to the on-chip transformer when the value of data changes from the second value to the first value.

Patent Literature 5 discloses the technique that sends out a continuous pulse signal to an on-chip transformer during a period where the value of data is a first value, and fixes a signal to the on-chip transformer during a period where the value of data is a second value.

Patent Literature 6 discloses the technique that performs signal transmission between a primary circuit and a secondary circuit insulated from each other by using a transformer.

Non Patent Literature 1 discloses the technique that performs signal transmission between a high-voltage power circuit unit and a low-voltage control circuit unit through an on-chip transformer.

CITATION LIST

Patent Literature

PTL1: U.S. Pat. No. 6,873,065 B2
PTL2: U.S. Pat. No. 6,262,600 B1
PTL3: U.S. Pat. No. 7,064,442 B1
PTL4: U.S. Pat. No. 7,075,329 B2
PTL5: U.S. Pat. No. 7,302,247 B2
PTL6: Japanese Unexamined Patent Publication No. S61-218210

Non Patent Literature

NPL1: Tomonori Shindo "Renesas Develops New Type of Isolator with Photocoupler-Less Power Circuit", Nikkei Electronics, Issue of Sep. 6, 2010, pp. 12-13

SUMMARY OF INVENTION

Technical Problem

The inventor has found that the structure of the transformer as shown in FIG. 40 is typically used for the signal transmission techniques disclosed in the above-described Patent Literatures 1 to 6 and Non Patent Literature 1. FIG. 40 is a diagram showing a signal transmission system 100 in which a typical transformer structure is used. The signal transmission system 100 shown in FIG. 40 includes a transmitting circuit 120 that operates based on a first power supply (a power supply voltage VDD1 and a ground voltage GND1) that belong to a first power supply system, a receiving circuit 130 that operates based on a second power supply (a power supply voltage VDD2 and a ground voltage GND2) that belong to a second power supply system, and a transformer 110.

The transmitting circuit 120 includes a transmitting buffer 121. The receiving circuit 130 includes a receiving buffer 133. The transformer 110 is placed between the transmitting circuit 120 and the receiving circuit 130. The transformer 110 is an AC coupling device that is composed of a primary coil 111 and a secondary coil 112 and transmits an AC signal from the primary coil 111 to the secondary coil 112. The primary coil 111 and the secondary coil 112 are magnetically coupled to each other.

In the primary coil 111, one end is connected to an output terminal of the transmitting buffer 121, and the other end is connected to a ground voltage terminal (which is referred to hereinafter as GND1) through which the ground voltage GND1 is supplied. In the secondary coil 112, one end is connected to an input terminal of the receiving buffer 133, and the other end is connected to a ground voltage terminal (which is referred to hereinafter as GND2) through which the ground voltage GND2 is supplied.

In the signal transmission system 100, the transmitting buffer 121 converts transmission data VIN into a pulse signal and outputs it as a transmission signal V1 to the primary coil 111. The transmission signal V1 is converted into a magnetic signal by the primary coil 111, and the magnetic signal is converted into a received signal V2 by the secondary coil 112. The receiving buffer 133 reproduces the transmission data VIN based on the received signal V2 and outputs it as output data VOUT. This enables signal transmission between the first and second semiconductor chips that are electrically insulated from each other.

The signal transmission system 100 shown in FIG. 40 is mainly used for a power control circuit that handles several hundred volts, and therefore there is a case where the ground voltage GND1 on the transmitting circuit 120 side and the ground voltage GND2 on the receiving circuit 130 side vary widely. A differential voltage between the ground voltage GND1 and the ground voltage GND2 is referred to as a common mode voltage. When the common mode voltage varies widely, there is a problem that power supply noise occurs due to a parasitic coupling capacitor Cc formed between the primary coil 111 and the secondary coil 112 that constitute the transformer 110, which causes a signal transmission error. This problem is specifically described with reference to FIG. 41.

FIG. 41 is a timing chart showing the operation of the signal transmission system 100. As indicated by V1-GND1 in FIG. 41, in the transmission signal V1 that is output from the transmitting buffer 121, a pulse signal with a positive amplitude is superimposed during the period where the transmission data VIN is High level, and a pulse signal with a negative amplitude is superimposed during the period where the transmission data VIN is Low level. At this time, when there is a relative voltage difference as indicated by GND2-GND1 in FIG. 41 between the ground voltage GND1 and the ground voltage GND2, a voltage difference between the received signal V2 received by the receiving buffer 133 and the ground voltage GND2 is a waveform as indicated by V2-GND2 in FIG. 41. In other words, a relative voltage difference between the ground voltage GND1 and the ground voltage GND2, which is the common mode voltage, is superimposed on the received signal V2.

When the common mode voltage varies widely, the voltage level of the received signal V2 exceeds an upper threshold voltage Vth1 of the receiving buffer 133 even during the period where the transmitting buffer 121 does not transmit a pulse signal with a positive amplitude as the transmission signal V1, which causes a defect in the waveform of the output data VOUT that is reproduced by the receiving buffer 133. Further, the voltage level of the received signal V2 falls below a lower threshold voltage Vth2 of the receiving buffer 133 even during the period where the transmitting buffer 121 does not transmit a pulse signal with a negative amplitude as the transmission signal V1, which causes a defect in the waveform of the output data VOUT that is reproduced by the receiving buffer 133. As a result, a signal transmission error occurs during the period X which is VOUT-GND2 in FIG. 41.

As described above, the existing signal transmission techniques between a plurality of semiconductor chips with different power supply voltages have a problem that a signal transmission error occurs due to the effect of the common mode voltage.

Solution to Problem

A receiving circuit according to the present invention is a receiving circuit that operates in a power supply system different from a transmitting circuit outputting a transmission signal and receives the transmission signal through an AC coupling device where a primary coil through which the transmission signal flows and a secondary coil having a center tap to which a specified voltage is supplied from an external terminal are magnetically coupled, including a pulse width amplifier circuit that holds pulse signals appearing at both ends of the secondary coil for a specified period of time and outputs the signals as first and second hold signals, respectively, and a comparator circuit that compares a voltage of the first hold signal and a voltage of the second hold signal and outputs a comparison result.

A signal receiving method of a receiving circuit according to the present invention is a signal receiving method of a receiving circuit that operates in a power supply system different from a transmitting circuit outputting a transmission signal and receives the transmission signal through an AC coupling device where a primary coil through which the transmission signal flows and a secondary coil having a center tap to which a specified voltage is supplied from an external terminal are magnetically coupled, the method including holding pulse signals appearing at both ends of the secondary coil for a specified period of time and outputting the signals as first and second hold signals, respectively, and comparing a voltage of the first hold signal and a voltage of the second hold signal and outputting a comparison result.

According to the circuit structure and the method described above, it is possible to prevent signal transmission error by suppressing the effect of a common mode voltage without an increase in circuit size.

Advantageous Effects of Invention

According to the present invention, it is possible to provide a receiving circuit and a signal receiving method that can prevent signal transmission error by suppressing the effect of a common mode voltage without an increase in circuit size.

DESCRIPTION OF EMBODIMENTS

Figure 42:
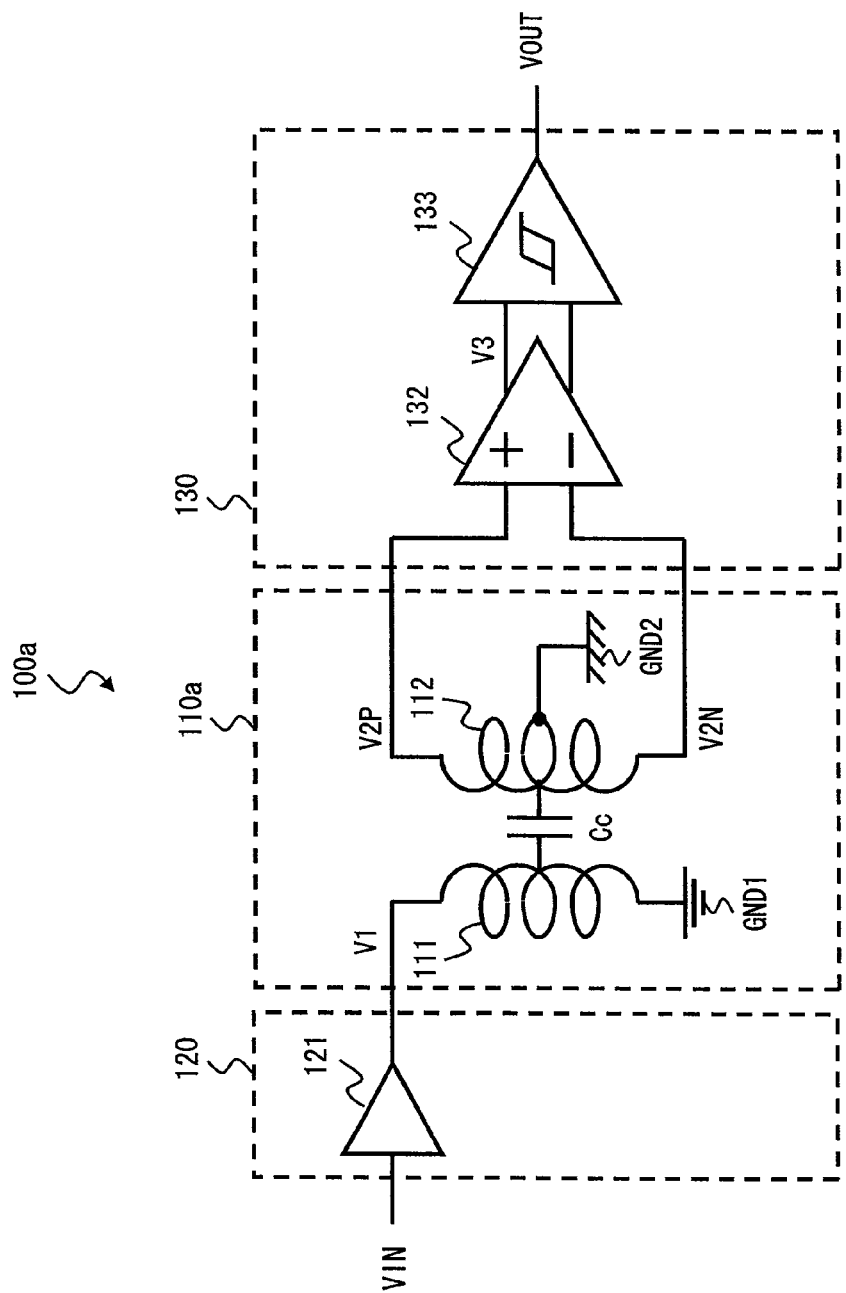
FIG. 42 is a block diagram showing a signal transmission system according to an idea before reaching the present invention.

First, the inventor has studied a signal transmission system 100a as shown in FIG. 42 before reaching the present invention. The signal transmission system 100a shown in FIG. 42 includes a transmitting circuit 120, a receiving circuit 130, and a transformer 110a. The transmitting circuit 120 is formed on a first semiconductor chip and operates based on a first power supply (a power supply voltage VDD1 and a ground voltage GND1) that belong to a first power supply system. The receiving circuit 130 is formed on a second semiconductor chip and operates based on a second power supply (a power supply voltage VDD2 and a ground voltage GND2) that belong to a second power supply system. The transformer 110a may be formed on any of the first and second semiconductor chips or on another chip.

The transmitting circuit 120 includes a transmitting buffer 121. The receiving circuit 130 includes a receiving buffer 133 and a differential amplifier 132. The transformer 110a is placed between the transmitting circuit 120 and the receiving circuit 130.

The transformer 110a is an AC coupling device that is composed of a primary coil 111 and a secondary coil 112 and transmits an AC signal from the primary coil 111 to the secondary coil 112. The primary coil 111 and the secondary coil 112 are magnetically coupled to each other. Note that a center tap is placed on the secondary coil 112.

In the primary coil 111, one end is connected to an output terminal of the transmitting buffer 121, and the other end is connected to a ground voltage terminal GND1. On the other hand, in the secondary coil 112, one end is connected to a non-inverting input terminal of the differential amplifier 132, the other end is connected to an inverting input terminal of the differential amplifier 132, and the center tap is connected to a ground voltage terminal GND2. Further, a pair of output terminals of the differential amplifier 132 are respectively connected to corresponding input terminals of the receiving buffer 133.

Figure 40:
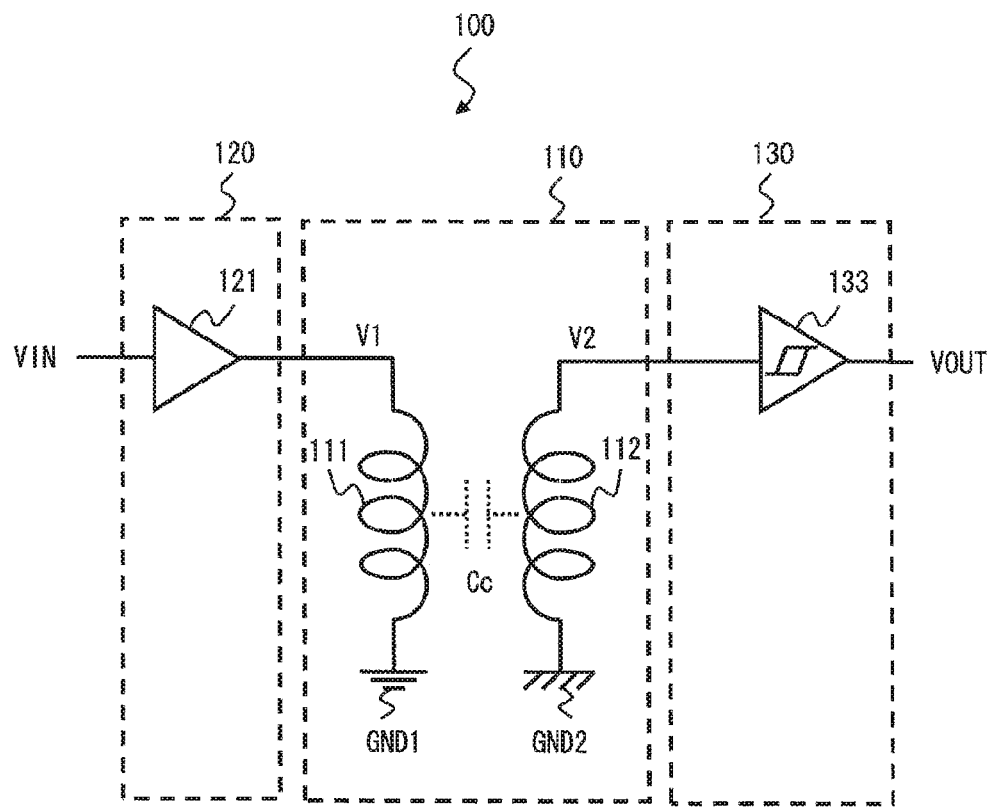
FIG. 40 is a block diagram showing a signal transmission system according to related art.
Figure 41:
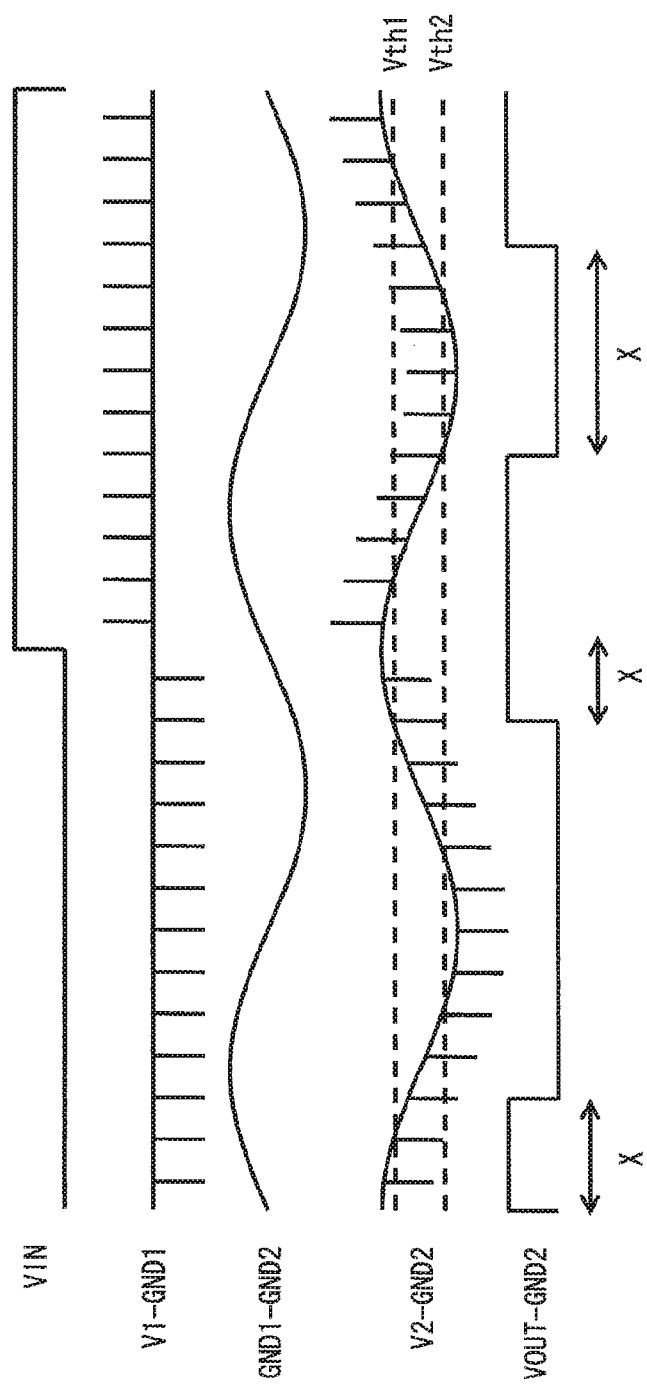
FIG. 41 is a timing chart showing the operation of a signal transmission system according to related art.
Figure 43:
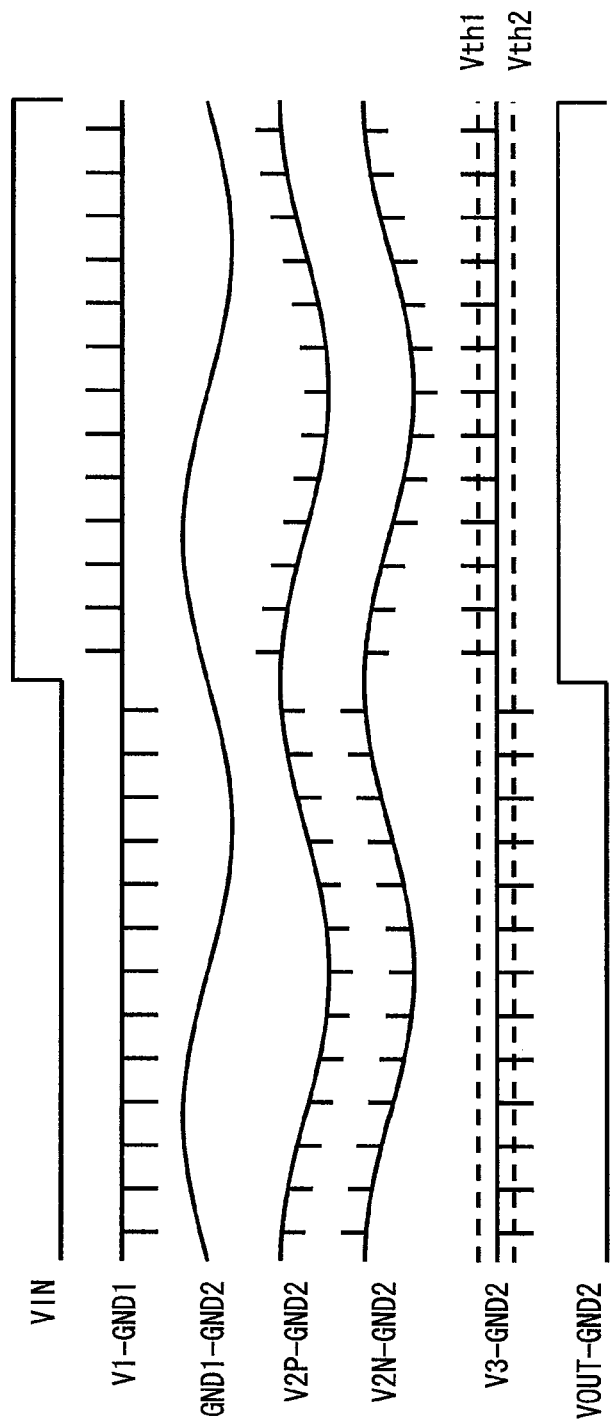
FIG. 43 is a timing chart showing the operation of the signal transmission system according to the idea before reaching the present invention.

FIG. 43 is a timing chart showing the operation of the signal transmission system 100a. Note that the basic operation of the signal transmission system 100a is the same as that of the signal transmission system 100 shown in FIG. 40, and therefore the characteristic points of the operation of the signal transmission system 100a are mainly described hereinbelow. When there is a relative voltage difference as indicated by GND1-GND2 in FIG. 43 between the ground voltage GND1 and the ground voltage GND2, a voltage difference between the voltage of a received signal V2P that is generated at one end of the secondary coil 112 and the ground voltage GND2 is a waveform as indicated by V2P-GND2 in FIG. 43. On the other hand, a voltage difference between the voltage of a received signal V2N that is generated at the other end of the secondary coil 112 and the ground voltage GND2 is a waveform as indicated by V2N-GND2 in FIG. 43.

As is obvious from those two waveforms, when a pulse signal with a positive amplitude is transmitted as the transmission signal V1, a pulse signal with a positive amplitude appears at one end of the secondary coil 112, and a pulse signal with a negative amplitude appears at the other end of the secondary coil 112. On the other hand, when a pulse signal with a negative amplitude is transmitted as the transmission signal V1, a pulse signal with a negative amplitude appears at one end of the secondary coil 112, and a pulse signal with a positive amplitude appears at the other end of the secondary coil 112. Accordingly, pulse signals having different directions of amplitude appear at both ends of the secondary coil 112. In other words, pulse signals that are inverted from each other with respect to the amplitude center potential appear at both ends of the secondary coil 112. In-phase common mode voltages are superimposed on the received signals V2P and V2N that appear at both ends of the secondary coil 112.

Accordingly, the differential amplifier 132 cancels out the in-phase common mode voltages superimposed on the received signals V2P and V2N and outputs the waveform as indicated by V3-GND2 in FIG. 43. Then, the receiving buffer 133 reproduces the transmission data VIN based on the output pulse of the differential amplifier 132 and outputs it as the output data VOUT. In this manner, the signal transmission system 100a uses the secondary coil 112 having the center tap and the differential amplifier 132 to thereby suppress the effect of the common mode voltage and prevent a signal transmission error.

To enable the operation of the signal transmission system 100a, it is necessary to lower the frequency of a carrier signal (carrier wave) down to the frequency at which the differential amplifier 132 can operate. However, it is required to increase the size of the transformer 110a in order to lower the frequency of a carrier signal, which results in a problem that the circuit size increases.

Note that, in general, when a differential amplifier is composed of a micro CMOS, the differential amplifier can amplify a high-frequency input signal. However, the differential amplifier that is composed of the micro CMOS is not suitable for a power control semiconductor to which a high voltage is supplied.

Embodiments of the present invention are described hereinafter with reference to the drawings. The drawings are given in simplified form by way of illustration only, and thus are not to be considered as limiting the present invention. The same elements are denoted by the same reference symbols, and the redundant explanation is omitted.

First Embodiment

Figure 1:
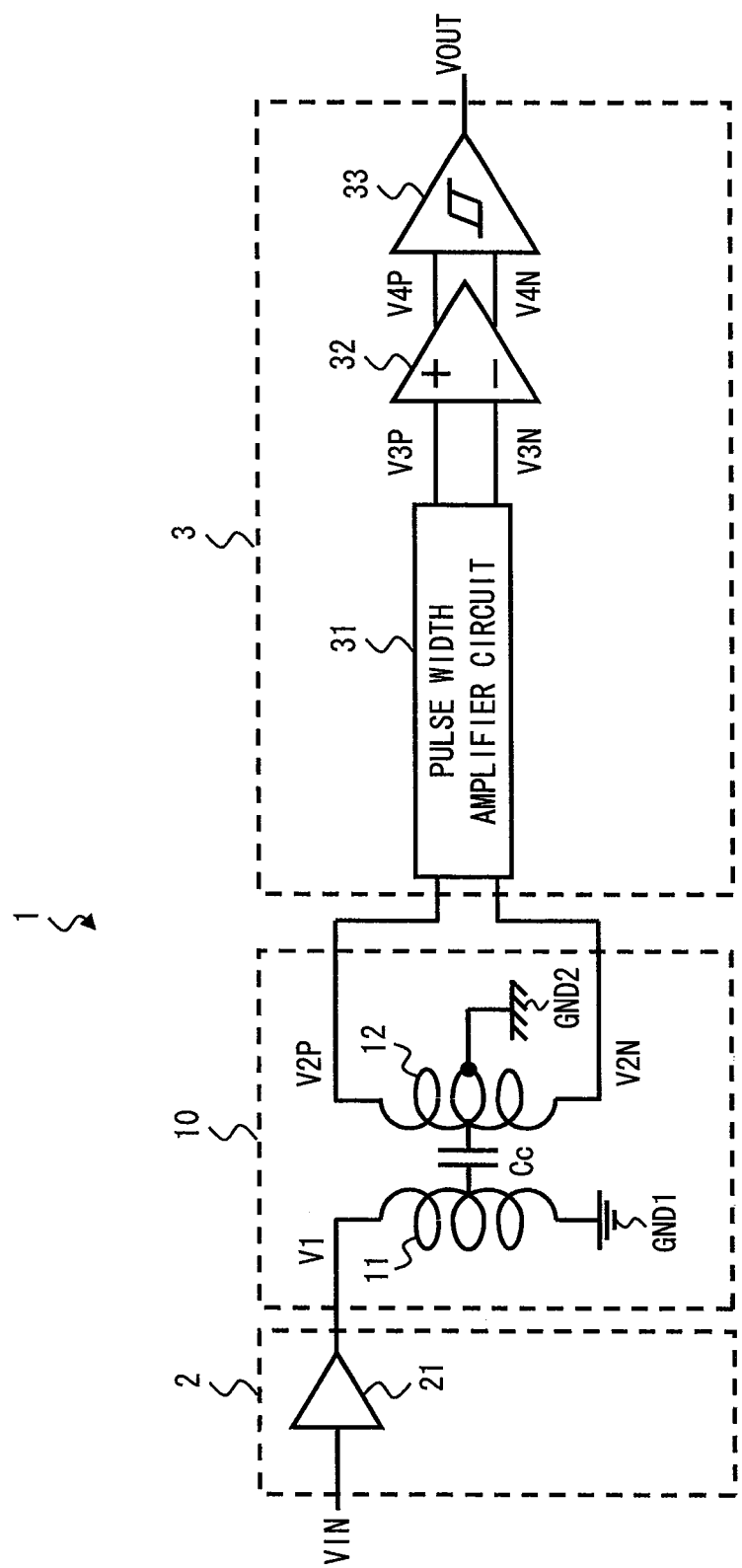
FIG. 1 is a block diagram showing a signal transmission system according to a first embodiment of the invention.

FIG. 1 is a diagram showing a signal transmission system 1 according to a first embodiment of the invention. A receiving circuit 3 in the signal transmission system 1 according to this embodiment includes a pulse width amplifier circuit that increases the pulse width of pulse signals appearing at both ends of a secondary coil 12 having a center tap and outputs them as first and second hold signals. Note that a specified voltage is supplied from an external terminal to the center tap of the secondary coil. The receiving circuit 3 can thereby suppress the effect of the common mode voltage and prevent signal transmission error without increase in circuit size. This is specifically described hereinbelow.

The signal transmission system 1 shown in FIG. 1 includes a transmitting circuit 2, a receiving circuit 3, and a transformer 10. The transformer 10 includes a primary coil 11 and a secondary coil 12. The transformer 10 is an AC coupling device that transmits an AC signal from the primary coil 11 to the secondary coil 12. The primary coil 11 and the secondary coil 12 are magnetically coupled to each other.

It is assumed that a parasitic coupling capacitor Cc is formed between the primary coil 11 and the secondary coil 12. The parasitic coupling capacitor Cc is a capacitor in which an insulator filled between a metal wire forming the primary coil 11 and a metal wire forming the secondary coil 12 is a dielectric film. It is assumed below that the parasitic coupling capacitor Cc has the same structure in other embodiments.

Figure 2:
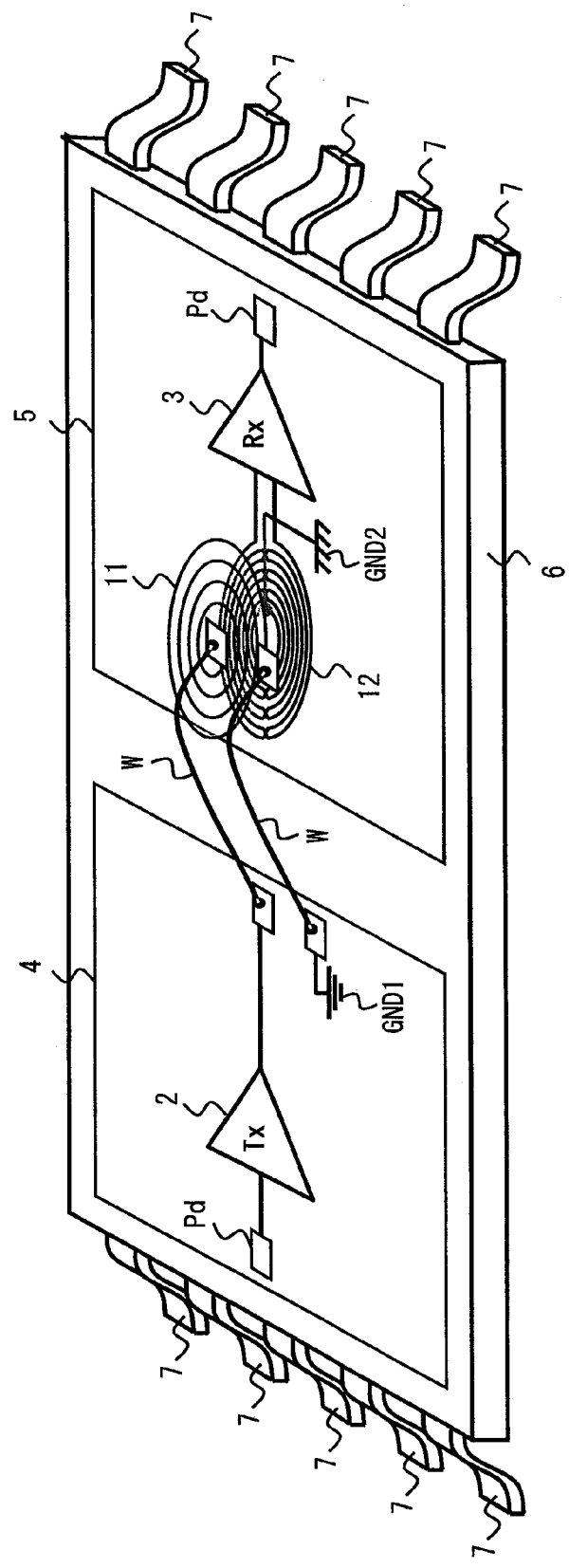
FIG. 2 is a schematic diagram showing implementation of the signal transmission system according to the first embodiment of the invention.

FIG. 2 shows an example of implementation of the signal transmission system 1. In the implementation shown in FIG. 2, a first semiconductor chip 4 and a second semiconductor chip 5 are mounted on a semiconductor package 6. Each of the first semiconductor chip 4 and the second semiconductor chip 5 has a pad Pd. The pad Pd of each of the first semiconductor chip 4 and the second semiconductor chip 5 is connected to a lead terminal 7 mounted on the semiconductor package 6 through a bonding wire, which is not shown.

On the first semiconductor chip 4, the transmitting circuit 2 is formed. On the second semiconductor chip 5, the receiving circuit 3, the primary coil 11 and the secondary coil 12 are formed. Further, a pad that is connected to the transmitting circuit 2 is formed on the first semiconductor chip 4, and a pad that is connected to the primary coil 11 is formed on the second semiconductor chip 5. The transmitting circuit 2 is connected to one end of the primary coil 11 that is formed on the second semiconductor chip 5 through the pad and a bonding wire W. Further, the other end of the primary coil 11 is connected to a ground voltage terminal GND1 on the first semiconductor chip 4 side through the pad and a bonding wire W.

Note that, in the example of FIG. 2, the primary coil 11 and the secondary coil 12 are respectively formed on a first wiring layer and a second wiring layer that are vertically laminated in one semiconductor chip.

An example of the structure of the signal transmission system 1 is described hereinafter in detail with reference to FIG. 1. The transmitting circuit 2 operates based on a first power supply that belongs to a first power supply system. The first power supply includes a high potential voltage (for example, a power supply voltage VDD1) and a low potential voltage (for example, a ground voltage GND1). On the other hand, the receiving circuit 3 operates based on a second power supply that belongs to a second power supply system. The second power supply includes a high potential voltage (for example, a power supply voltage VDD2) and a low potential voltage (for example, a ground voltage GND2).

The transmitting circuit 2 includes a transmitting buffer 21. The transmitting buffer 21 converts the transmission data VIN into a pulse signal and outputs it as the transmission signal V1.

The transformer 10 includes the primary coil 11 and the secondary coil 12 as described above. Note that a center tap is placed on the secondary coil 12. The center tap is placed at a position other than both ends of the secondary coil 12, and it is preferably placed at an equal distance from the both ends so that inductance components are substantially the same.

In the primary coil 11, one end is connected to an output terminal of the transmitting buffer 21, and the other end is connected to a ground voltage terminal (which is referred to hereinafter as GND1) through which the ground voltage GND1 is supplied. On the other hand, in the secondary coil 12, one end is connected to one input terminal of the pulse width amplifier circuit 31 of the receiving circuit 3, and the other end is connected to the other input terminal of the pulse width amplifier circuit 31.

Further, a specified voltage is supplied from an external terminal to the center tap of the secondary coil 12. Note that it is preferred that the impedance between the ground voltage terminal GND2 of the receiving circuit 3 and the center tap of the secondary coil 12 is sufficiently lower than the impedance generated by the parasitic coupling capacitor Cc between the primary coil 11 and the secondary coil 12. Thus, it is preferred that a fixed voltage with a low impedance, such as the ground voltage GND2 or the power supply voltage VDD2, for example, is supplied from an external terminal to the center tap of the secondary coil 12. In this embodiment, the ground voltage GND2 is supplied from a ground voltage terminal (which is referred to hereinafter as GND2) to the center tap of the secondary coil 12. The external terminal and the center tap of the secondary coil 12 are connected through a metal (including a via).

The transmission signal V1 that is output from the transmitting buffer 21 is converted into a magnetic signal by the primary coil 11, and the magnetic signal is converted into a received signal V2P or V2N by the secondary coil 12. Specifically, a pulse signal corresponding to the received signal V2P appears at one end of the secondary coil 12, and a pulse signal corresponding to the received signal V2N appears at the other end of the secondary coil 12.

The receiving circuit 3 includes a pulse width amplifier circuit 31, a differential amplifier (comparator circuit) 32, and a receiving buffer 33.

The pulse width amplifier circuit 31 operates using the power supply voltage VDD2 and the ground voltage GND2 as the power supply. The pulse width amplifier circuit 31 holds the received signals V2P and V2N received through the secondary coil 12 of the transformer 10 for a specified period of time and outputs them as a hold signal (first hold signals) V3P and a hold signal (second hold signals) V3N, respectively. In other words, the pulse width amplifier circuit 31 holds the received signals V2P and V2N appearing at both ends of the secondary coil 12 for a specified period of time and thereby increases the pulse width of the pulse signals superimposed on the received signals V2P and V2N and outputs them as the hold signal V3P and the hold signal V3N, respectively.

The differential amplifier 32 operates using the power supply voltage VDD2 and the ground voltage GND2 as the power supply. Further, the differential amplifier 32 reduces the in-phase signal component of the AC components contained in the two input signals. In the differential amplifier 32, the hold signal V3P is input to the non-inverting input terminal, and the hold signal V3N is input to the inverting input terminal. Then, the differential amplifier 32 compares the voltage of the hold signal V3P and the voltage of the hold signal V3PN and outputs transmission signals V4P and V4N as comparison results. To be more specific, the differential amplifier 32 sets the value of the transmission signal V4P to High level when a voltage difference (the value of V3P-V3N) between the hold signals V3P and V3N is positive, and sets the value of the transmission signal V4N to Low level when it is negative. At this time, the in-phase common mode voltages contained in the hold signals V3P and V3N are canceled out. Note that the transmission signals V4P and V4N output from the differential amplifier 32 have pulse signals that are inverted from each other with respect to the amplitude center potential.

The receiving buffer 33 operates using the power supply voltage VDD2 and the ground voltage GND2 as the power supply. The receiving buffer 33 is a hysteresis comparator, for example, and reproduces transmission data VIN based on the transmission signals V4P and V4N and outputs it as output data VOUT. To be more specific, the receiving buffer 33 sets the value of the output data VOUT to High level when a voltage difference (the value of V4P-V4N) between the transmission signals V4P and V4N is positive, and sets the value of the output data VOUT to Low level when it is negative.

Note that, in the case where the receiving buffer 33 is a hysteresis comparator, an upper threshold voltage Vth1 and a lower threshold voltage Vth2 are set for the receiving buffer 33. When a voltage difference between the transmission signals V4P and V4N exceeds the upper threshold voltage Vth1, the output is changed from Low level to High level, and when it falls below the lower threshold voltage Vth2, the output is changed from High level to Low level.

In this manner, the pulse width amplifier circuit 31 detects the pulse signals superimposed on the received signals V2P and V2N, holds them for a specified period of time and then outputs them as the hold signals V3P and V3N. Thus, the pulse width amplifier circuit 31 increases the pulse width of the pulse signals superimposed on the received signals V2P and V2N and outputs them as the hold signals V3P and V3N. Therefore, the differential amplifier 32 in the subsequent stage can operate with high accuracy even when it is not composed of a micro CMOS. In other words, because the receiving circuit 3 can increase the pulse width of the pulse signals superimposed on the received signals V2P and V2N, it is possible to let the differential amplifier 32 operate accurately without increasing the circuit size of the transformer 10 for the purpose of increasing the pulse width.

Further, the transformer 10 is composed of the primary coil 11 and the secondary coil 12 that has the center tap to which a specified voltage is supplied from an external terminal. The receiving circuit 3 can thereby cancel out the common mode voltages respectively superimposed on the received signals V2P and V2N appearing at both ends of the secondary coil 12 by using the differential amplifier in the subsequent stage. Consequently, the receiving circuit 3 can prevent signal transmission error by suppressing the effect of the common mode voltages without an increase in circuit size.

(Structural Example of Pulse Width Amplifier Circuit 31)

Figure 3:
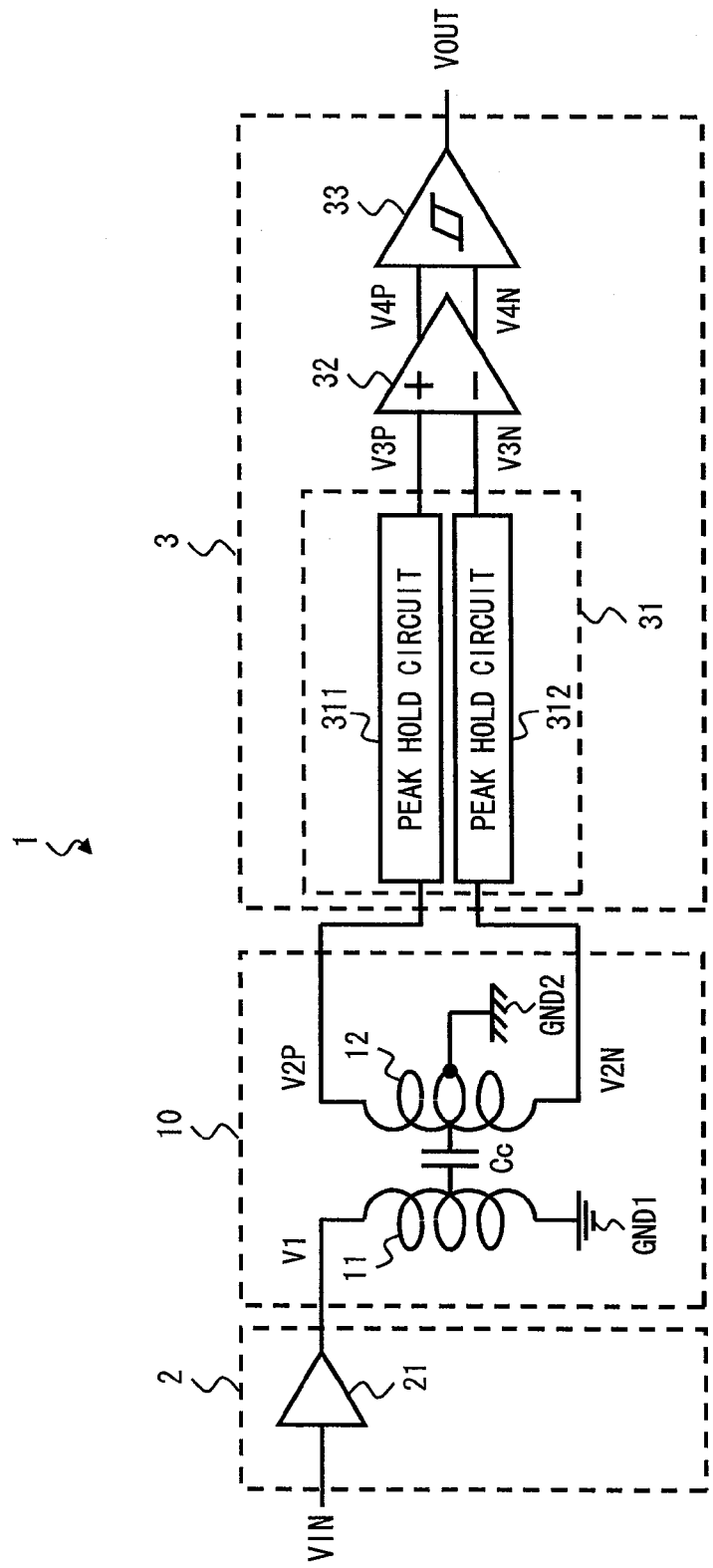
FIG. 3 is a block diagram showing the signal transmission system according to the first embodiment of the invention.

The structural example and operation of the pulse width amplifier circuit 31 are described hereinbelow. FIG. 3 is a diagram showing a structural example of the pulse width amplifier circuit 31. As shown in FIG. 3, the pulse width amplifier circuit 31 includes a peak hold circuit (first peak hold circuit) 311 and a peak hold circuit (second peak hold circuit) 312.

In the peak hold circuit 311, an input terminal is connected to one end of the secondary coil 12, and an output terminal is connected to the non-inverting input terminal of the differential amplifier 32. In the peak hold circuit 312, an input terminal is connected to the other end of the secondary coil 12, and an output terminal is connected to the inverting input terminal of the differential amplifier 32.

The peak hold circuits 311 and 312 detect pulse signals with a positive amplitude in the pulse signals superimposed on the received signals V2P and V2N, hold them for a specified period of time and then output them as the hold signals V3P and V3N, respectively. In other words, the peak hold circuits 311 and 312 detect a pulse signal with a positive amplitude in the pulse signals superimposed on the received signals V2P and V2N, increases the pulse width of the pulse signals and output them as the hold signals V3P and V3N, respectively.

Figure 4:
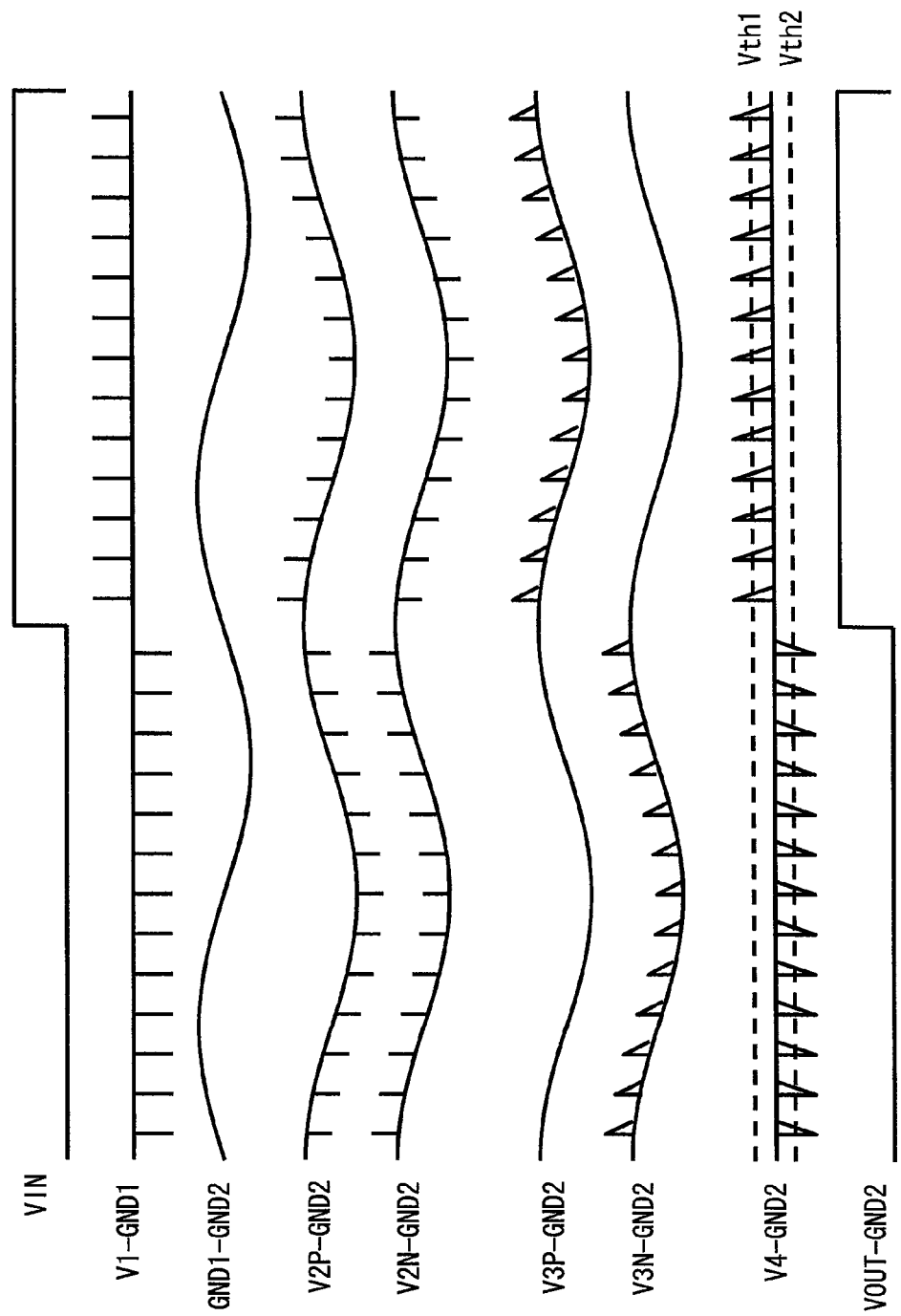
FIG. 4 is a timing chart showing the operation of the signal transmission system according to the first embodiment of the invention.

FIG. 4 is a timing chart showing the operation of the signal transmission system 1. As indicated by V1-GND1 in FIG. 4, on the transmission signal V1 that is output from the transmitting buffer 21, a pulse signal with a positive amplitude is superimposed during the period where the transmission data VIN is High level, and a pulse signal with a negative amplitude is superimposed during the period where the transmission data VIN is Low level.

At this time, when there is a relative voltage difference (common mode voltage) as indicated by GND1-GND2 in FIG. 4 between the ground voltage GND1 and the ground voltage GND2, a voltage difference between the received signal V2P appearing at one end of the secondary coil 12 and the ground voltage GND2 is a waveform as indicated by V2P-GND2 in FIG. 4. On the other hand, a voltage difference between the received signal V2N appearing at the other end of the secondary coil 12 and the ground voltage GND2 is a waveform as indicated by V2N-GND2 in FIG. 4.

As is obvious from those two waveforms, when a pulse signal with a positive amplitude is transmitted as the transmission signal V1, a pulse signal with a positive amplitude appears at one end of the secondary coil 12, and a pulse signal with a negative amplitude appears at the other end of the secondary coil 12. On the other hand, when a pulse signal with a negative amplitude is transmitted as the transmission signal V1, a pulse signal with a negative amplitude appears at one end of the secondary coil 12, and a pulse signal with a positive amplitude appears at the other end of the secondary coil 12. Accordingly, pulse signals having different directions of amplitude appear at both ends of the secondary coil 12. In other words, pulse signals that are inverted from each other with respect to the amplitude center potential appear at both ends of the secondary coil 12. In-phase common mode voltages are superimposed on the received signals V2P and V2N that appear at both ends of the secondary coil 12.

The peak hold circuit 311 holds the received signal V2P for a specified period of time and thereby increases the pulse width of the pulse signal superimposed on the received signal V2P and outputs it as the hold signal V3P. The peak hold circuit 312 holds the received signal V2N for a specified period of time and thereby increases the pulse width of the pulse signal superimposed on the received signal V2N and outputs it as the hold signal V3N. At this time, a voltage difference between the hold signal V3P and the ground voltage GND2 is a waveform as indicated by V3P-GND2 in FIG. 4, and a voltage difference between the hold signal V3N and the ground voltage GND2 is a waveform as indicated by V3N-GND2 in FIG. 4.

After that, the differential amplifier 32 cancels out the common mode voltages superimposed on the hold signal V3P and the hold signal V3N and outputs the transmission signals V4P and V4N. A voltage difference between the transmission signal V4P and the ground voltage GND2 is a waveform as indicated by V4-GND2 in FIG. 4. Then, the receiving buffer 33 reproduces the transmission data VIN based on the output pulse of the differential amplifier 32 and outputs it as the output data VOUT. A voltage difference between the output data VOUT and the ground voltage GND2 is a waveform as indicated by VOUT-GND2 in FIG. 4.

As described above, the peak hold circuits 311 and 312 detect pulse signals with a positive amplitude in the pulse signals superimposed on the received signals V2P and V2N, hold them for a specified period of time and then output them as the hold signals V3P and V3N, respectively. Thus, the peak hold circuits 311 and 312 detect a pulse signal with a positive amplitude in the pulse signals superimposed on the received signals V2P and V2N, increase the pulse width of the pulse signals and output them as the hold signals V3P and V3N, respectively. Therefore, the differential amplifier 32 in the subsequent stage can operate with high accuracy even when it is not composed of a micro CMOS. In other words, because the receiving circuit 3 can increase the pulse width of the pulse signals superimposed on the received signals V2P and V2N, it is possible to let the differential amplifier 32 operate accurately without increasing the circuit size of the transformer 10 for the purpose of increasing the pulse width.

Further, the transformer 10 is composed of the primary coil 11 and the secondary coil 12 that has the center tap to which a specified voltage is supplied from an external terminal. The receiving circuit 3 can thereby cancel out the common mode voltages respectively superimposed on the received signals V2P and V2N appearing at both ends of the secondary coil 12 by using the differential amplifier in the subsequent stage. Consequently, the receiving circuit 3 can prevent signal transmission error by suppressing the effect of the common mode voltages without an increase in circuit size.

For example, in the case where the pulse width of the pulse signals superimposed on the received signals V2P and V2N is 200 ps, and the differential amplifier 32 is composed of a CMOS with a gate size of 0.5 μm, the differential amplifier 32 cannot directly amplify the received signals V2P and V2N. However, in the receiving circuit 3 according to this embodiment, the peak hold circuits 311 and 312 increase the pulse width superimposed on the received signals V2P and V2N and output them. Therefore, the differential amplifier 32 can amplify the received signals V2P and V2N (hold signals V3P and V3N) with the increased pulse width.

(Structural Example of Peak Hold Circuits 311 and 312)

Figure 5:
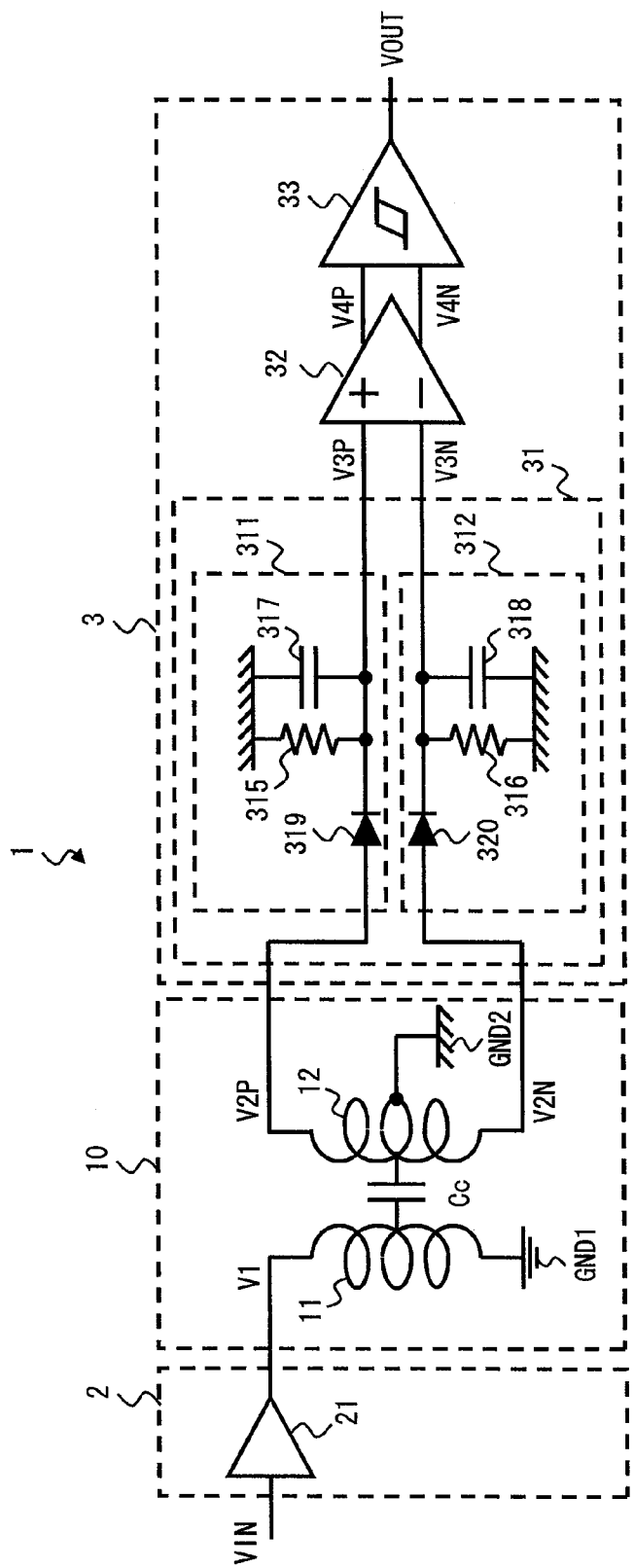
FIG. 5 is a block diagram showing the signal transmission system according to the first embodiment of the invention.

The structural example and operation of the peak hold circuits 311 and 312 are described hereinbelow. FIG. 5 is a diagram showing a specific structural example of the peak hold circuits 311 and 312.

As shown in FIG. 5, the peak hold circuit 311 includes a threshold element (first threshold element) 319, a resistor element (first resistor element) 315, and a capacitor element (first capacitor element) 317. The peak hold circuit 312 includes a threshold element (second threshold element) 320, a resistor element (second resistor element) 316, and a capacitor element (second capacitor element) 318.

Figure 6:
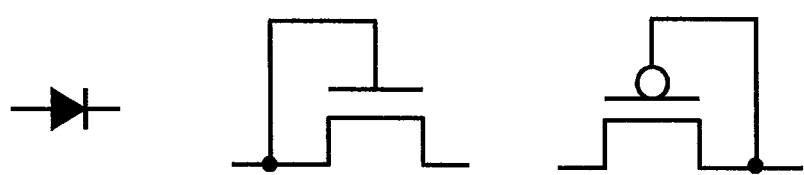
FIG. 6 is a diagram showing a structure example of a threshold element.

A specific example of the threshold element is described with reference to FIG. 6. As shown in FIG. 6, for the threshold element, a diode using p-n junction or Schottky junction may be used, or a structure in which the gate of an n-channel MOS transistor or a p-channel MOS transistor is short-circuited to its source or drain may be used. In this case, one of the drain and the source of the transistor is connected to the input terminal of the threshold element, and the other one of the drain and the source of the transistor is connected to the output terminal of the threshold element.

In the case of using a p-n junction diode in a typical CMOS process, a threshold value that is stable at about 0.7V can be obtained regardless of a power supply voltage or the like. In the case of using a transistor, the threshold value is about 0.2V to 1V, depending on the generation or the feature size of the CMOS process. However, the variation of the threshold value is as small as about ±0.1 in many cases even in consideration of varying conditions such as a process, a power supply voltage and a temperature. The variation of those threshold values is generally smaller than the variation of the threshold value of a hysteresis circuit. Therefore, by using those, it is possible to form the receiving circuit 3 with a stable threshold value. In FIG. 5, the case where each of the threshold elements 319 and 320 is a p-n junction diode is described as an example.

In the peak hold circuit 311, the anode of the diode 319 is connected to one end of the secondary coil 12, and the cathode of the diode 319 is connected to the non-inverting input terminal of the differential amplifier 32. In the resistor element 315, one end is connected to the non-inverting input terminal of the differential amplifier 32, and the other end is connected to the ground voltage terminal GND2. In the capacitor element 317, one end is connected to the non-inverting input terminal of the differential amplifier 32, and the other end is connected to the ground voltage terminal GND2.

In the peak hold circuit 312, the anode of the diode 320 is connected to the other end of the secondary coil 12, and the cathode of the diode 320 is connected to the inverting input terminal of the differential amplifier 32. In the resistor element 316, one end is connected to the inverting input terminal of the differential amplifier 32, and the other end is connected to the ground voltage terminal GND2. In the capacitor element 318, one end is connected to the inverting input terminal of the differential amplifier 32, and the other end is connected to the ground voltage terminal GND2.

When the voltage of the received signal V2P exceeds the threshold value of the diode 319, current flows into the diode 319. The capacitor element 317 is thereby charged. Thus, a pulse signal with a positive amplitude in the pulse signal superimposed on the received signal V2P is stored in the capacitor element 317. As a result, the pulse width of the pulse signal with a positive amplitude increases, and it is input as the hold signal V3P to the non-inverting input terminal of the differential amplifier 32. After that, when the capacitor element 317 is not charged for a certain period of time or longer, the voltage of the hold signal V3P converges to the ground voltage (reference voltage) GND2 through the resistor element 315. Note that the pulse width is determined by the RC time constant, which is the product of the resistance of the resistor element 315 and the capacitance of the capacitor element 317.

Likewise, when the voltage of the received signal V2N exceeds the threshold value of the diode 320, current flows into the diode 320. The capacitor element 318 is thereby charged. Thus, a pulse signal with a positive amplitude in the pulse signal superimposed on the received signal V2N is stored in the capacitor element 318. As a result, the pulse width of the pulse signal with a positive amplitude increases, and it is input as the hold signal V3N to the inverting input terminal of the differential amplifier 32. After that, when the capacitor element 318 is not charged for a certain period of time or longer, the voltage of the hold signal V3N converges to the ground voltage (reference voltage) GND2 through the resistor element 316. Note that the pulse width is determined by the RC time constant, which is the product of the resistance of the resistor element 316 and the capacitance of the capacitor element 318.

The operations of the differential amplifier 32 and the receiving buffer 33 after that are the same as the above-described operations and thus not redundantly described.

As described above, the peak hold circuits 311 and 312 detect pulse signals with a positive amplitude in the pulse signals superimposed on the received signals V2P and V2N, hold them for a specified period of time and then output them as the hold signals V3P and V3N, respectively. Thus, the peak hold circuits 311 and 312 detect a pulse signal with a positive amplitude in the pulse signals superimposed on the received signals V2P and V2N, increase the pulse width of the pulse signals and output them as the hold signals V3P and V3N, respectively. Therefore, the differential amplifier 32 in the subsequent stage can operate with high accuracy even when it is not composed of a micro CMOS. In other words, because the receiving circuit 3 can increase the pulse width of the pulse signals superimposed on the received signals V2P and V2N, it is possible to let the differential amplifier 32 operate accurately without increasing the circuit size of the transformer 10 for the purpose of increasing the pulse width.

Further, the transformer 10 is composed of the primary coil 11 and the secondary coil 12 that has the center tap to which a specified voltage is supplied from an external terminal. The receiving circuit 3 can thereby cancel out the common mode voltages respectively superimposed on the received signals V2P and V2N appearing at both ends of the secondary coil 12 by using the differential amplifier in the subsequent stage. Consequently, the receiving circuit 3 can prevent signal transmission error by suppressing the effect of the common mode voltages without an increase in circuit size.

Second Embodiment

Figure 7:
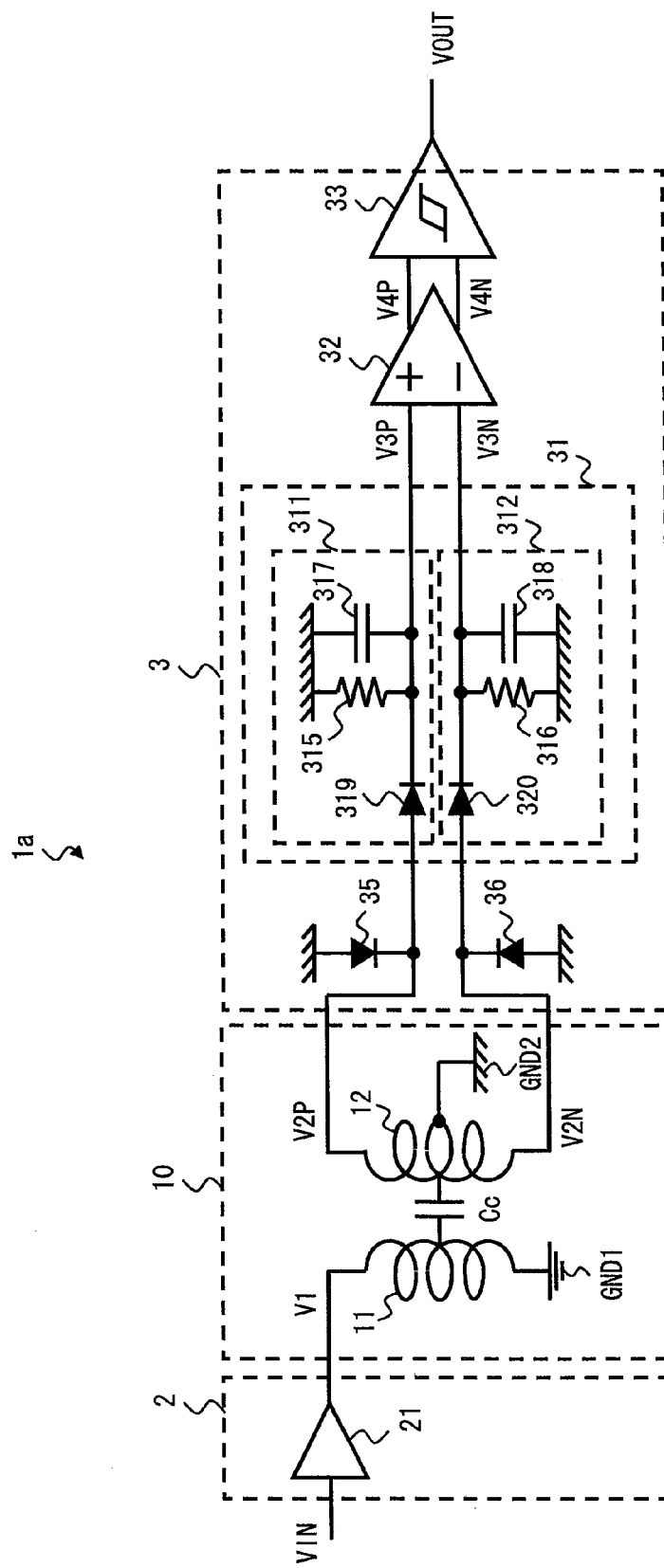
FIG. 7 is a block diagram showing a signal transmission system according to a second embodiment of the invention.

FIG. 7 is a diagram showing a signal transmission system 1a according to a second embodiment of the invention. The signal transmission system 1a according to this embodiment is different from the signal transmission system 1 according to the first embodiment shown in FIG. 5 in that it further includes protection diodes 35 and 36. The other circuit structure of the signal transmission system 1a according to this embodiment is the same as that of the signal transmission system 1 according to the first embodiment shown in FIG. 5 and thus not redundantly described.

The anode of the protection diode 35 is connected to the ground voltage terminal GND2, and the cathode of the protection diode 35 is connected to one end of the secondary coil 12. The anode of the protection diode 36 is connected to the ground voltage terminal GND2, and the cathode of the protection diode 36 is connected to the other end of the secondary coil 12.

When the voltage of the received signal V2P falls below the ground voltage GND2, current flows into the protection diode 35, and the voltage of the received signal V2P converges approximately to the ground voltage GND2.

Likewise, when the voltage of the received signal V2N falls below the ground voltage GND2, current flows into the protection diode 36, and the voltage of the received signal V2N converges approximately to the ground voltage GND2.

The peak hold circuit 311 that is connected to one end of the secondary coil 12 detects only a pulse signal with a positive amplitude in the pulse signal superimposed on the received signal V2P and does not detect a pulse signal with a negative amplitude. Likewise, the peak hold circuit 312 that is connected to the other end of the secondary coil 12 detects only a pulse signal with a positive amplitude in the pulse signal superimposed on the received signal V2N and does not detect a pulse signal with a negative amplitude. The receiving circuit 3 according to this embodiment lets an electromotive force corresponding to those pulse signals with a negative amplitude escape into the ground voltage terminal GND2 through the protection diodes 35 and 36, thereby preventing breakdown of the element.

Third Embodiment

Figure 8:
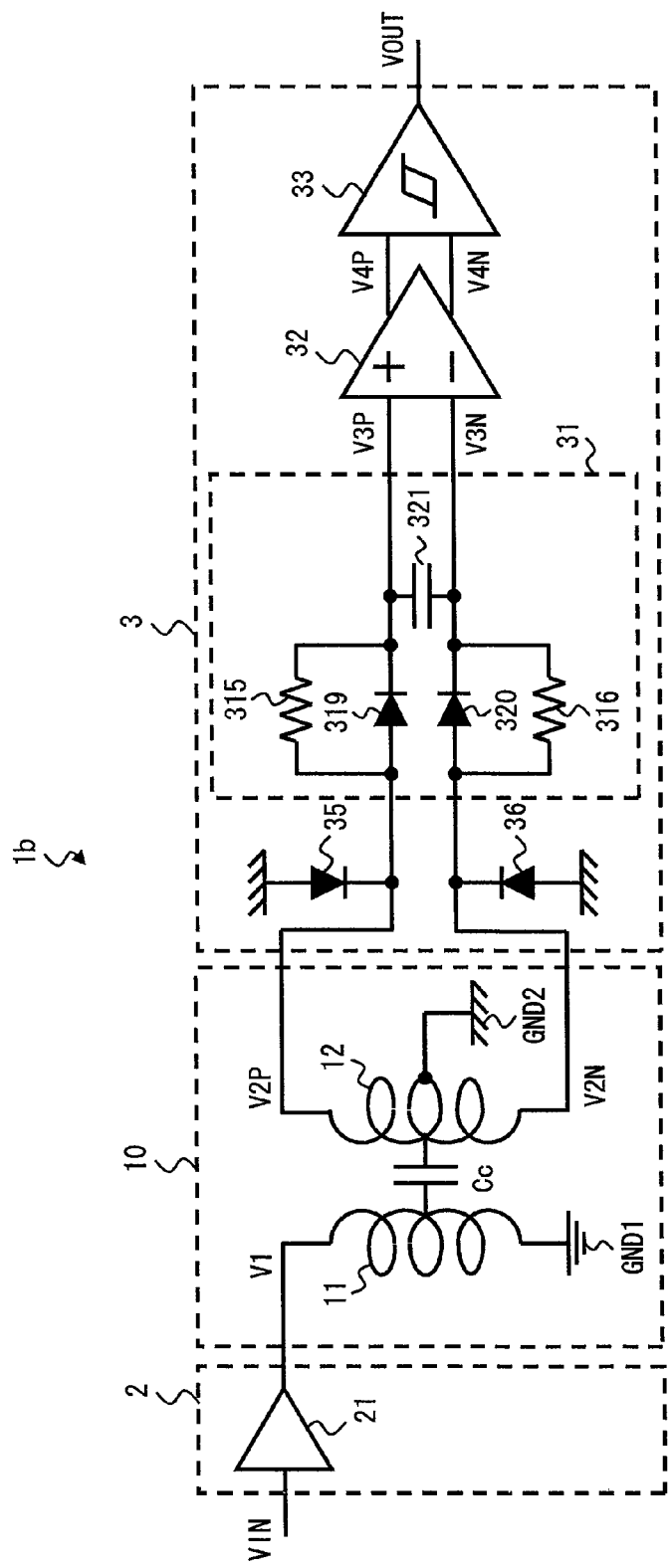
FIG. 8 is a block diagram showing a signal transmission system according to a third embodiment of the invention.

FIG. 8 is a diagram showing a signal transmission system 1b according to a third embodiment of the invention. The signal transmission system 1b according to this embodiment is different from the signal transmission system 1a according to the second embodiment in the structure of the pulse width amplifier circuit 31. The other circuit structure of the signal transmission system 1b according to this embodiment is the same as that of the signal transmission system 1a according to the second embodiment and thus not redundantly described.

The pulse width amplifier circuit 31 shown in FIG. 8 includes diodes 319 and 320, resistor elements 315 and 316, and a capacitor element (third capacitor element) 321. The anode of the diode 319 is connected to one end of the secondary coil 12, and the cathode of the diode 319 is connected to the non-inverting input terminal of the differential amplifier 32. In the resistor element 315, one end is connected to the non-inverting input terminal of the differential amplifier 32, and the other end is connected to one end of the secondary coil 12. The anode of the diode 320 is connected to the other end of the secondary coil 12, and the cathode of the diode 320 is connected to the inverting input terminal of the differential amplifier 32. In the resistor element 316, one end is connected to the inverting input terminal of the differential amplifier 32, and the other end is connected to the other end of the secondary coil 12. In the capacitor element 321, one end is connected to the non-inverting input terminal of the differential amplifier 32, and the other end is connected to the inverting input terminal of the differential amplifier 32. Note that the diode 319, the resistor element 315 and the capacitor element 321 form the peak hold circuit 311. The diode 320, the resistor element 316 and the capacitor element 321 form the peak hold circuit 312.

In the pulse width amplifier circuit 31 shown in FIG. 8, the peak hold circuit 311 and the peak hold circuit 312 have the capacitor element 321 in common. Therefore, in the receiving circuit 3 according to this embodiment, the area occupied by the capacitor element in the pulse width amplifier circuit 31 can be reduced to about half that of the receiving circuit 3 according to the first embodiment.

Further, in the pulse width amplifier circuit 31 shown in FIG. 8, the other ends of the resistor elements 315 and 316 are respectively connected to one and the other end of the secondary coil 12. The RC time constant that is determined by the product of the resistance of the resistor element 315 and the capacitance of the capacitor element 321 and the RC time constant that is determined by the product of the resistance of the resistor element 316 and the capacitance of the capacitor element 321 are adjusted to be smaller than the cycle of the in-phase common mode voltages superimposed on the received signals V2P and V2N, respectively. Accordingly, in the pulse width amplifier circuit 31 shown in FIG. 8, the common mode voltages are propagated more actively as in-phase components to the differential amplifier 32 in the subsequent stage. On the other hand, the pulse signals superimposed on the received signals V2P and V2N are propagated as differential components to the differential amplifier 32 in the subsequent stage mainly through the diodes 319 and 320.

Note that, in the structure where the other ends of the resistor elements 315 and 316 are connected directly to the ground voltage terminal GND2 without through the secondary coil 12, the in-phase common mode voltages superimposed on the received signals V2P and V2N are not propagated to the differential amplifier 32 in the subsequent stage when they are equal to or lower than the threshold values of the diodes 319 and 320, respectively.

As described above, in the receiving circuit 3 according to this embodiment, the in-phase common mode voltages that are superimposed on the received signals V2P and V2N are actively propagated to the differential amplifier 32 in the subsequent stage, thereby reducing the variations of the effective threshold values (a voltage difference of V2P-V3P, a voltage difference of V2N-V3N) of the diodes 319 and 320. Thus, in the receiving circuit 3 according to this embodiment, the common mode voltages with relatively low frequencies are actively propagated to the differential amplifier 32 in the subsequent stage to thereby reduce the variations of a voltage difference between the anode and the cathode of the diode 319 and a voltage difference between the anode and the cathode of the diode 320, so that the diodes 319 and 320 can operate with high accuracy. Note that the in-phase common mode voltages are canceled out (eliminated) by the differential amplifier 32.

Although the case where the structure in which the peak hold circuit 311 and the peak hold circuit 312 have the capacitor element 321 in common, the structure in which the resistor elements 315 and 316 are connected between the anode and the cathode of the corresponding diode, and the structure in which the protection diodes 35 and 36 are placed are applied is described as one example in this embodiment, it is not limited thereto, and each structure may be applied independently.

(Modified Example of Signal Transmission System 1b)

Figure 9:
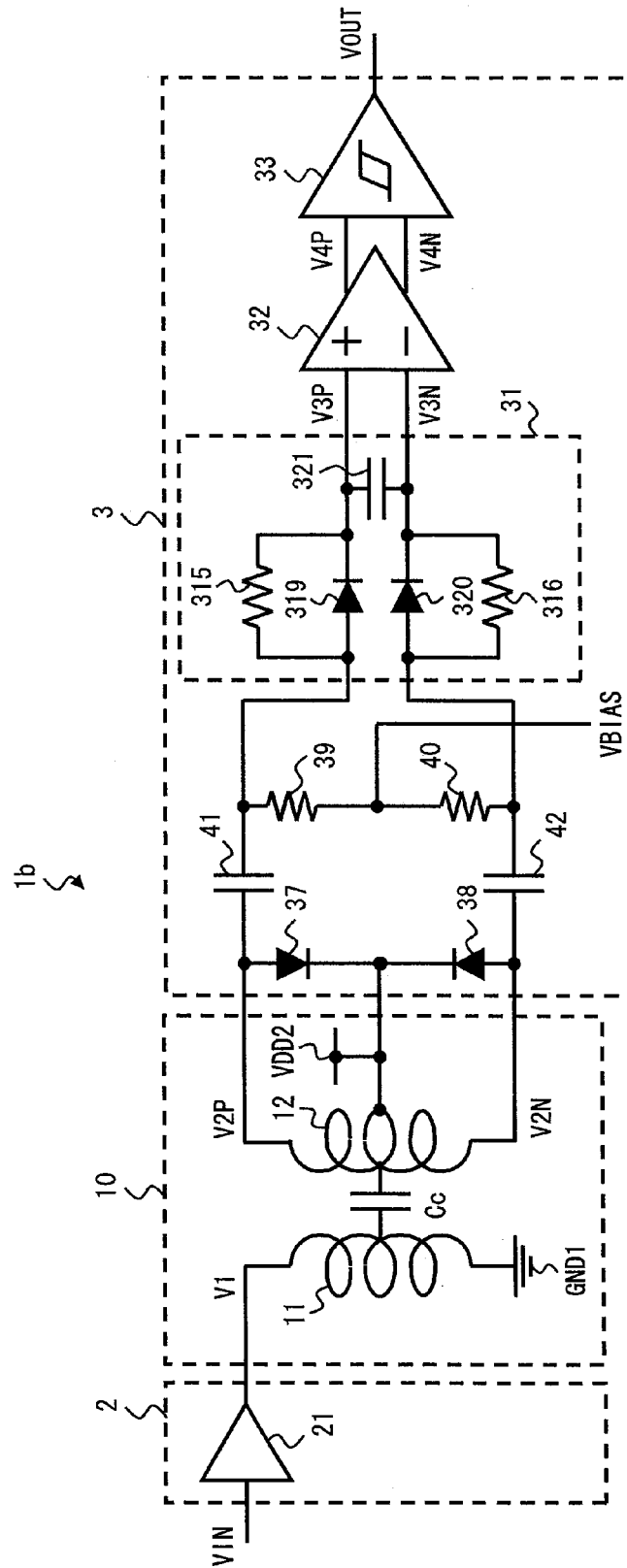
FIG. 9 is a block diagram showing a modified example of the signal transmission system according to the third embodiment of the invention.

FIG. 9 is a diagram showing a modified example of the signal transmission system 1b shown in FIG. 8. The modified example of the signal transmission system 1b shown in FIG. 9 includes protection diodes 37 and 38 in place of the protection diodes 35 and 36 and further includes capacitor elements 41 and 42 and resistor elements 39 and 40.

To the center tap of the secondary coil 12, the power supply voltage VDD2, which is a specified voltage, is supplied, instead of the ground voltage GND2, from a power supply voltage terminal VDD2, which is an external terminal. Further, the cathode of the protection diode 37 is connected to the power supply voltage terminal VDD2, and the anode of the protection diode 37 is connected to one end of the secondary coil 12. The cathode of the protection diode 38 is connected to the power supply voltage terminal VDD2, and the anode of the protection diode 38 is connected to the other end of the secondary coil 12. The capacitor element 41 is placed between one end of the secondary coil 12 and the anode of the diode 319. The capacitor element 42 is placed between the other end of the secondary coil 12 and the anode of the diode 320. The resistor elements 39 and 40 are connected in series between the anode of the diode 319 and the anode of the diode 320, and a bias voltage VBIAS is supplied to a node between the resistor element 39 and the resistor element 40.

In this circuit structure, the anode of the diode 319 and the anode of the diode 320 are biased by the bias voltage VBIAS. At the same time, the both input terminals of the differential amplifier 32 are biased by the bias voltage VBIAS through the resistor elements 315 and 316. The voltage level at the both input terminals of the differential amplifier 32 can be thereby adjusted, for example.

Fourth Embodiment

Figure 10:
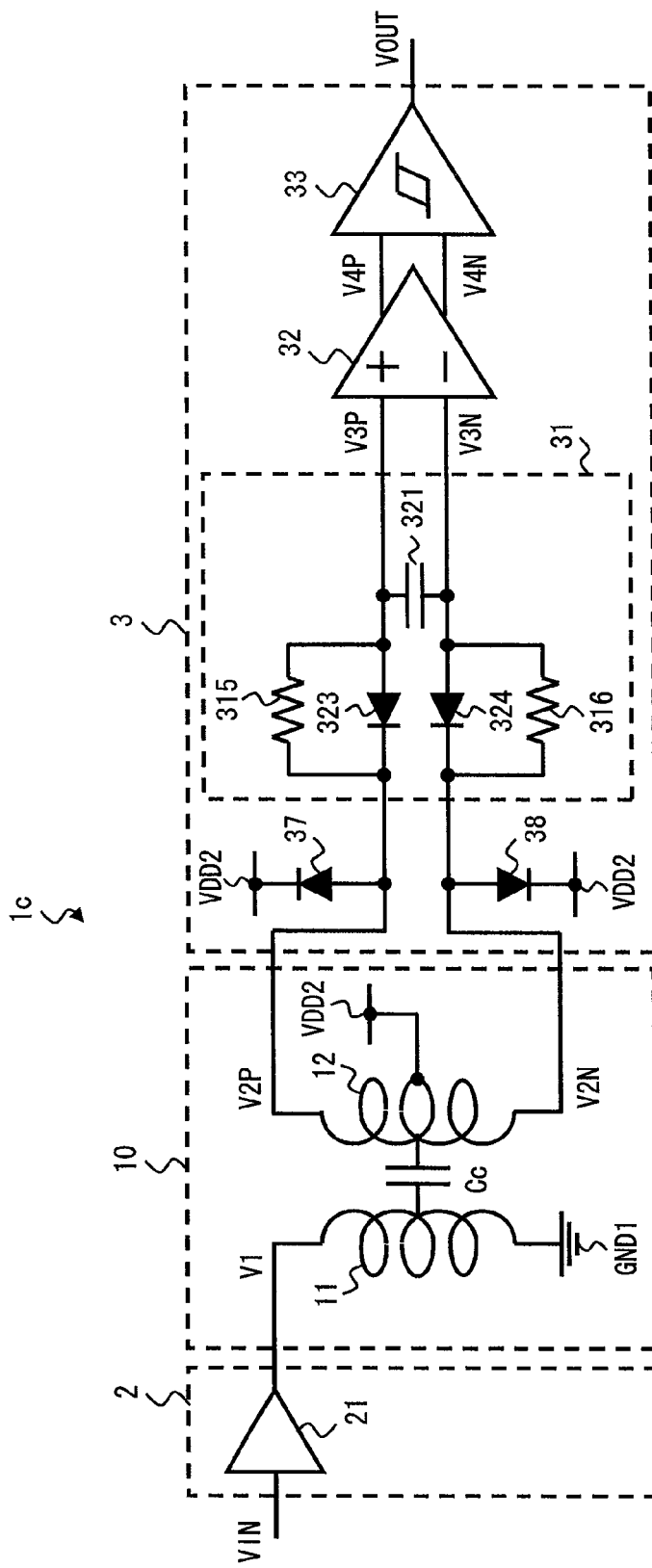
FIG. 10 is a block diagram showing a signal transmission system according to a fourth embodiment of the invention.

FIG. 10 is a diagram showing a signal transmission system 1c according to a fourth embodiment of the invention. The signal transmission system 1c according to this embodiment is different from the signal transmission system 1b according to the third embodiment shown in FIG. 8 in the structure of the pulse width amplifier circuit 31 and the protection diodes. The other circuit structure of the signal transmission system 1c according to this embodiment is the same as that of the signal transmission system 1b according to the third embodiment shown in FIG. 8 and thus not redundantly described.

The pulse width amplifier circuit 31 shown in FIG. 10 includes a diode (first threshold element) 323, a diode (second threshold element) 324, resistor elements 315 and 316, and a capacitor element 321. The receiving circuit 3 includes protection diodes 37 and 38 in place of the protection diodes 35 and 36 shown in FIG. 8.

The cathode of the diode 323 is connected to one end of the secondary coil 12, and the anode of the diode 323 is connected to the non-inverting input terminal of the differential amplifier 32. The cathode of the diode 324 is connected to the other end of the secondary coil 12, and the anode of the diode 324 is connected to the inverting input terminal of the differential amplifier 32. The connections of the resistor elements 315 and 316 and the capacitor element 321 are the same as those in the third embodiment and not redundantly described. Note that the diode 323, the resistor element 315 and the capacitor element 321 form a bottom hold circuit (first bottom hold circuit) 325. The diode 324, the resistor element 316 and the capacitor element 321 form a bottom hold circuit (second bottom hold circuit) 326. Further, to the center tap of the secondary coil 12, the power supply voltage VDD2, which is a specified voltage, is supplied, instead of the ground voltage GND2, from the power supply voltage terminal VDD2, which is an external terminal.

The bottom hold circuits 325 and 326 detect pulse signals with a negative amplitude in the pulse signals superimposed on the received signals V2P and V2N, hold them for a specified period of time and then output them as the hold signals V3P and V3N, respectively. In other words, the bottom hold circuits 325 and 326 detect a pulse signal with a negative amplitude in the pulse signals superimposed on the received signals V2P and V2N, increases the pulse width of the pulse signals and output them as the hold signals V3P and V3N, respectively. This is specifically described hereinbelow.

When the voltage of the received signal V2P exceeds the threshold value of the diode 323, current flows into the diode 323. The capacitor element 321 is thereby discharged. Thus, a pulse signal with a negative amplitude in the pulse signal superimposed on the received signal V2P is stored in the capacitor element 321. As a result, the pulse width of the pulse signal with a negative amplitude increases, and it is input as the hold signal V3P to the non-inverting input terminal of the differential amplifier 32. After that, when the capacitor element 321 is not discharged for a certain period of time or longer, the voltage of the hold signal V3P converges to the power supply voltage (reference voltage) VDD2 through the resistor element 315. Note that the pulse width is determined by the RC time constant, which is the product of the resistance of the resistor element 315 and the capacitance of the capacitor element 321.

When the voltage of the received signal V2N exceeds the threshold value of the diode 324, current flows into the diode 324. The capacitor element 321 is thereby discharged. Thus, a pulse signal with a negative amplitude in the pulse signal superimposed on the received signal V2N is stored in the capacitor element 321. As a result, the pulse width of the pulse signal with a negative amplitude increases, and it is input as the hold signal V3N to the inverting input terminal of the differential amplifier 32. After that, when the capacitor element 321 is not discharged for a certain period of time or longer, the voltage of the hold signal V3N converges to the power supply voltage (reference voltage) VDD2 through the resistor element 316. Note that the pulse width is determined by the RC time constant, which is the product of the resistance of the resistor element 316 and the capacitance of the capacitor element 321.

The operations of the differential amplifier 32 and the receiving buffer 33 after that are the same as the above-described operations and thus not redundantly described.

Further, the cathode of the protection diode 37 is connected to the power supply voltage terminal VDD2, and the anode of the protection diode 37 is connected to one end of the secondary coil 12. The cathode of the protection diode 38 is connected to the power supply voltage terminal VDD2, and the anode of the protection diode 38 is connected to the other end of the secondary coil 12.

When the voltage of the received signal V2P exceeds the power supply voltage terminal VDD2, current flows into the protection diode 37, and the voltage of the received signal V2P converges approximately to the power supply voltage terminal VDD2. Likewise, when the voltage of the received signal V2N exceeds the power supply voltage terminal VDD2, current flows into the protection diode 38, and the voltage of the received signal V2N converges approximately to the power supply voltage terminal VDD2.

The bottom hold circuit 325 that is connected to one end of the secondary coil 12 detects only a pulse signal with a negative amplitude in the pulse signal superimposed on the received signal V2P and does not detect a pulse signal with a positive amplitude. Likewise, the bottom hold circuit 326 that is connected to the other end of the secondary coil 12 detects only a pulse signal with a negative amplitude in the pulse signal superimposed on the received signal V2N and does not detect a pulse signal with a positive amplitude. The receiving circuit 3 according to this embodiment lets an electromotive force corresponding to those pulse signals with a positive amplitude escape into the power supply voltage terminal VDD2 through the protection diodes 37 and 38, thereby preventing breakdown of the element.

As described above, the receiving circuit 3 according to this embodiment includes the pulse width amplifier circuit 31 composed of the bottom hold circuits 325 and 326, and thereby the same operation as that of the pulse width amplifier circuit 31 composed of the peak hold circuits 311 and 312 can be achieved in principle, thus having the same advantageous effects.

Although the case where the structure in which the bottom hold circuit 325 and the bottom hold circuit 326 have the capacitor element 321 in common, the structure in which the other ends of the resistor elements 315 and 316 are respectively connected to one end and the other end of secondary coil 12, and the structure in which the protection diodes 37 and 38 are placed, in addition to the structure in which the pulse width amplifier circuit 31 is composed of two bottom hold circuits, are applied is described as one example in this embodiment, it is not limited thereto, and each structure may be applied independently, or some of those may be applied in combination. Accordingly, the structure in which the other ends of the resistor elements 315 and 316 are respectively connected directly to the power supply voltage terminal VDD2, or the structure in which each of the two bottom hold circuits has the capacitor element independently of one another may be employed.

Fifth Embodiment

Figure 11:
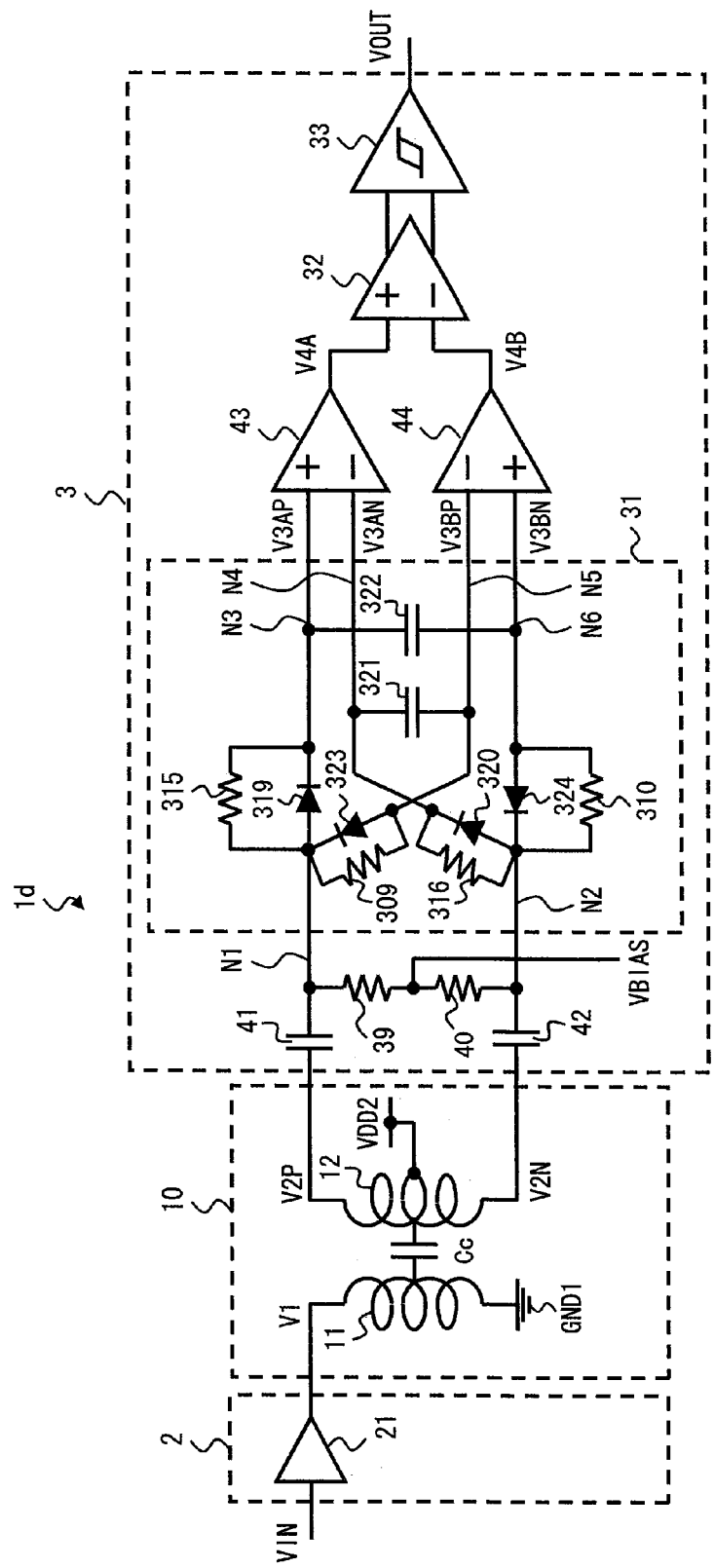
FIG. 11 is a block diagram showing a signal transmission system according to a fifth embodiment of the invention.

FIG. 11 is a diagram showing a signal transmission system 1*d* according to a fifth embodiment of the invention. The pulse width amplifier circuit 31 composed of the two peak hold circuits or the two bottom hold circuits described above detects only a pulse signal with one of positive and negative amplitudes in the pulse signals superimposed on the received signals V2P and V2N and does not detect a pulse signal with the other one of positive and negative amplitudes. In other words, the pulse width amplifier circuit 31 performs half-wave rectification of the received signals V2P and V2N. Accordingly, the receiving circuit 3 including the pulse width amplifier circuit 31 can only use half the electromotive force appearing at the secondary coil 12 for reproduction of the transmission data VIN. On the other hand, the pulse width amplifier circuit 31 according to this embodiment performs full-wave rectification of the received signals V2P and V2N. The receiving circuit 3 according to this embodiment can thereby reproduce the transmission data VIN more effectively based on the received signals V2P and V2N.

The signal transmission system 1*d* shown in FIG. 11 includes a transmitting circuit 2, a receiving circuit 3, and a transformer 10. The circuit structures of the transmitting circuit 2 and the transformer 10 according to this embodiment are the same as those of the transmitting circuit 2 and the transformer 10 according to the first to fourth embodiments and therefore not redundantly described.

The receiving circuit 3 includes a pulse width amplifier circuit 31, differential amplifiers 32, 43 and 44, a receiving buffer 33, capacitor elements 41 and 42, and resistor elements 39 and 40. The pulse width amplifier circuit 31 includes a diode (first threshold element) 319, a diode (second threshold element) 320, a diode (third threshold element) 323, a diode (fourth threshold element) 324, resistor elements 315, 316, 309 and 310, a capacitor element (fourth capacitor element) 321, and a capacitor element (third capacitor element) 322. Note that the differential amplifiers 32, 43 and 44 form a comparator circuit.

The capacitor element 41 is placed between one end of the secondary coil 12 and a node N1. The capacitor element 42 is placed between the other end of the secondary coil 12 and a node N2. The resistor elements 39 and 40 are connected in series between the node N1 and the node N2, and a bias voltage VBIAS is supplied to a node between the resistor element 39 and the resistor element 40. Note that the power supply voltage VDD2, which is a specified voltage, is supplied from a power supply voltage terminal VDD2, which is an external terminal, to the center tap of the secondary coil 12.

In this circuit structure, the node N1 and the node N2 are biased by the bias voltage VBIAS. At the same time, the both input terminals of each of the differential amplifiers 43 and 44, which are described later, are biased by the bias voltage VBIAS through the resistor elements 315, 316, 309 and 310. The voltage level at the both input terminals of the differential amplifier 32 can be thereby adjusted, for example.

The anode of the diode 319 is connected to the node N1, and the cathode of the diode 319 is connected to the node N3. The resistor element 315 is connected between the anode and the cathode of the diode 319. The anode of the diode 320 is connected to the node N2, and the cathode of the diode 320 is connected to the node N4. The resistor element 316 is connected between the anode and the cathode of the diode 320. The anode of the diode 323 is connected to the node N5 and the cathode of the diode 323 is connected to the node N1. The resistor element 309 is connected between the anode and the cathode of the diode 323. The anode of the diode 324 is connected to the node N6, and the cathode of the diode 324 is connected to the node N2. The resistor element 310 is connected between the anode and the cathode of the diode 324. The capacitor element 321 is placed between the node N4 and the node N5. The capacitor element 322 is placed between the node N3 and the node N6.

Note that the diode 319, the resistor element 315 and the capacitor element 322 form a peak hold circuit 311. The diode 320, the resistor element 316 and the capacitor element 321 form a peak hold circuit 312. The diode 323, the resistor element 309 and the capacitor element 321 form a bottom hold circuit 325. The diode 324, the resistor element 310 and the capacitor element 322 form a bottom hold circuit 326. The operations of the peak hold circuits 311 and 312 and the bottom hold circuits 325 and 326 is the same as those in the above-described embodiments and thus not redundantly described.

In the differential amplifier 43, the non-inverting input terminal is connected to the node N3, the inverting input terminal is connected to the node N4, and the output terminal is connected to the non-inverting input terminal of the differential amplifier 32. In the differential amplifier 44, the inverting input terminal is connected to the node N5, the non-inverting input terminal is connected to the node N6, and the output terminal is connected to the inverting input terminal of the differential amplifier 32. A pair of output terminals of the differential amplifier 32 are respectively connected to corresponding input terminals of the receiving buffer 33.

The peak hold circuits 311 and 312 detect a pulse signal with a positive amplitude in the pulse signals superimposed on the received signals V2P and V2N, increase the pulse width of the pulse signal and then output them as the hold signals V3AP and V3AN, respectively. The differential amplifier 43 outputs an amplified signal V4A in accordance with a voltage difference of the hold signals V3AP and V3AN output from the peak hold circuits 311 and 312. At this time, the in-phase common mode voltages superimposed on the hold signals V3AP and V3AN are canceled out. Accordingly, even when the voltages of the received signals V2P and V2N shift in the same direction (positive or negative) due to the effect of the common mode voltages, the voltages of the hold signals V3AP and V3AN vary but the voltage of the amplified signal V4A does not vary.

The bottom hold circuits 325 and 326 detect pulse signals with a negative amplitude in the pulse signals superimposed on the received signals V2P and V2N, increase the pulse width of the pulse signals and then output them as the hold signals V3BP and V3BN, respectively. The differential amplifier 44 outputs an amplified signal V4B in accordance with a voltage difference of the hold signals V3BP and V3BN output from the bottom hold circuits 325 and 326. At this time, the in-phase common mode voltages superimposed on the hold signals V3BP and V3BN are canceled out. Accordingly, even when the voltages of the received signals V2P and V2N shift in the same direction (positive or negative) due to the effect of the common mode voltages, the voltages of the hold signals V3BP and V3BN vary but the voltage of the amplified signal V4B does not vary. Note that the amplified signal V4B that is output from the differential amplifier 44 is a polarity-inverted signal with respect to the amplified signal V4A that is output from the differential amplifier 43.

For example, when a pulse signal with a positive amplitude appears at one end of the secondary coil 12 and a pulse signal with a negative amplitude appears at the other end of the secondary coil 12, the hold signal V3AP on which the pulse signal with a positive amplitude is superimposed is input to the non-inverting input terminal of the differential amplifier 43, and the hold signal V3AN on which the pulse signal is not superimposed is input to the inverting input terminal of the differential amplifier 43. Accordingly, the differential amplifier 43 outputs the amplified signal V4A from which the common mode voltage is removed and on which the pulse signal with a positive amplitude is superimposed. At the same time, the hold signal V3BN on which the pulse signal with a negative amplitude is superimposed is input to the non-inverting input terminal of the differential amplifier 44, and the hold signal V3BP on which the pulse signal is not superimposed is input to the inverting input terminal of the differential amplifier 44. Accordingly, the differential amplifier 44 outputs the amplified signal V4B from which the common mode voltage is removed and on which the pulse signal with a negative amplitude is superimposed. Consequently, after the operations of the differential amplifier 32 and the receiving buffer 33 described above, the output data VOUT becomes High level.

On the other hand, when a pulse signal with a negative amplitude appears at one end of the secondary coil 12 and a pulse signal with a positive amplitude appears at the other end of the secondary coil 12, the hold signal V3AP on which the pulse signal is not superimposed is input to the non-inverting input terminal of the differential amplifier 43, and the hold signal V3AN on which the pulse signal with a positive amplitude is superimposed is input to the inverting input terminal of the differential amplifier 43. Accordingly, the differential amplifier 43 outputs the amplified signal V4A from which the common mode voltage is removed and on which the pulse signal with a negative amplitude is superimposed. At the same time, the hold signal V3BN on which the pulse signal is not superimposed is input to the non-inverting input terminal of the differential amplifier 44, and the hold signal V3BP on which the pulse signal with a negative amplitude is superimposed is input to the inverting input terminal of the differential amplifier 44. Accordingly, the differential amplifier 44 outputs the amplified signal V4B from which the common mode voltage is removed and on which the pulse signal with a positive amplitude is superimposed. Consequently, after the operations of the differential amplifier 32 and the receiving buffer 33 described above, the output data VOUT becomes Low level.

As described above, the pulse width amplifier circuit 31 according to this embodiment performs full-wave rectification of the received signals V2P and V2N. The receiving circuit 3 according to this embodiment can thereby reproduce the transmission data VIN more effectively based on the received signals V2P and V2N and output them as the output data VOUT.

Although the case where the structure in which the peak hold circuit 311 and the bottom hold circuit 326 have the capacitor element 322 in common and the peak hold circuit 312 and the bottom hold circuit 325 have the capacitor element 321 in common, the structure in which resistor elements 315, 316, 309 and 310 are connected between the anode and the cathode of the corresponding diode, and the structure in which the bias voltage VBIAS is supplied, in addition to the structure for full-wave rectification in which the pulse width amplifier circuit 31 is composed of two peak hold circuits and two bottom hold circuits, are applied is described as one example in this embodiment, it is not limited thereto, and each structure may be applied independently, or some of those may be applied in combination. Accordingly, the structure in which the other ends (the terminals connected to the node N1 or the node N2) of the resistor elements 315, 316, 309 and 310 are respectively connected directly to the power supply voltage terminal VDD2, or the structure in which each of the two peak hold circuits and the two bottom hold circuits has the capacitor element independently of one another may be employed. Further, above-described protection diodes may be applied.

(Modified Example of Signal Transmission System 1d)

Figure 12:
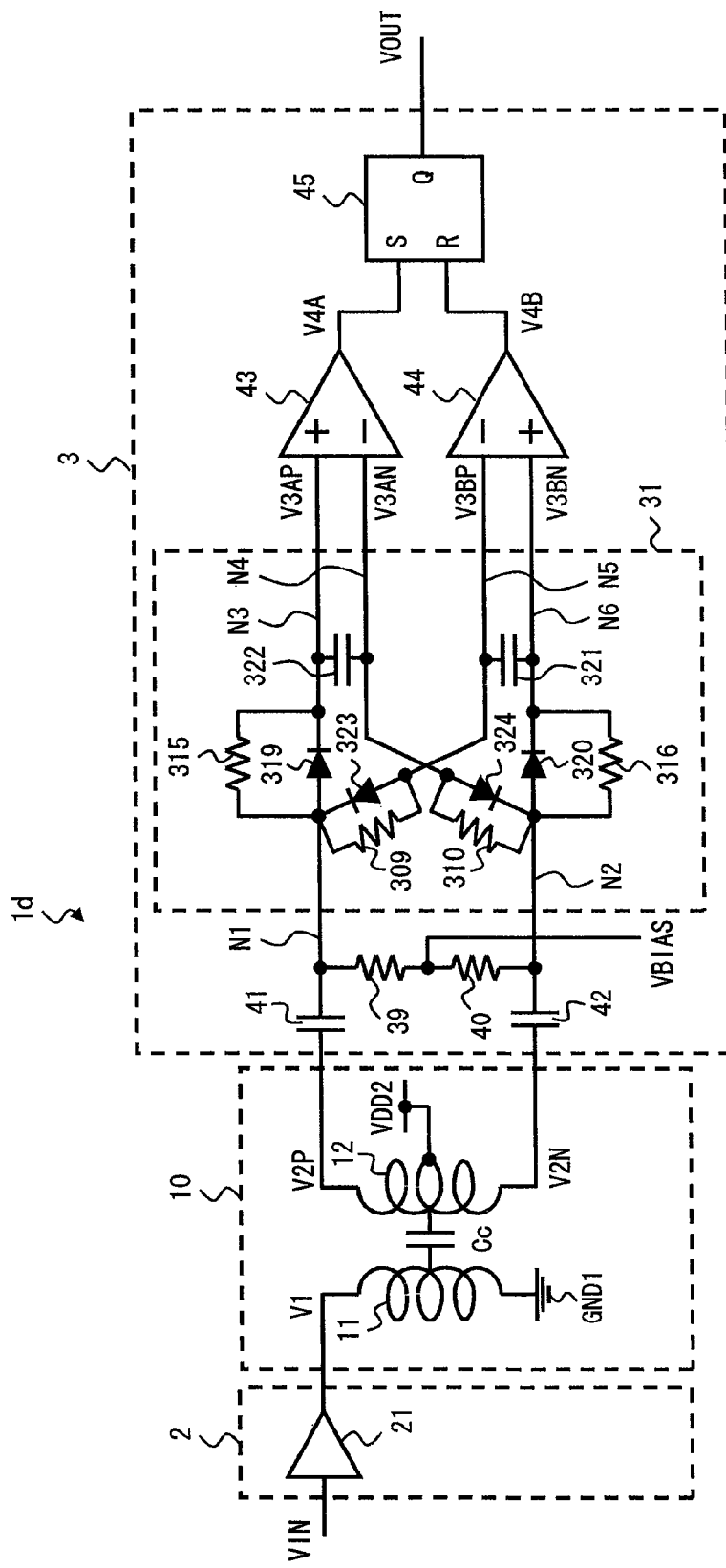
FIG. 12 is a block diagram showing a modified example of the signal transmission system according to the fifth embodiment of the invention.

FIG. 12 is a diagram showing a modified example of the signal transmission system 1d shown in FIG. 11. The modified example of the signal transmission system 1d shown in FIG. 12 is different in a part of connections of the circuits that form the pulse width amplifier circuit 31. Further, an RS latch circuit 45 is included in place of the differential amplifier 32 and the receiving buffer 33. In this example, the differential amplifiers 43 and 44 form a comparator circuit, and the RS latch circuit 45 has a function corresponding to the receiving buffer.

The anode of the diode 320 is connected to the node N2, and the cathode of the diode 320 is connected to the node N6. The anode of the diode 324 is connected to the node N4, and the cathode of the diode 324 is connected to the node N2. The capacitor element 321 is placed between the node N5 and the node N6. The capacitor element 322 is placed between the node N3 and the node N4. No modification is made to the other connections in the pulse width amplifier circuit 31.

In the RS latch circuit 45, the amplified signal V4A is input to the S terminal, the amplified signal V4B is input to the R terminal, and the output data VOUT is output from the Q terminal.

The differential amplifier 43 receives signals output from the peak hold circuit 311 and the bottom hold circuit 326 as the hold signals V3AP and V3AN and outputs the amplified signal V4A in accordance with a voltage difference of those hold signals. Further, the differential amplifier 44 receives signals output from the peak hold circuit 312 and the bottom hold circuit 325 as the hold signals V3BP and V3BN and outputs the amplified signal V4B in accordance with a voltage difference of those hold signals.

For example, when a pulse signal with a positive amplitude appears at one end of the secondary coil 12 and a pulse signal with a negative amplitude appears at the other end of the secondary coil 12, the hold signal V3AP on which the pulse signal with a positive amplitude is superimposed is input to the non-inverting input terminal of the differential amplifier 43, and the hold signal V3AN on which the pulse signal with a negative amplitude is superimposed is input to the inverting input terminal of the differential amplifier 43. Accordingly, the differential amplifier 43 outputs the amplified signal V4A from which the common mode voltage is removed and on which the pulse signal with a positive amplitude is superimposed. At the same time, the hold signals V3BP and V3BN on which the pulse signal is not superimposed are input to the non-inverting input terminal and the inverting input terminal of the differential amplifier 44. Accordingly, the differential amplifier 44 outputs the amplified signal V4B on which the pulse signal is not superimposed. Because the amplified signal V4A on which the pulse signal with a positive amplitude is superimposed is input to the S terminal of the RS latch circuit 45, the RS latch circuit 45 outputs the output data VOUT at High level.

On the other hand, when a pulse signal with a negative amplitude appears at one end of the secondary coil 12 and a pulse signal with a positive amplitude appears at the other end of the secondary coil 12, the hold signals V3AP and V3AN on which the pulse signal is not superimposed are input to the non-inverting input terminal and the inverting input terminal of the differential amplifier 43. Accordingly, the differential amplifier 43 outputs the amplified signal V4A on which the pulse signal is not superimposed. At the same time, the hold signal V3BN on which the pulse signal with a positive amplitude is superimposed is input to the non-inverting input terminal of the differential amplifier 44, and the hold signal V3BP on which the pulse signal with a negative amplitude is superimposed is input to the inverting input terminal of the differential amplifier 44. Accordingly, the differential amplifier 44 outputs the amplified signal V4B from which the common mode voltage is removed and on which the pulse signal with a positive amplitude is superimposed. Because the amplified signal V4B on which the pulse signal with a positive amplitude is superimposed is input to the R terminal of the RS latch circuit 45, the RS latch circuit 45 outputs the output data VOUT at Low level.

The receiving circuit 3 shown in FIG. 12 can also reproduce the transmission data VIN more effectively based on the received signals V2P and V2N and output them as the output data VOUT.

(Another Modified Example of Signal Transmission System 1d)

Figure 13:
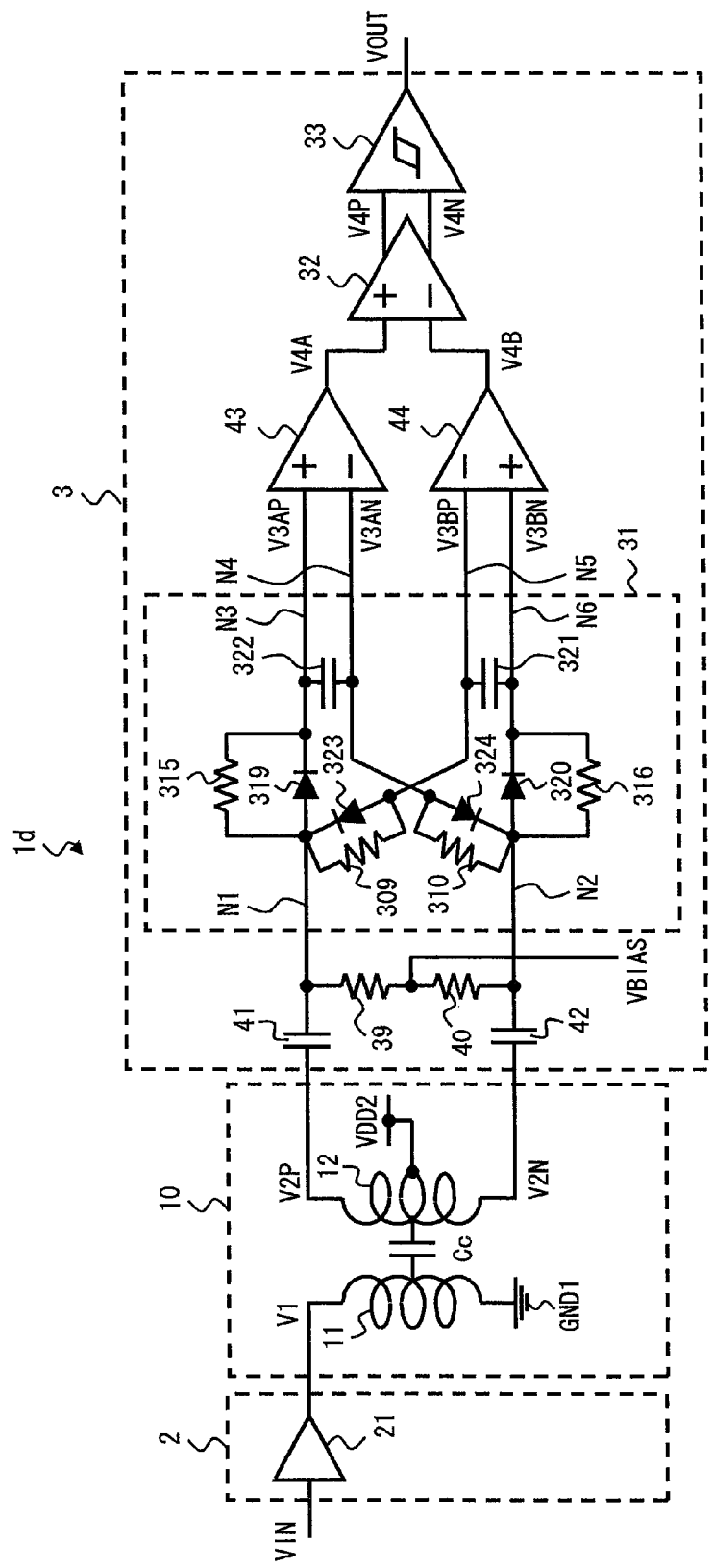
FIG. 13 is a block diagram showing a modified example of the signal transmission system according to the fifth embodiment of the invention.

FIG. 13 is a diagram showing another modified example of the signal transmission system 1d shown in FIG. 11. In another modified example of the signal transmission system 1d shown in FIG. 13, connections of the circuits that form the pulse width amplifier circuit 31 are modified in the same manner as in the pulse width amplifier circuit 31 shown in FIG. 12.

In the receiving circuit 3 shown in FIG. 12, when the voltages of the received signals V2P and V2N shift in the positive direction due to the effect of the common mode voltages, the voltages of the hold signals V3AP and V3AN are likely to vary in the positive direction accordingly, and therefore the voltages of the amplified signals V4A and V4B are also likely to vary in the positive direction. Further, when the voltages of the received signals V2P and V2N shift in the negative direction due to the effect of the common mode voltages, the voltages of the hold signals V3AN and V3BP are likely to vary in the negative direction accordingly, and therefore the voltages of the amplified signals V4A and V4B are also likely to vary in the negative direction. However, because the receiving circuit 3 shown in FIG. 13 includes the differential amplifier 32 and the receiving buffer 33 in the subsequent stage of the pulse width amplifier circuit 31, just like the receiving circuit 3 shown in FIG. 11, the common mode voltages can be removed by the differential amplifier 32.

Sixth Embodiment

Figure 14:
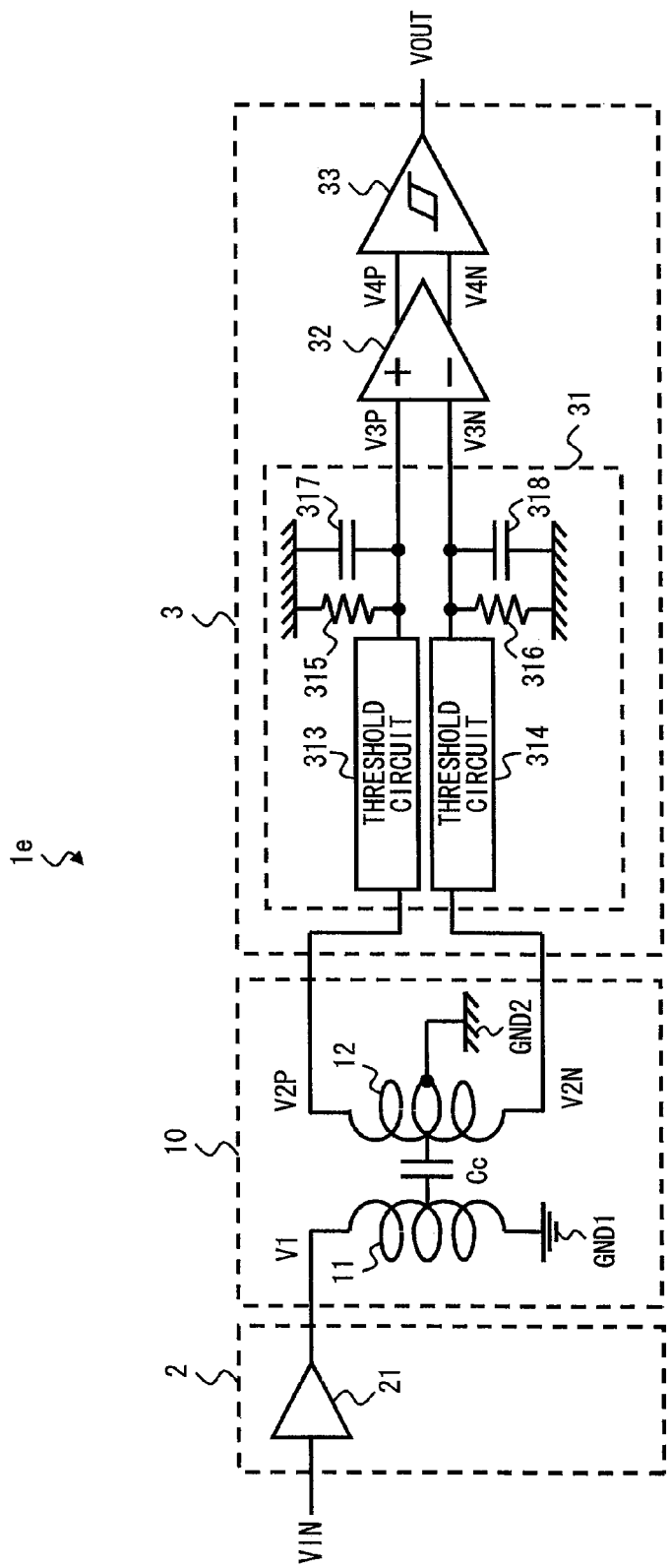
FIG. 14 is a block diagram showing a signal transmission system according to a sixth embodiment of the invention.

FIG. 14 is a diagram showing a signal transmission system 1e according to a sixth embodiment of the invention. The signal transmission system 1e according to this embodiment is different from the signal transmission system 1 according to the first embodiment shown in FIG. 3 in that the pulse width amplifier circuit 31 includes a threshold circuit (first threshold circuit) 313, a threshold circuit (second threshold circuit) 314, resistor elements 315 and 316, and capacitor elements 317 and 318. The other circuit structure of the signal transmission system 1e according to this embodiment is the same as that of the signal transmission system 1 according to the first embodiment shown in FIG. 3 and thus not redundantly described.

In the threshold circuit 313, an input terminal is connected to one end of the secondary coil 12, and an output terminal is connected to the non-inverting input terminal of the differential amplifier 32. In the resistor element 315, one end is connected to the non-inverting input terminal of the differential amplifier 32, and the other end is connected to the ground voltage terminal GND2. In the capacitor element 317, one end is connected to the non-inverting input terminal of the differential amplifier 32, and the other end is connected to the ground voltage terminal GND2.

In the threshold circuit 314, an input terminal is connected to the other end of the secondary coil 12, and an output terminal is connected to the inverting input terminal of the differential amplifier 32. In the resistor element 316, one end is connected to the inverting input terminal of the differential amplifier 32, and the other end is connected to the ground voltage terminal GND2. In the capacitor element 318, one end is connected to the inverting input terminal of the differential amplifier 32, and the other end is connected to the ground voltage terminal GND2.

When a voltage difference Vm between the input terminal and the output terminal of the threshold circuit 313 becomes a certain level or higher, current im flows into the threshold circuit 313. Likewise, when a voltage difference Vm between the input terminal and the output terminal of the threshold circuit 314 becomes a certain level or higher, current im flows into the threshold circuit 314.

Figure 15:
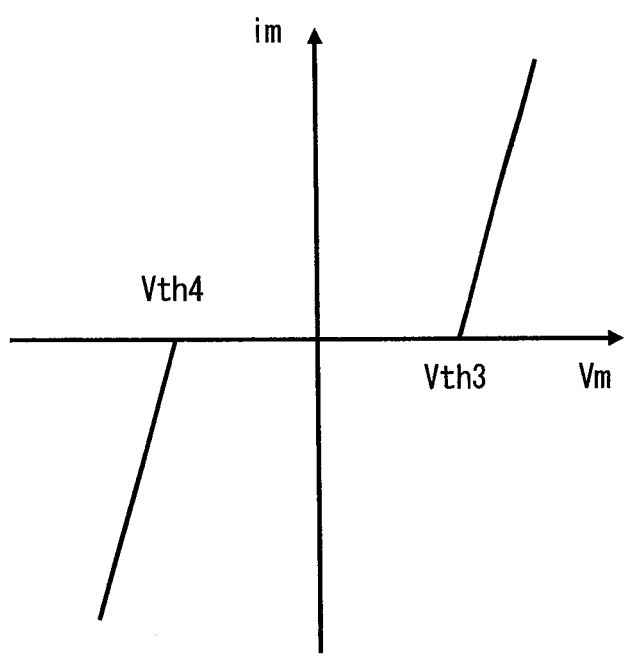
FIG. 15 is a diagram showing output characteristics of a threshold circuit according to the sixth embodiment of the invention.

FIG. 15 is a graph showing the operation of the threshold circuits 313 and 314. Note that the circuit structures of the threshold circuits 313 and 314 are the same, and the threshold circuit 313 is described hereinafter as a representative of them. When a voltage difference Vm between the both ends of the threshold circuit 313 becomes larger than a threshold voltage Vth3, the current im with the level proportional to the voltage Vm flows into the threshold circuit 313. Further, when the voltage difference Vm between the both ends becomes smaller than a threshold voltage Vth4 also, the current im with the level proportional to the voltage Vm flows into the threshold circuit 313. On the other hand, when the voltage difference Vm between the both ends is the threshold voltage Vth4 or larger and the threshold voltage Vth3 or smaller, no current flows into the threshold circuit 313.

(Structural Example of Threshold Circuits 313 and 314)

Figure 16:
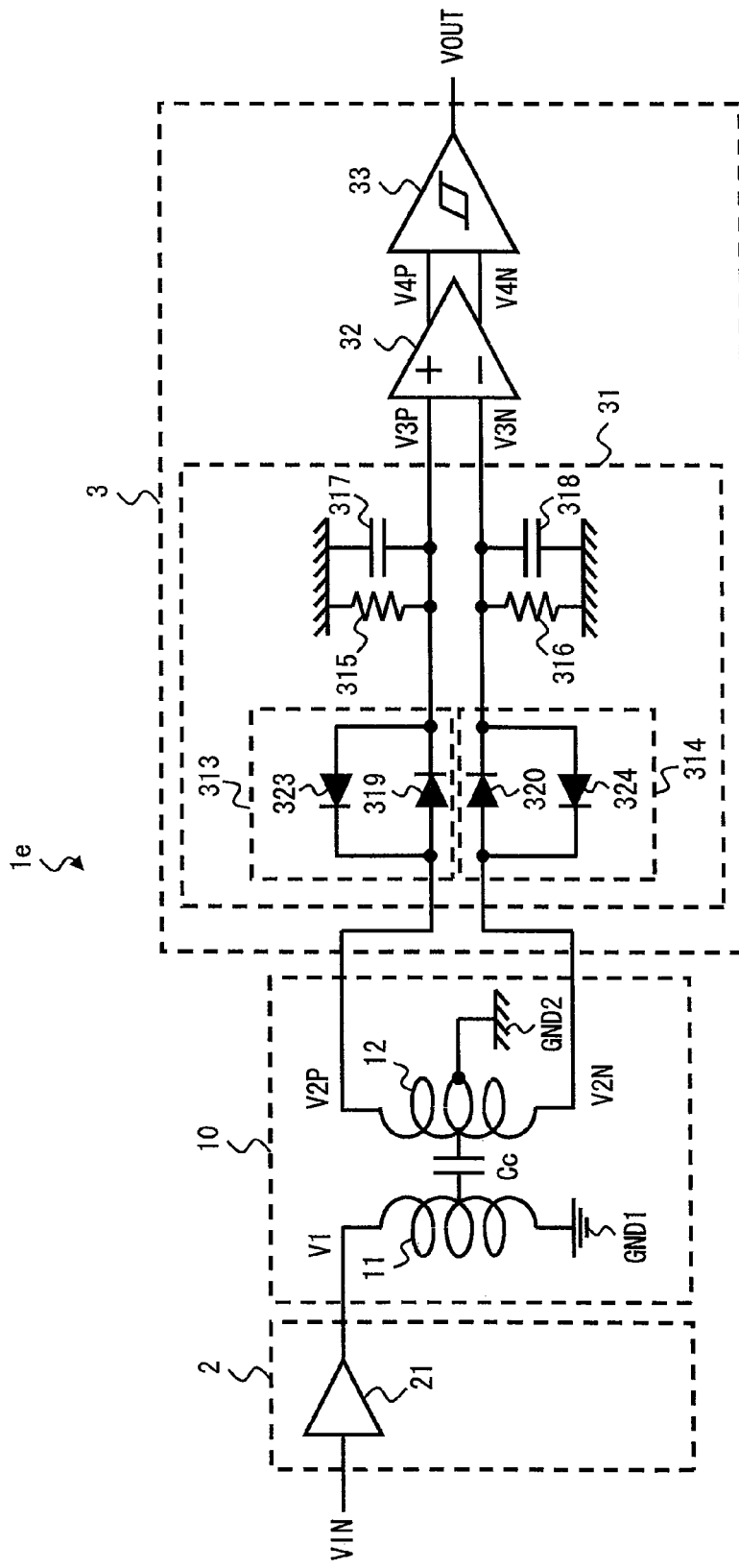
FIG. 16 is a block diagram showing the signal transmission system according to the sixth embodiment of the invention.

FIG. 16 is a specific structural example of the threshold circuits 313 and 314 having diodes as threshold elements. The threshold circuit 313 includes a diode (first threshold circuit) 319 and a diode (third threshold circuit) 323, which are two threshold elements through which current flows when a certain voltage difference is generated between their input terminal and output terminal. The anode of the diode 319 and the cathode of the diode 323 are connected to one end of the secondary coil 12. Further, the cathode of the diode 319 and the anode of the diode 323 are connected to the non-inverting input terminal of the differential amplifier 32. Further, the threshold circuit 314 includes a diode (second threshold circuit) 320 and a diode (fourth threshold circuit) 324, which are two threshold elements through which current flows when a certain voltage difference is generated between their input terminal and output terminal. The anode of the diode 320 and the cathode of the diode 324 are connected to the other end of the secondary coil 12. Further, the cathode of the diode 320 and the anode of the diode 324 are connected to the inverting input terminal of the differential amplifier 32. Note that the threshold elements are not limited to diodes, and a structure in which the gate terminal of an n-channel MOS transistor or a p-channel MOS transistor is short-circuited to the source terminal or the drain terminal may be used.

Figure 17:
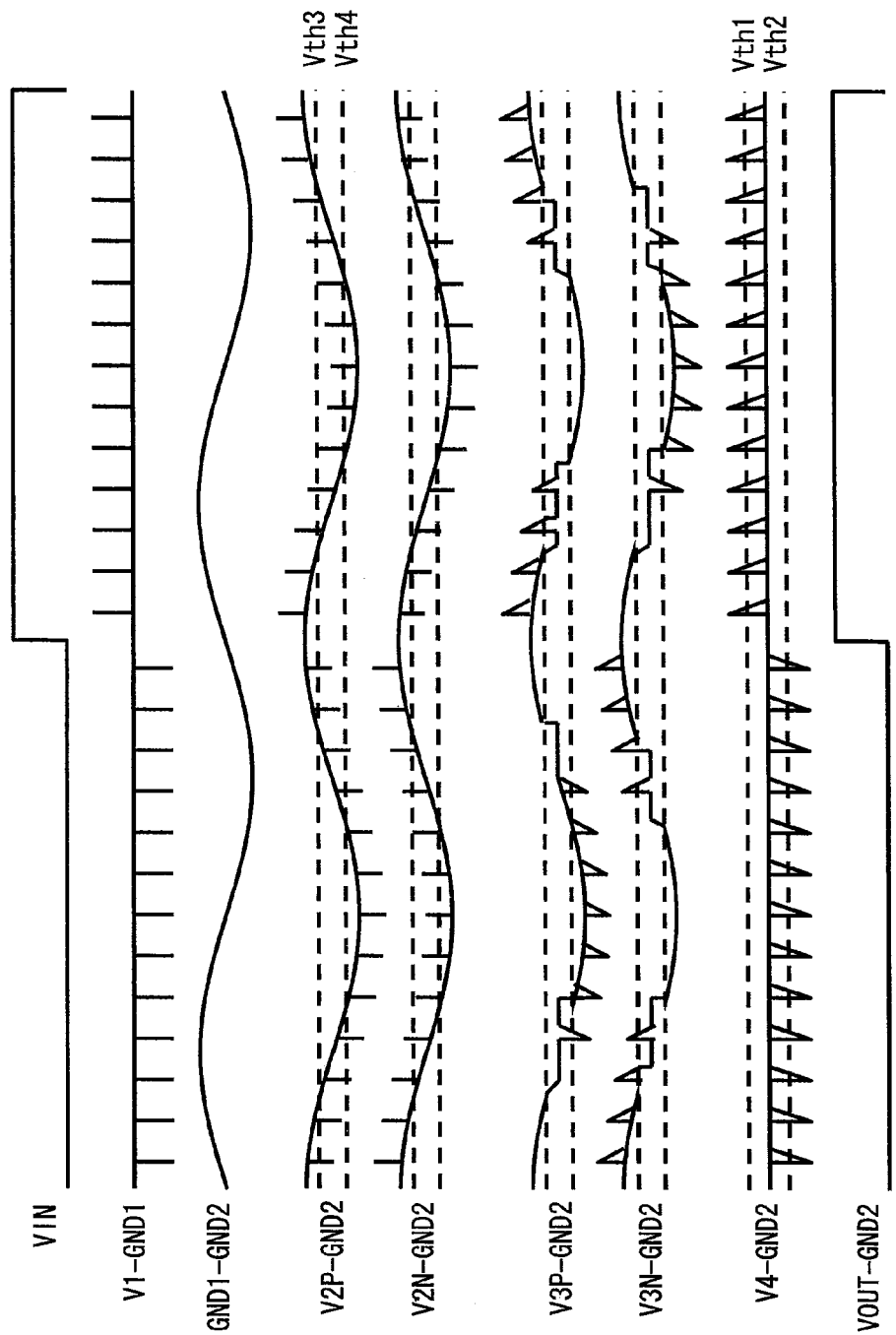
FIG. 17 is a timing chart showing the operation of the signal transmission system according to the sixth embodiment of the invention.

FIG. 17 is a timing chart showing the operation of the signal transmission system 1e shown in FIGS. 14 and 16. Different points from the operation of the signal transmission system 1 according to the first embodiment are mainly described below.

When the voltage of the received signal V2P exceeds the threshold voltage Vth3 or falls below the threshold voltage Vth4, the current im flows into the threshold circuit 313. The capacitor element 317 is thereby charged or discharged. Thus, the pulse signal superimposed on the received signal V2P is stored in the capacitor element 317. As a result, the pulse width of the pulse signal superimposed on the received signal V2P increases, and it is input as the hold signal V3P to the non-inverting input terminal of the differential amplifier 32. After that, when the capacitor element 317 is not charged or discharged for a certain period of time or longer, the voltage of the hold signal V3P converges to the ground voltage GND2 through the resistor element 315. At this time, a voltage difference between the hold signal V3P and the ground voltage GND2 is a waveform as indicated by V3P-GND2 in FIG. 17.

Likewise, when the voltage of the received signal V2N exceeds the threshold voltage Vth3 or falls below the threshold voltage Vth4, the current im flows into the threshold circuit 314. The capacitor element 318 is thereby charged or discharged. Thus, the pulse signal superimposed on the received signal V2N is stored in the capacitor element 318. As a result, the pulse width of the pulse signal superimposed on the received signal V2N increases, and it is input as the hold signal V3N to the inverting input terminal of the differential amplifier 32. After that, when the capacitor element 318 is not charged or discharged for a certain period of time or longer, the voltage of the hold signal V3N converges to the ground voltage GND2 through the resistor element 316. At this time, a voltage difference between the hold signal V3N and the ground voltage GND2 is a waveform as indicated by V3N-GND2 in FIG. 17.

After that, the differential amplifier 32 cancels out the common mode voltages superimposed on the hold signal V3P and the hold signal V3N and outputs the transmission signals V4P and V4N. A voltage difference between the transmission signal V4P and the ground voltage GND2 is a waveform as indicated by V4-GND2 in FIG. 17. Then, the receiving buffer 33 reproduces the transmission data VIN based on the output pulse of the differential amplifier 32 and outputs it as the output data VOUT. A voltage difference between the output data VOUT and the ground voltage GND2 is a waveform as indicated by VOUT-GND2 in FIG. 17.

As described above, the pulse width amplifier circuit 31 that includes the threshold circuits 313 and 314 detects pulse signals superimposed on the received signals V2P and V2N, hold them for a specified period of time and then output them as the hold signals V3P and V3N, respectively. Thus, the pulse width amplifier circuit 31 that includes the threshold circuits 313 and 314 increases the pulse width of the pulse signals superimposed on the received signals V2P and V2N and outputs them as the hold signals V3P and V3N, respectively. Therefore, the differential amplifier 32 in the subsequent stage can operate with high accuracy even when it is not composed of a micro CMOS. In other words, because the receiving circuit 3 can increase the pulse width of the pulse signals superimposed on the received signals V2P and V2N, it is possible to let the differential amplifier 32 operate accurately without increasing the circuit size of the transformer 10 for the purpose of increasing the pulse width.

Further, the transformer 10 is composed of the primary coil 11 and the secondary coil 12 that has the center tap to which a specified voltage is supplied from an external terminal. The receiving circuit 3 can thereby cancel out the common mode voltages respectively superimposed on the received signals V2P and V2N appearing at both ends of the secondary coil 12 by using the differential amplifier in the subsequent stage. Consequently, the receiving circuit 3 can prevent signal transmission error by suppressing the effect of the common mode voltages without an increase in circuit size.

Seventh Embodiment

Figure 18:
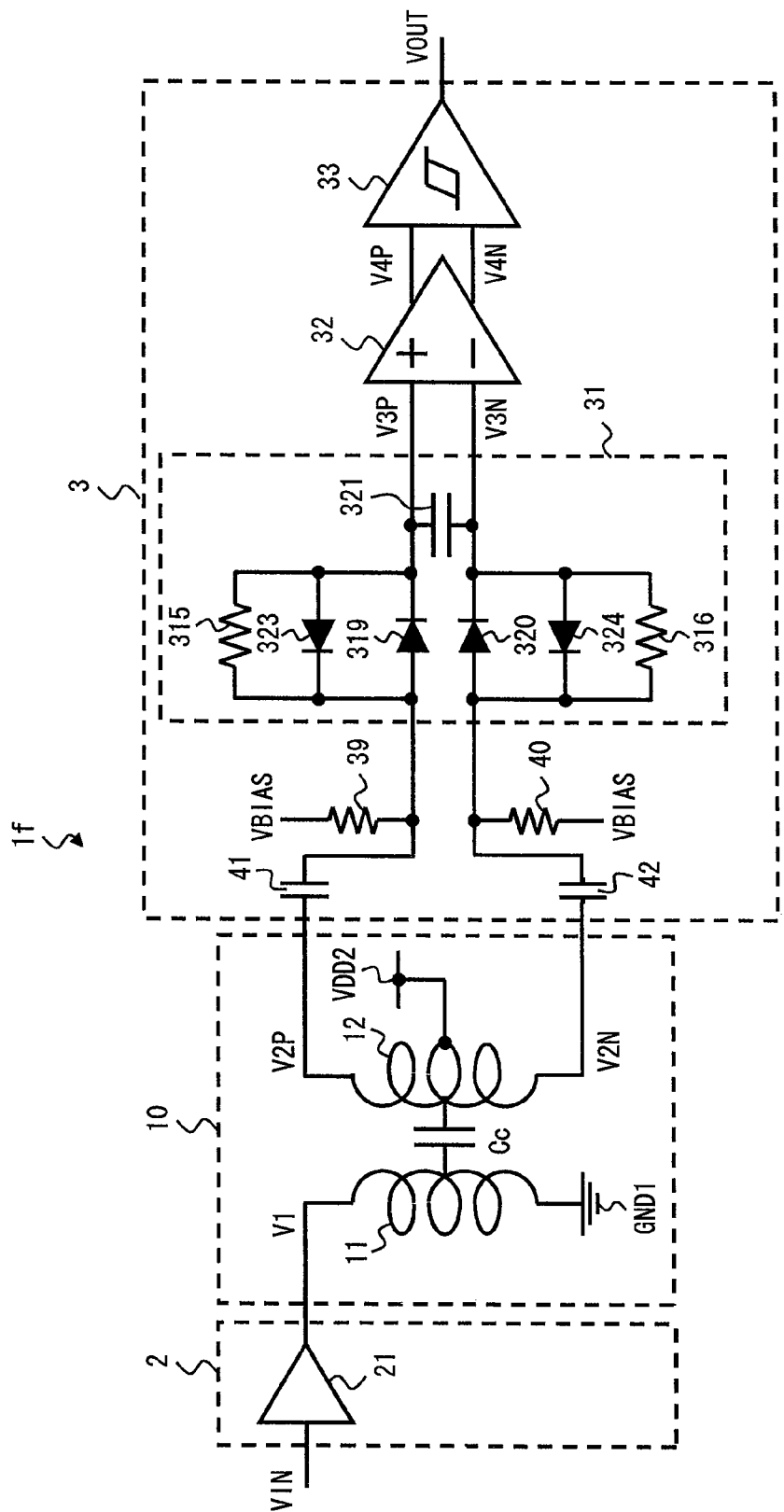
FIG. 18 is a block diagram showing a signal transmission system according to a seventh embodiment of the invention.

FIG. 18 is a diagram showing a signal transmission system 1f according to a seventh embodiment of the invention. The signal transmission system 1f according to this embodiment is different from the signal transmission system 1e according to the sixth embodiment in the structure of the pulse width amplifier circuit 31 and further including resistor elements 39 and 40 and capacitor elements 41 and 42. The other circuit structure of the signal transmission system 1f according to this embodiment is the same as that of the signal transmission system 1e according to the sixth embodiment and thus not redundantly described.

The pulse width amplifier circuit 31 shown in FIG. 18 is different from the pulse width amplifier circuit 31 shown in FIG. 16 in that it includes a capacitor element 321 in place of the capacitor elements 317 and 318. In the capacitor element 321, one end is connected to the non-inverting input terminal of the differential amplifier 32, and the other end is connected to the inverting input terminal of the differential amplifier 32. Thus, the capacitor element 321 is used in common. Therefore, in the receiving circuit 3 according to this embodiment, the area occupied by the capacitor element can be reduced to about half as described above.

Further, the resistor element 315 is connected in parallel with the diodes 319 and 323. The resistor element 316 is connected in parallel with the diodes 320 and 324. In the receiving circuit 3 according to this embodiment, the common mode voltages with relatively low frequencies are actively propagated to the differential amplifier 32 in the subsequent stage to thereby reduce the variations of a voltage difference between the input and output terminals of the threshold circuits 313 and 314, so that the threshold circuits 313 and 314 can operate with high accuracy. Note that the in-phase common mode voltages are canceled out (eliminated) by the differential amplifier 32.

Further, to the center tap of the secondary coil 12, the power supply voltage VDD2, which is a specified voltage, is supplied, instead of the ground voltage GND2, from a power supply voltage terminal VDD2, which is an external terminal. The capacitor element 41 is placed between one end of the secondary coil 12 and the anode of the diode 319. The capacitor element 42 is placed between the other end of the secondary coil 12 and the anode of the diode 320. A bias voltage VBIAS is supplied to the anode of the diode 319 and the anode of the diode 320 through the resistor elements 39 and 40, respectively.

In this circuit structure, the anode of the diode 319 and the anode of the diode 320 are biased by the bias voltage VBIAS. At the same time, the both input terminals of the differential amplifier 32 are biased by the bias voltage VBIAS through the resistor elements 315 and 316. The voltage level at the both input terminals of the differential amplifier 32 can be thereby adjusted, for example.

Although the case where the structure in which the threshold circuit 313 and the threshold circuit 314 have the capacitor element 321 in common, the structure in which the resistor elements 315 and 316 are connected between the input and output terminals of the corresponding threshold circuits, and the structure in which the bias voltage VBIAS is supplied are applied is described as one example in this embodiment, it is not limited thereto, and each structure may be applied independently, or some of those may be applied in combination. Accordingly, the structure in which the other ends (the terminals connected to the secondary coil 12) of the resistor elements 315 and 316 are respectively connected directly to the power supply voltage terminal VDD2, or the structure in which each of the threshold circuit 313 and the threshold circuit 314 has the capacitor element independently of one another may be employed. Further, above-described protection diodes may be applied.

(Modified Example of Signal Transmission System 1*f*)

Figure 19:
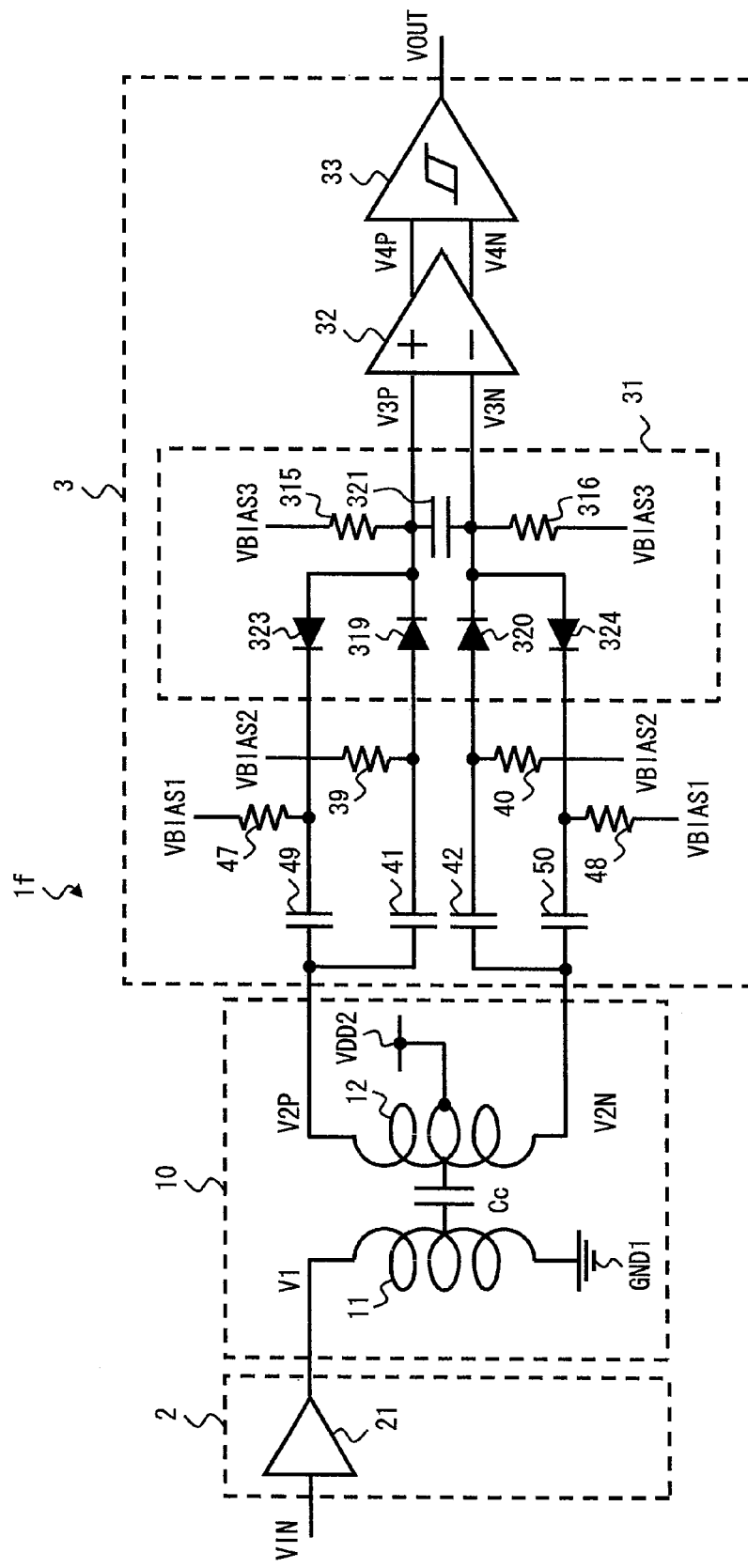
FIG. 19 is a block diagram showing a modified example of the signal transmission system according to the seventh embodiment of the invention.

FIG. 19 is a diagram showing a modified example of the signal transmission system 1f shown in FIG. 18. In the modified example of the signal transmission system 1f shown in FIG. 19, different bias voltages are supplied to the anode and the cathode of the diodes that form the threshold circuit 313 and the threshold circuit 314. This is specifically described hereinbelow.

The receiving circuit 3 shown in FIG. 19 further includes resistor elements 47 and 48 and capacitor elements 49 and 50 in addition to the pulse width amplifier circuit 31, the differential amplifier 32, the receiving buffer 33, the resistor elements 39 and 40, and the capacitor elements 41 and 42.

In the resistor element 315, one end is connected to the non-inverting input terminal of the differential amplifier 32, and a bias voltage VBIAS3 is supplied to the other end. Thus, the bias voltage VBIAS3 is supplied to the cathode of the diode 319 and the anode of the diode 323 through the resistor element 315. In the resistor element 316, one end is connected to the inverting input terminal of the differential amplifier 32, and the bias voltage VBIAS3 is supplied to the other end. Thus, the bias voltage VBIAS3 is supplied to the cathode of the diode 320 and the anode of the diode 324 through the resistor element 316.

The anode of the diode 319 is connected to one end of the secondary coil 12 through the capacitor element 41. The anode of the diode 320 is connected to the other end of the secondary coil 12 through the capacitor element 42. In the resistor element 39, one end is connected to the anode of the diode 319, and a bias voltage VBIAS2 is supplied to the other end. In the resistor element 40, one end is connected to the anode of the diode 320, and the bias voltage VBIAS2 is supplied to the other end. Thus, the bias voltage VBIAS2 is supplied to the anodes of the diodes 319 and 320 through the resistor elements 39 and 40, respectively.

The cathode of the diode 323 is connected to one end of the secondary coil 12 through the capacitor element 49. The cathode of the diode 324 is connected to the other end of the secondary coil 12 through the capacitor element 50. In the resistor element 47, one end is connected to the cathode of the diode 323, and a bias voltage VBIAS1 is supplied to the other end. In the resistor element 48, one end is connected to the cathode of the diode 324, and the bias voltage VBIAS1 is supplied to the other end. Thus, the bias voltage VBIAS1 is supplied to the cathodes of the diodes 323 and 324 through the resistor elements 47 and 48, respectively.

In general, the threshold of a threshold element is a value that is unique to the element, and therefore there is a case where the threshold value cannot be changed in circuit design. In this embodiment, different bias voltages are applied to the anodes and the cathodes of the diodes 319, 320, 323 and 324, which are the threshold elements. Accordingly, even when the voltages of the received signals V2P and V2N appearing at the secondary coil 12 are the same level, the effective threshold values of those diodes can be adjusted arbitrarily by adjusting the level of each bias voltage.

Eighth Embodiment

Figure 20:
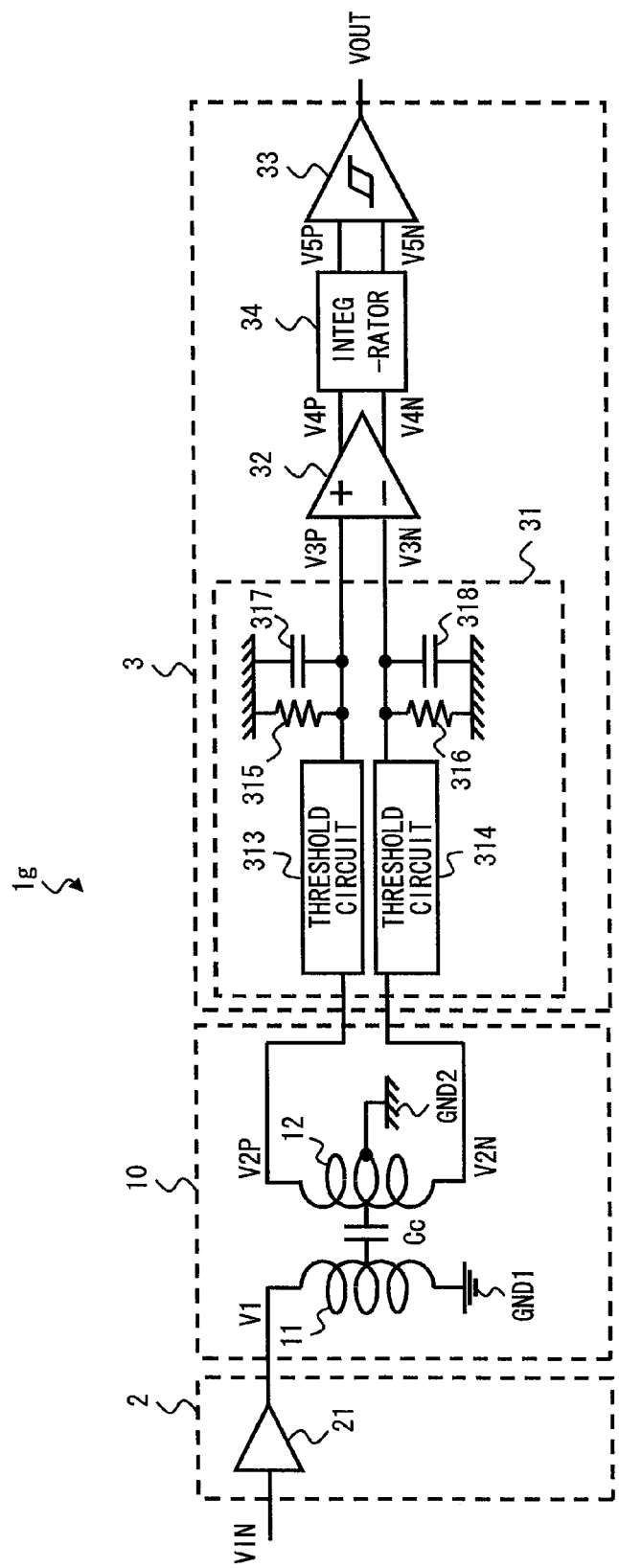
FIG. 20 is a block diagram showing a signal transmission system according to an eighth embodiment of the invention.

FIG. 20 is a diagram showing a signal transmission system 1g according to an eighth embodiment of the invention. The signal transmission system 1g according to this embodiment is different from the signal transmission system 1e according to the sixth embodiment shown in FIG. 14 in that it further includes an integrator 34 between the differential amplifier 32 and the receiving buffer 33. The other circuit structure of the signal transmission system 1g according to this embodiment is the same as that of the signal transmission system 1e according to the sixth embodiment shown in FIG. 14 and thus not redundantly described.

Figure 21:
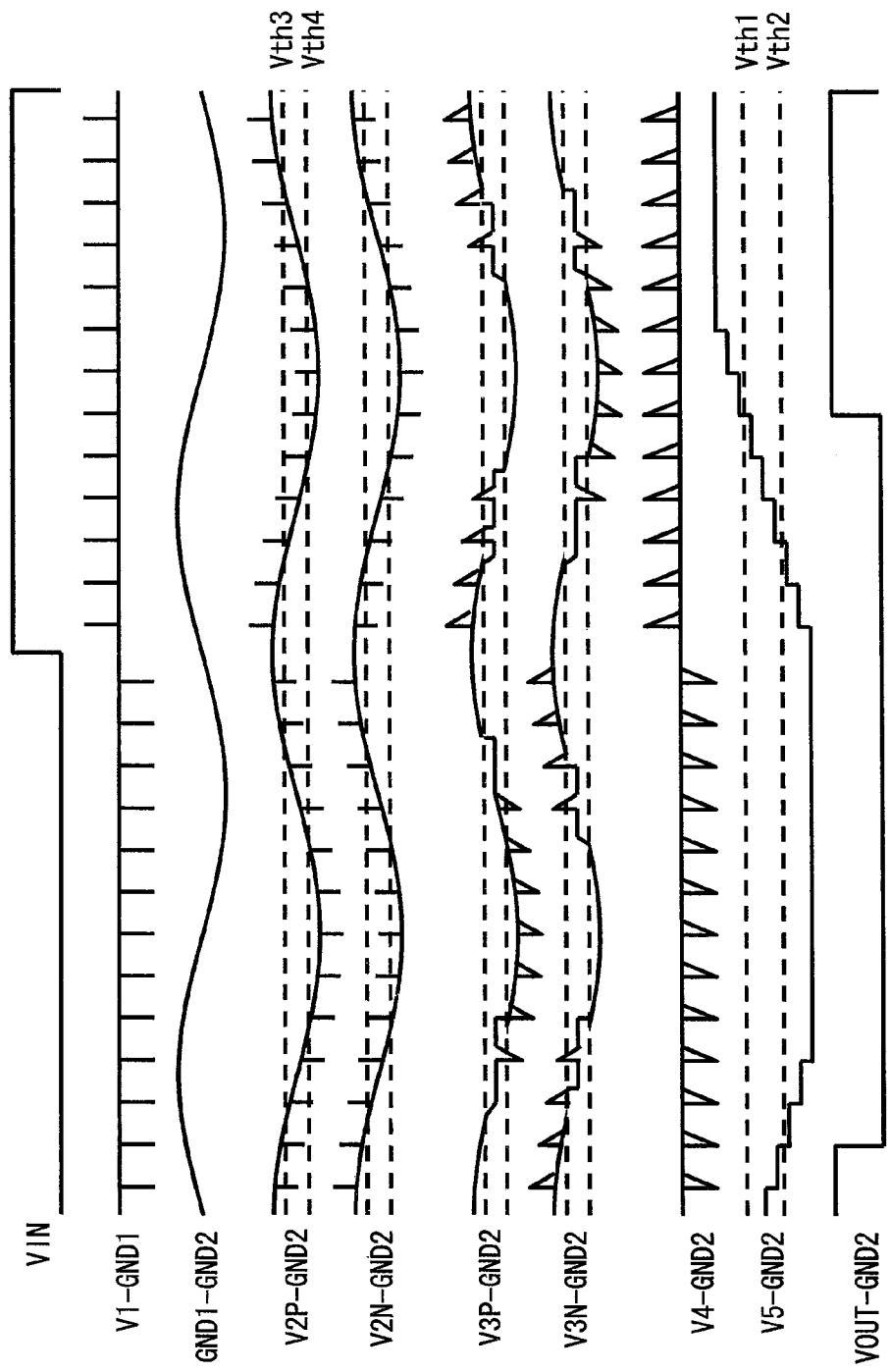
FIG. 21 is a timing chart showing the operation of the signal transmission system according to the eighth embodiment of the invention.

FIG. 21 is a timing chart showing the operation of the signal transmission system 1g shown in FIG. 20. As is obvious from the waveform indicated by V5-GND2 in FIG. 21, in the receiving circuit 3 according to this embodiment, the receiving buffer 33 does not determine the logical level by the polarity of one pulse that is output from the differential amplifier 32 but determines the logical level by the integral of a plurality of pulses that are output from the differential amplifier 32. Therefore, the receiving circuit 3 according to this embodiment is less subject to one-shot pulse due to noise.

Figure 22:
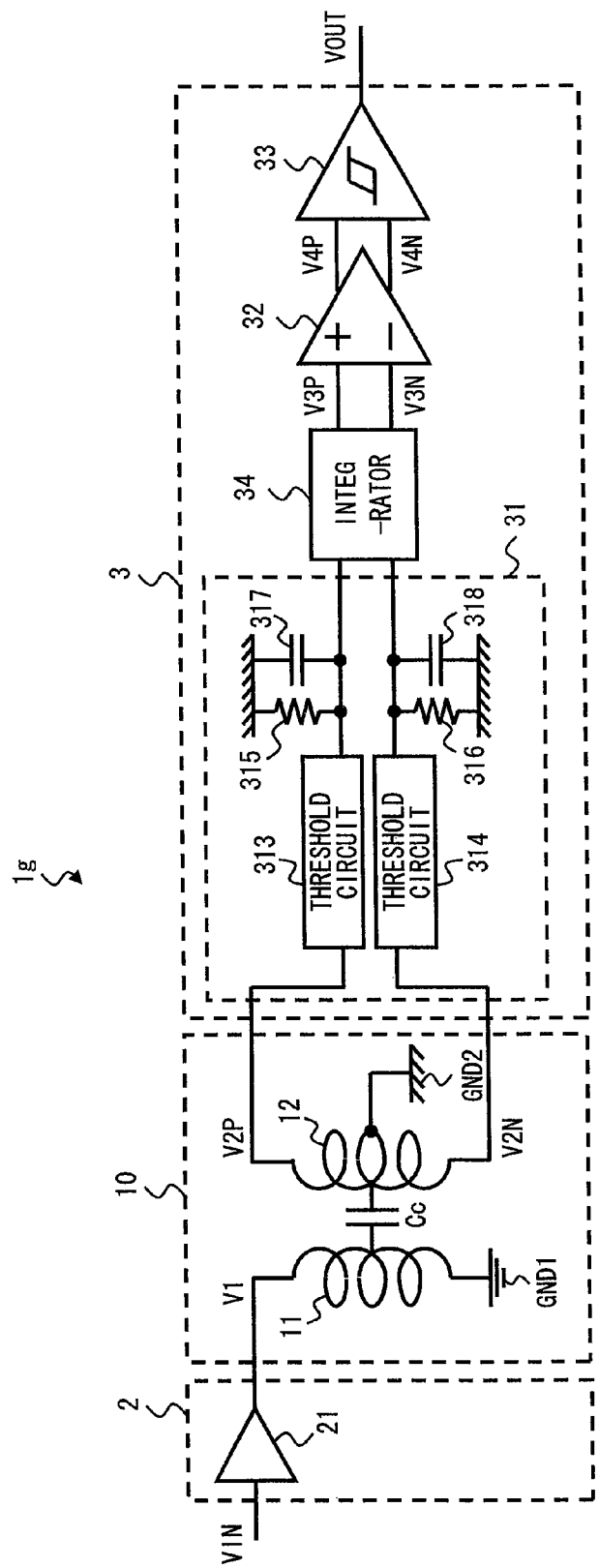
FIG. 22 is a block diagram showing a modified example of the signal transmission system according to the eighth embodiment of the invention.

Note that the integrator 34 may be placed in the previous stage of the differential amplifier 32 as shown in FIG. 22. Further, although this embodiment is described using the structure in which the pulse width amplifier circuit 31 includes the two threshold circuits 313 and 314 as an example, it is not limited thereto. For example, the structure may be altered as appropriate to any of the structures of the pulse width amplifier circuit 31 described in the above embodiments, such as the structure in which the pulse width amplifier circuit 31 includes two peak hold circuits, for example.

Ninth Embodiment

Figure 23:
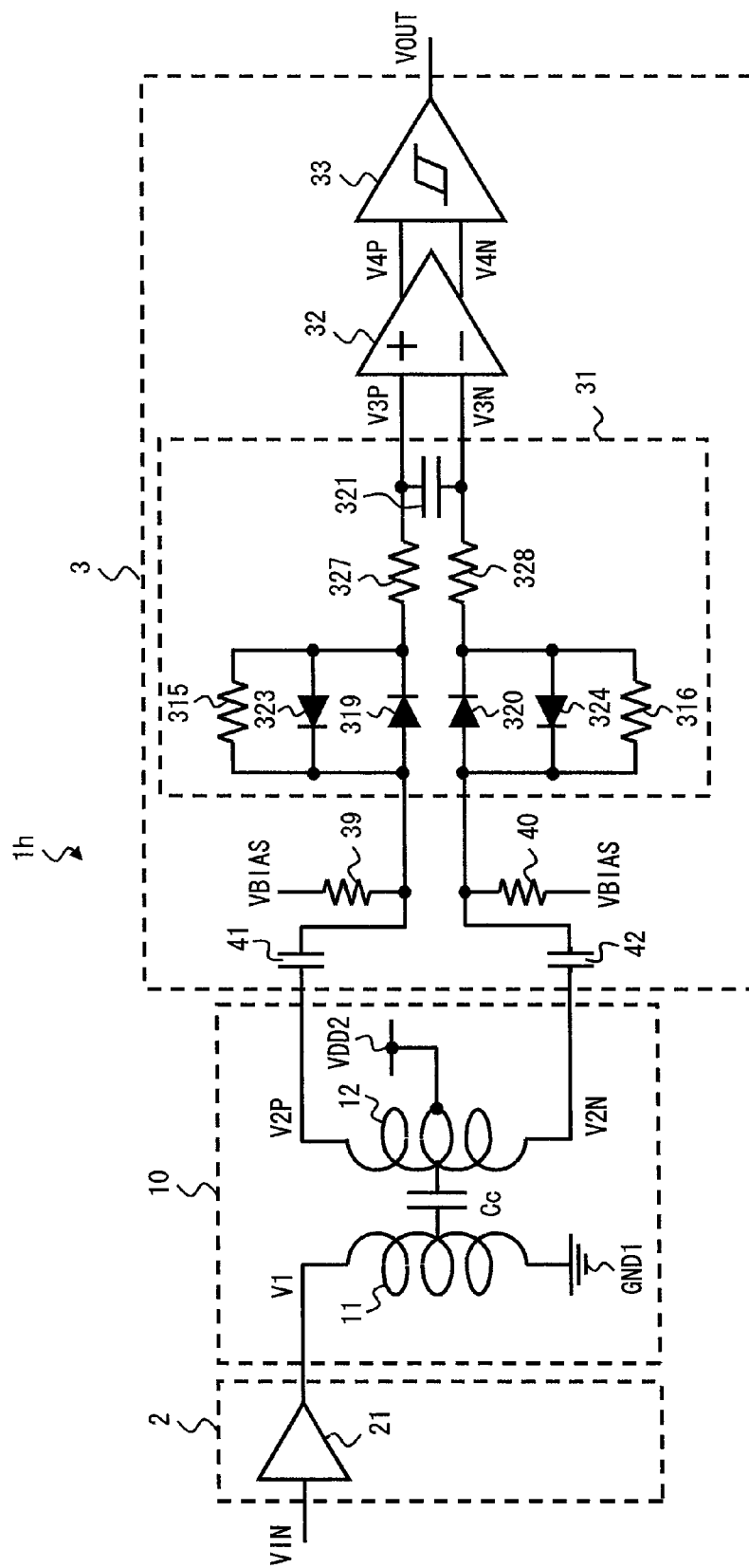
FIG. 23 is a block diagram showing a signal transmission system according to a ninth embodiment of the invention.

FIG. 23 is a diagram showing a signal transmission system 1h according to a ninth embodiment of the invention. The signal transmission system 1h according to this embodiment is different from the signal transmission system if according to the seventh embodiment shown in FIG. 18 in that the receiving circuit 3 further includes resistor elements 327 and 328. The other circuit structure of the signal transmission system 1h according to this embodiment is the same as that of the signal transmission system if according to the seventh embodiment shown in FIG. 18 and thus not redundantly described.

The resistor element 327 is placed between one end of the capacitor element 321 and the cathode of the diode 319. The resistor element 328 is placed between the other end of the capacitor element 321 and the cathode of the diode 320. Thus, the capacitor element 321 and the resistor elements 327 and 328 form an integrator.

In this manner, in the receiving circuit 3 according to this embodiment, the capacitor element 321 is used not only for increasing the pulse width but also as a part of the integrator. An increase in circuit size is thereby suppressed.

Figure 24:
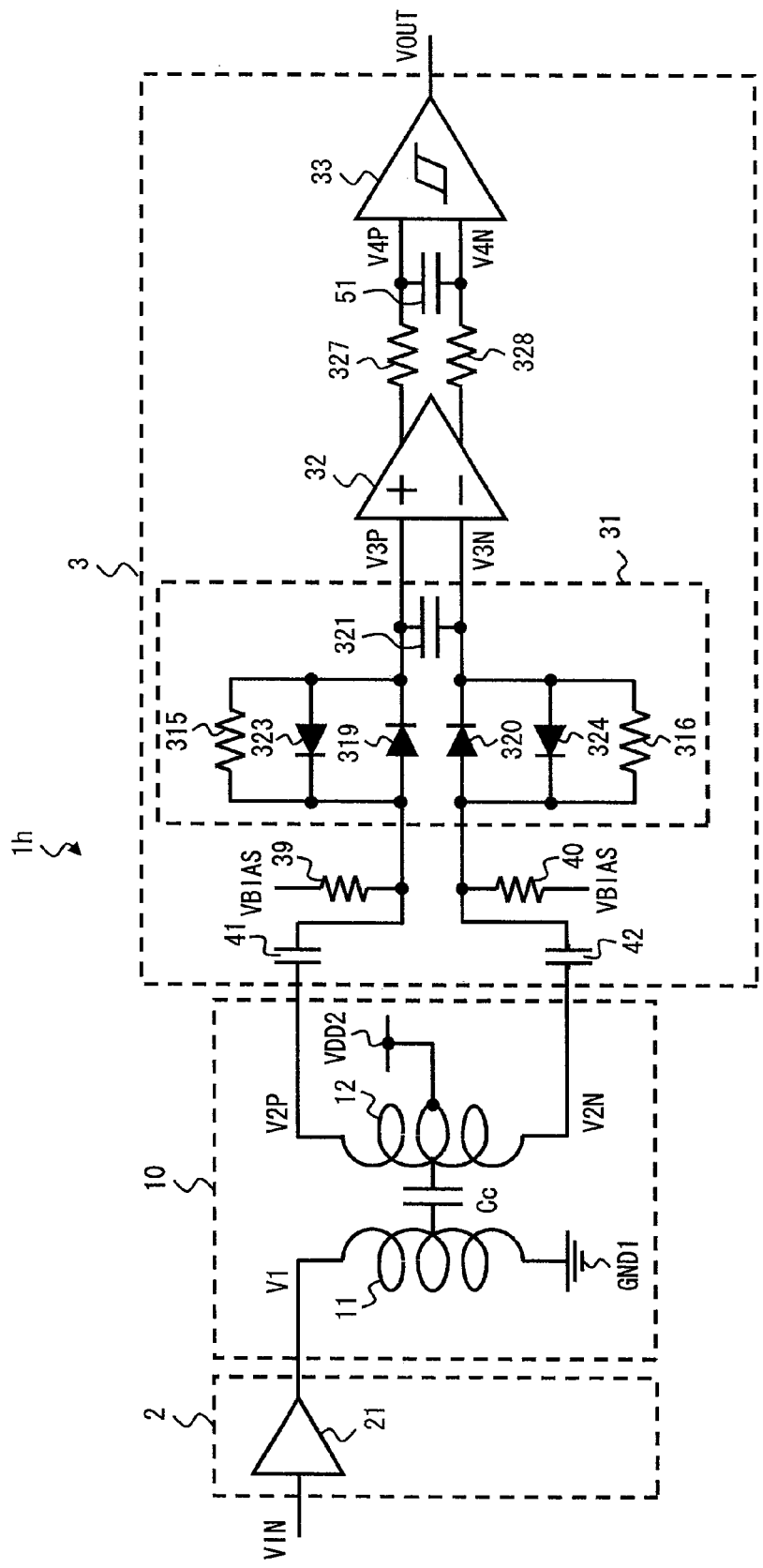
FIG. 24 is a block diagram showing a modified example of the signal transmission system according to the ninth embodiment of the invention.

Note that, as shown in FIG. 24, the structure in which the integrator composed of the resistor elements 327 and 328 and the capacitor element 51 may be placed between the differential amplifier 32 and the receiving buffer 33 may be employed. In this case, however, it should be noted that the capacitor element 321 is not used as a part of the integrator and therefore the circuit size is larger than that of the circuit shown in FIG. 23.

As described above, the pulse width amplifier circuit 31 detects the pulse signals superimposed on the received signals V2P and V2P, holds them for a specified period of time and then outputs them as the hold signals V3P and V3N. Thus, the pulse width amplifier circuit 31 increases the pulse width of the pulse signals superimposed on the received signals V2P and V2N and outputs them as the hold signals V3P and V3N. Therefore, the differential amplifier 32 in the subsequent stage can operate with high accuracy even when it is not composed of a micro CMOS. In other words, because the receiving circuit 3 according to the first to ninth embodiments described above can increase the pulse width of the pulse signals superimposed on the received signals V2P and V2N, it is possible to let the differential amplifier 32 operate accurately without increasing the circuit size of the transformer 10 for the purpose of increasing the pulse width.

Further, the transformer 10 is composed of the primary coil 11 and the secondary coil 12 that has the center tap to which a specified voltage is supplied from an external terminal. The receiving circuit 3 according to the first to ninth embodiments can thereby cancel out the common mode voltages respectively superimposed on the received signals V2P and V2N appearing at both ends of the secondary coil 12 by using the differential amplifier in the subsequent stage. Consequently, the receiving circuit 3 according to the first to ninth embodiments can prevent signal transmission error by suppressing the effect of the common mode voltages without an increase in circuit size.

The present invention is not restricted to the above-described embodiments, and various changes and modifications may be made without departing from the scope of the invention. For example, the receiving buffer 33 is not limited to a hysteresis comparator, and it may be a Schmitt trigger circuit or a status circuit that hold a value exceeding a specified threshold for a certain period of time.

Further, the receiving circuit 3 for full-wave rectification shown in FIGS. 11 to 13 may be altered as appropriate to the structure in which bias voltages that are independent of one another are supplied to the anode and the cathode of the respective diodes that form the pulse width amplifier circuit 31, just like the case of the receiving circuit 3 shown in FIG. 19.

Further, the layout of the transmitting circuit 2, the receiving circuit 3 and the transformer 10 is not limited to the structure shown in FIG. 2. FIGS. 25 to 35 show other examples of implementation of the signal transmission system according to the present invention.

Figure 25:
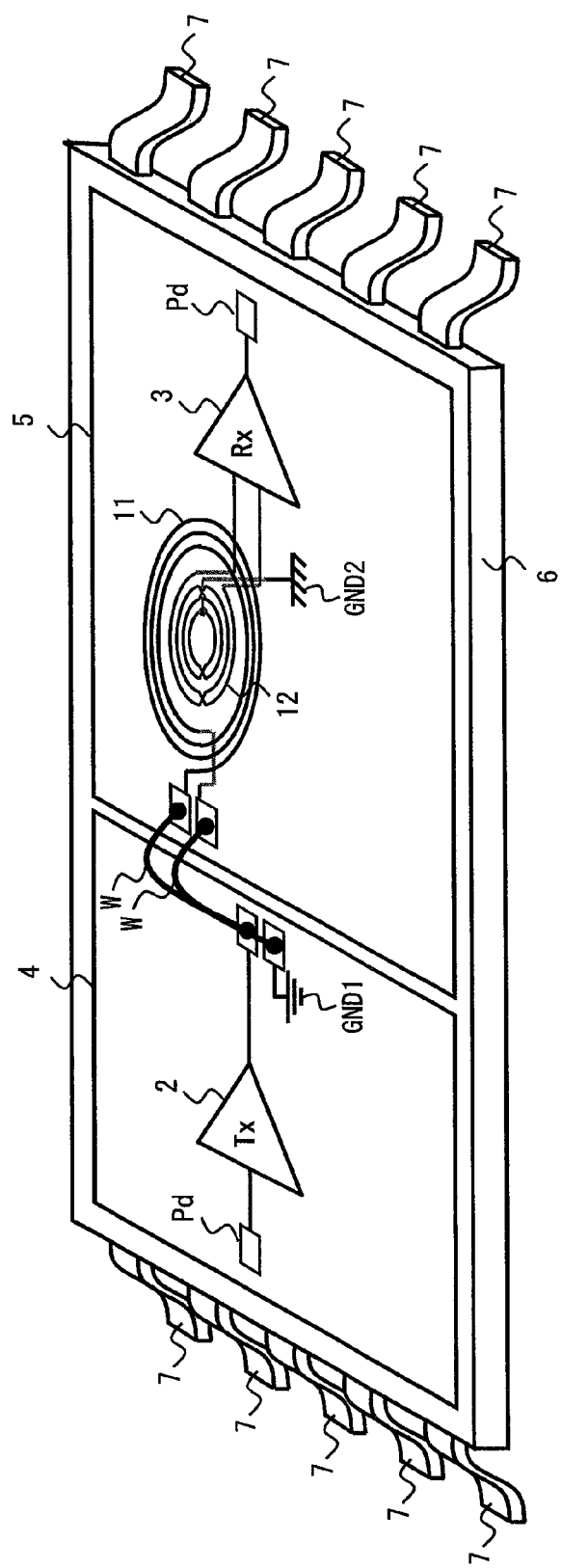
FIG. 25 is a schematic diagram showing implementation of a signal transmission system according to the present invention.

In the implementation shown in FIG. 25, the transmitting circuit 2 is formed on the first semiconductor chip 4. The primary coil 11, the secondary coil 12 and the receiving circuit 3 are formed on the second semiconductor chip 5. Further, a pad that is connected to the transmitting circuit 2 is formed on the first semiconductor chip 4, and a pad that is connected to the primary coil 11 is formed on the second semiconductor chip 5. The transmitting circuit 3 is connected to one end of the primary coil 11 that is formed on the second semiconductor chip 5 through the pad and a bonding wire W. Further, the other end of the primary coil 11 is connected to the ground voltage terminal GND1 on the first semiconductor chip 4 side through the pad and a bonding wire W.

Note that, in the example of FIG. 25, the primary coil 11 and the secondary coil 12 are formed on the same wiring layer in one semiconductor chip. Further, the primary coil 11 and the secondary coil 12 are formed as windings having substantially the same center position.

Figure 26:
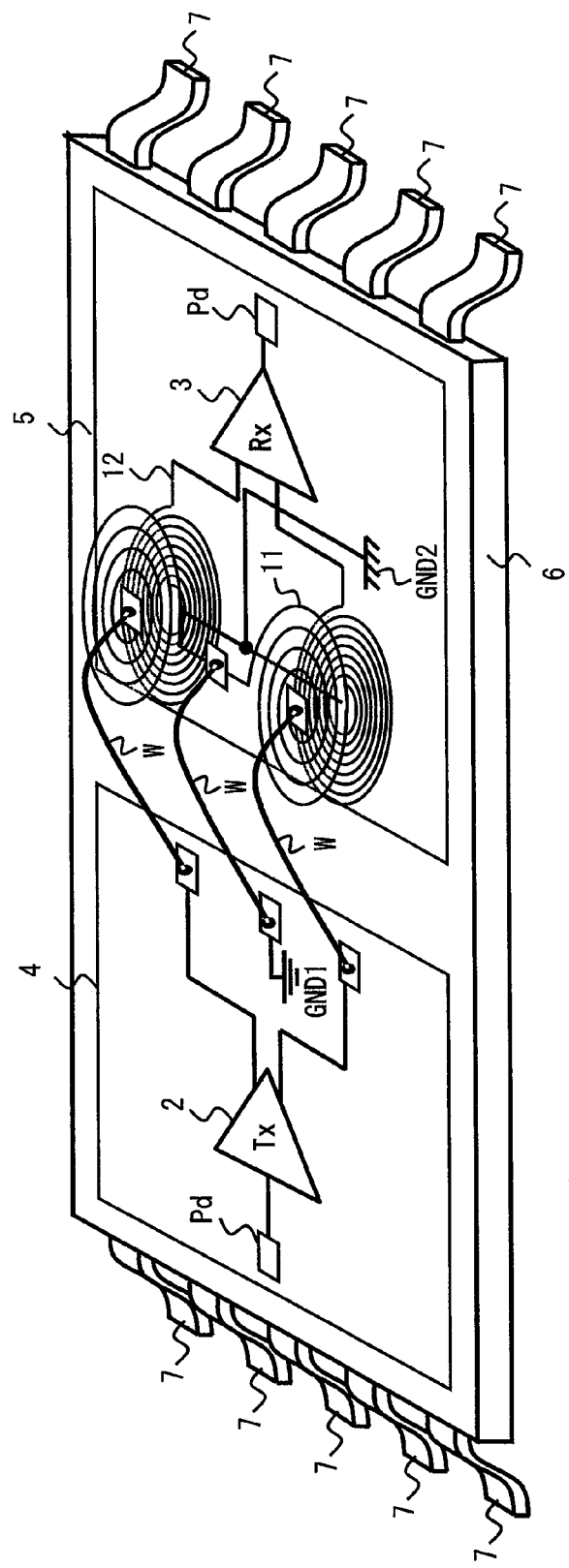
FIG. 26 is a schematic diagram showing implementation of a signal transmission system according to the present invention.

In the implementation shown in FIG. 26, the transmitting circuit 2 is formed on the first semiconductor chip 4. The primary coil 11, the secondary coil 12 and the receiving circuit 3 are formed on the second semiconductor chip 5. Further, a pad that is connected to the transmitting circuit 2 is formed on the first semiconductor chip 4, and a pad that is connected to the primary coil 11 is formed on the second semiconductor chip 5. The transmitting circuit 2 is connected to the primary coil 11 that is formed on the second semiconductor chip 5 through the pad and a bonding wire W. Further, the center tap of the primary coil 11 is connected to the ground voltage terminal GND1 on the first semiconductor chip 4 side through the pad and a bonding wire W.

Note that, in the example of FIG. 26, the primary coil 11 and the secondary coil 12 are respectively formed on a first wiring layer and a second wiring layer that are vertically laminated in one semiconductor chip. Further, the primary coil 11 is formed using two windings with the center tap placed therebetween, and the secondary coil 12 is formed using two windings with the center tap placed therebetween.

Figure 27:
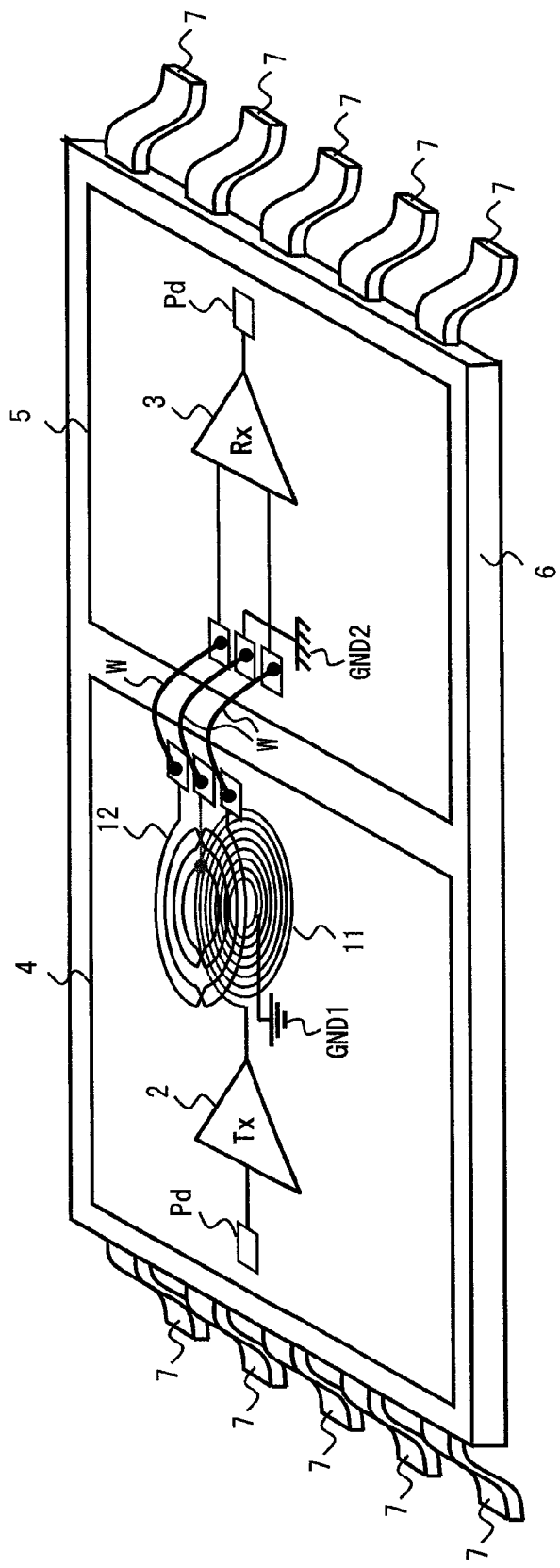
FIG. 27 is a schematic diagram showing implementation of a signal transmission system according to the present invention.
Figure 28:
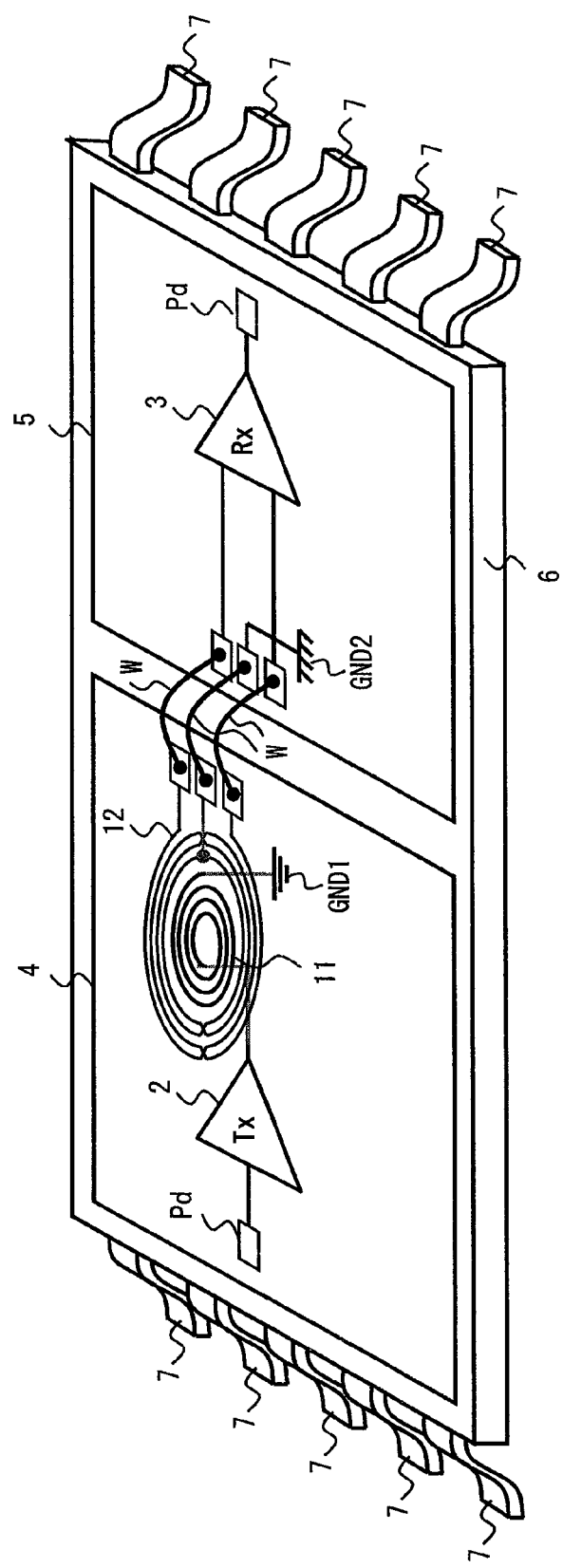
FIG. 28 is a schematic diagram showing implementation of a signal transmission system according to the present invention.
Figure 29:
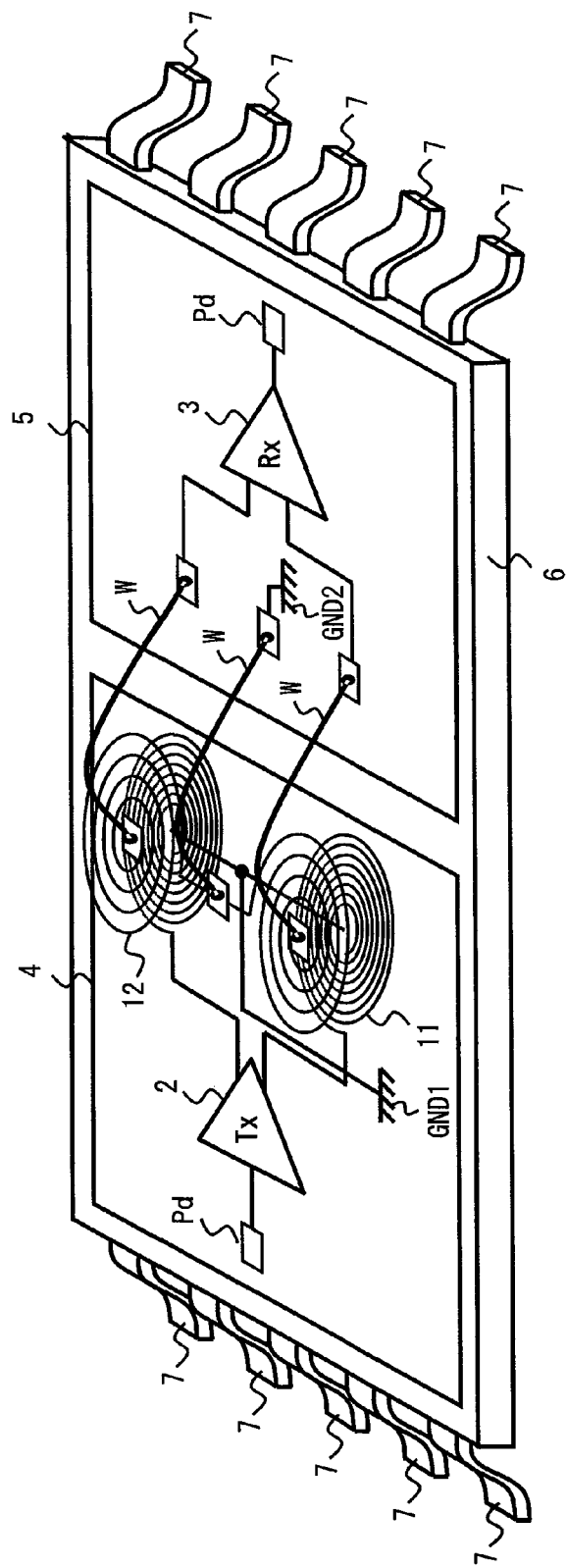
FIG. 29 is a schematic diagram showing implementation of a signal transmission system according to the present invention.

In the implementation shown in FIGS. 27, 28 and 29, the transmitting circuit 2, the primary coil 11 and the secondary coil 12 are formed on the first semiconductor chip 4. The receiving circuit 3 is formed on the second semiconductor chip 5. Further, a pad that is connected to the secondary coil 12 is formed on the first semiconductor chip 4, and a pad that is connected to the receiving circuit 3 is formed on the second semiconductor chip 5. The transmitting circuit 3 is connected to the secondary coil 12 that is formed on the first semiconductor chip 4 through the pad and a bonding wire W. Further, the center tap of the secondary coil 12 is connected to the ground voltage terminal GND2 on the second semiconductor chip 5 through the pad and a bonding wire W.

Note that, in the example of FIGS. 27 and 29, the primary coil 11 and the secondary coil 12 are respectively formed on a first wiring layer and a second wiring layer that are vertically laminated in one semiconductor chip. Further, in the example of FIG. 29, the primary coil 11 is formed using two windings with the center tap placed therebetween, and the secondary coil 12 is formed using two windings with the center tap placed therebetween.

Further, in the example of FIG. 28, the primary coil 11 and the secondary coil 12 are formed on the same wiring layer in one semiconductor chip. Further, the primary coil 11 and the secondary coil 12 are formed as windings having substantially the same center position.

Figure 30:
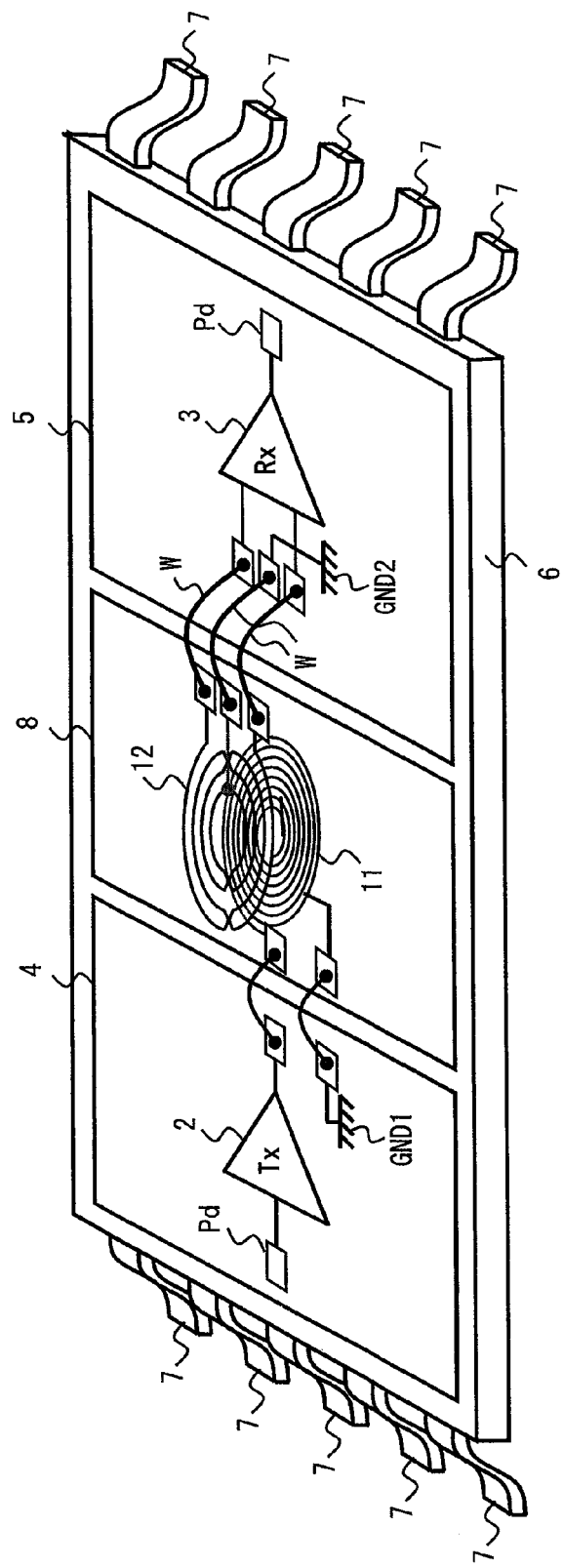
FIG. 30 is a schematic diagram showing implementation of a signal transmission system according to the present invention.

In the implementation shown in FIG. 30, the transmitting circuit 2 is formed on the first semiconductor chip 4, the receiving circuit 3 is formed on the second semiconductor chip 5, and the primary coil 11 and the secondary coil 12 are formed on a third semiconductor chip 8. Further, a pad that is connected to the transmitting circuit 2 is formed on the first semiconductor chip 4, a pad that is connected to the receiving circuit 3 is formed on the second semiconductor chip 5, and a pad that is connected to the primary coil 11 and a pad that is connected to the secondary coil 12 are formed on the third semiconductor chip 8. Then, the transmitting circuit 3 is connected to one end of the primary coil 11 that is formed on the third semiconductor chip 8 through the pad and a bonding wire W. Further, the other end of the primary coil 11 is connected to the ground voltage terminal GND1 on the first semiconductor chip 4 side through the pad and a bonding wire W. The receiving circuit 3 is connected to the secondary coil 12 that is formed on the third semiconductor chip 8 through the pad and a bonding wire W. Further, the center tap of the secondary coil 12 is connected to the ground voltage terminal GND2 on the second semiconductor chip 5 side through the pad and a bonding wire W.

Note that, in the example of FIG. 30, the primary coil 11 and the secondary coil 12 are respectively formed on a first wiring layer and a second wiring layer that are vertically laminated in one semiconductor chip.

Figure 31:
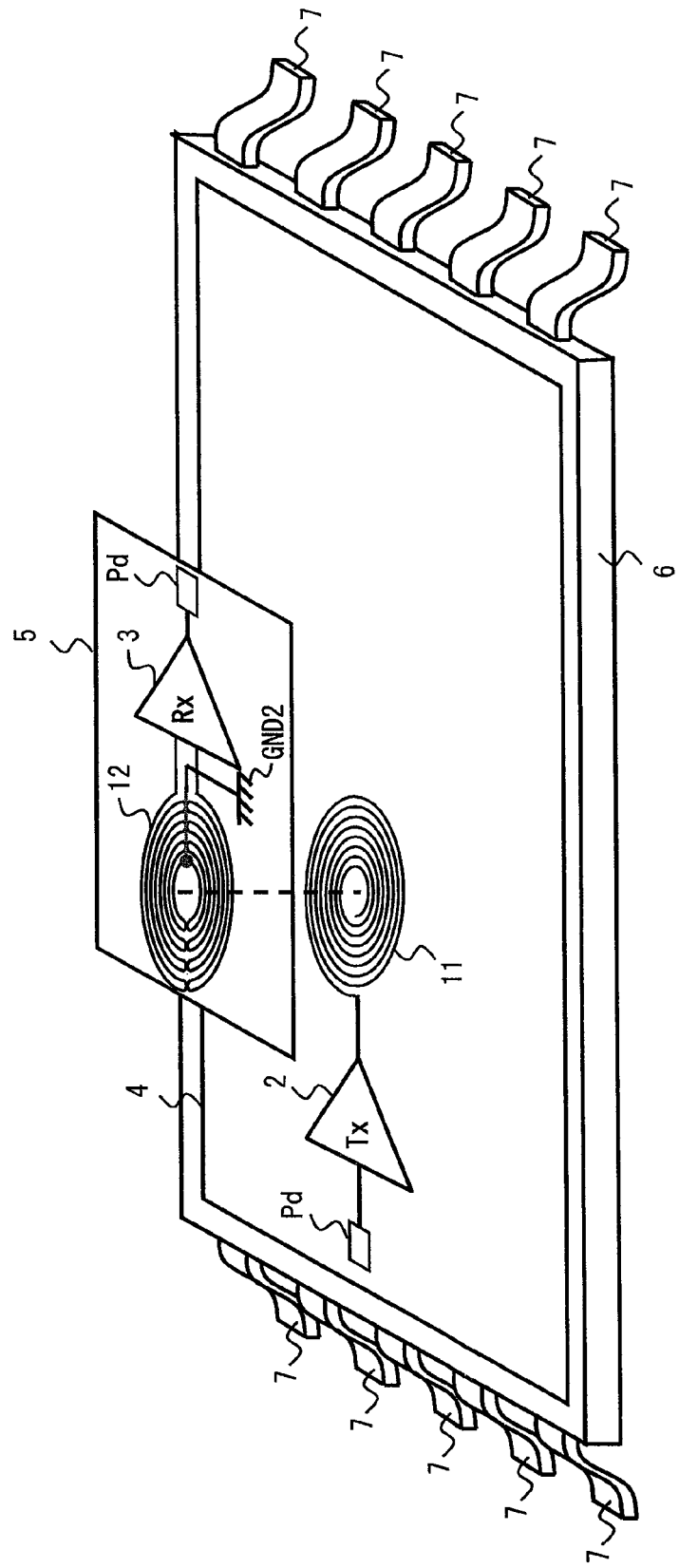
FIG. 31 is a schematic diagram showing implementation of a signal transmission system according to the present invention.
Figure 32:
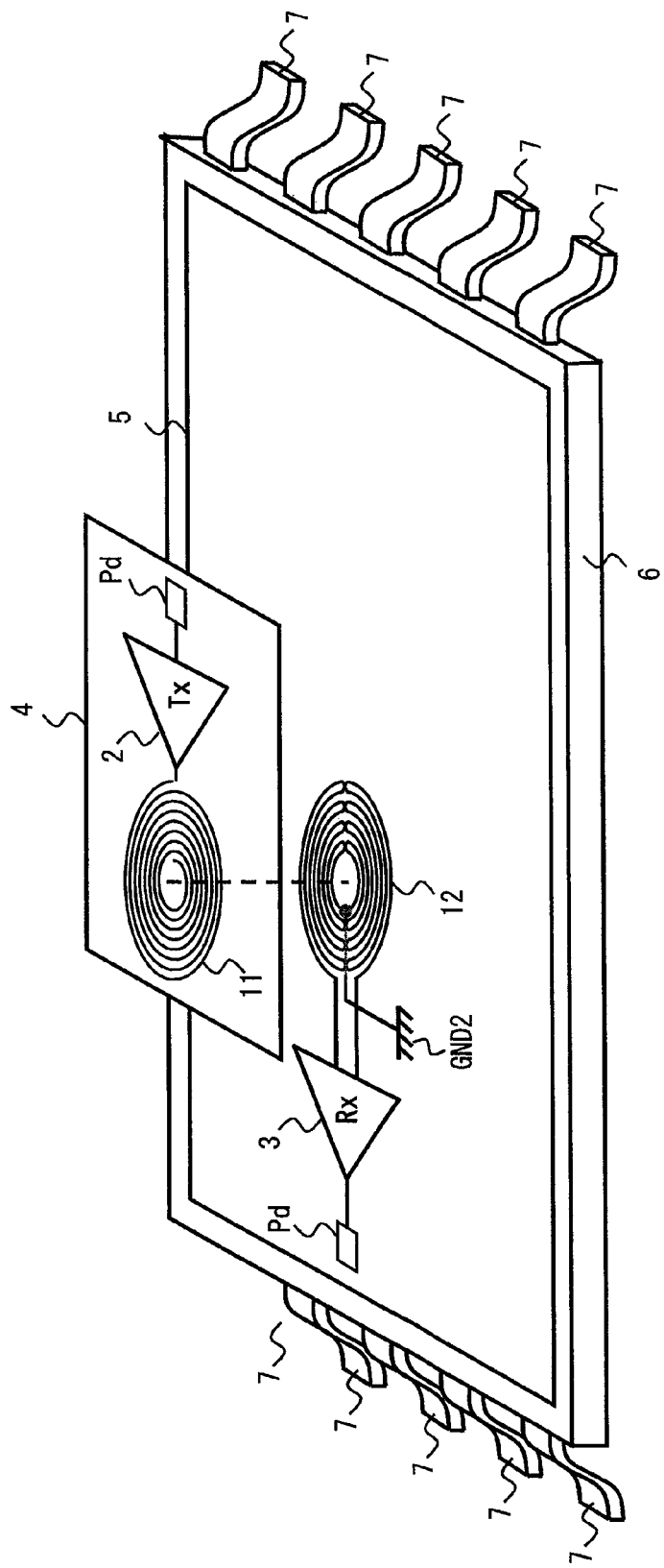
FIG. 32 is a schematic diagram showing implementation of a signal transmission system according to the present invention.

In the example shown in FIGS. 31 and 32, the transmitting circuit 2 and the primary coil 11 are formed on the first semiconductor chip 4, the receiving circuit 3 and the secondary coil 12 are formed on the second semiconductor chip 5, and the first semiconductor chip 4 and the second semiconductor chip 5 are laminated. Further, in the example shown in FIGS. 31 and 32, the first semiconductor chip 4 and the second semiconductor chip 5 are arranged so that the center position of the primary coil 11 and the center position of the secondary coil 12 are substantially linear in the limited state.

Figure 33:
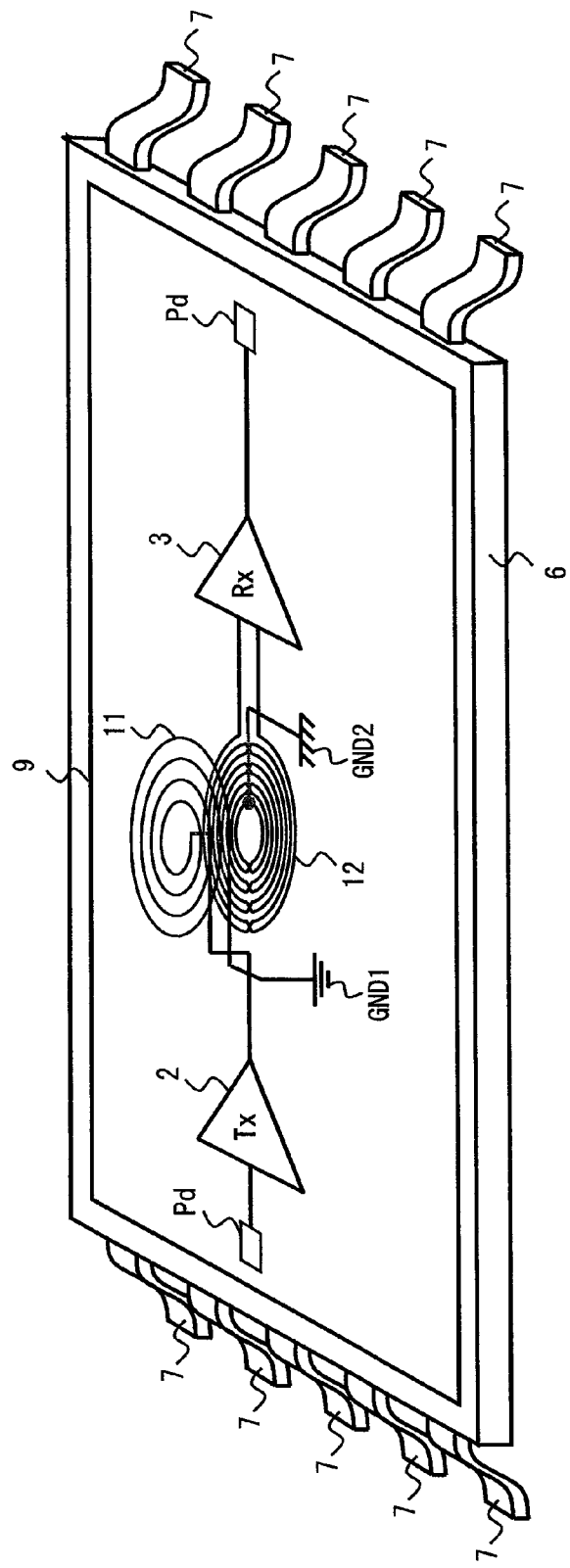
FIG. 33 is a schematic diagram showing implementation of a signal transmission system according to the present invention.

In the example shown in FIG. 33, the transmitting circuit 2, the receiving circuit 3, and the primary coil 11 and the secondary coil 12 are formed on one semiconductor chip 9. In the example shown in FIG. 33, the primary coil 11 and the secondary coil 12 are respectively formed on a first wiring layer and a second wiring layer that are vertically laminated in the semiconductor chip 9. Then, the area where the transmitting circuit 2 is placed and the area where the receiving circuit 3 is placed are insulated from each other by an insulating layer that is formed in a substrate of the semiconductor chip 9.

Figure 34:
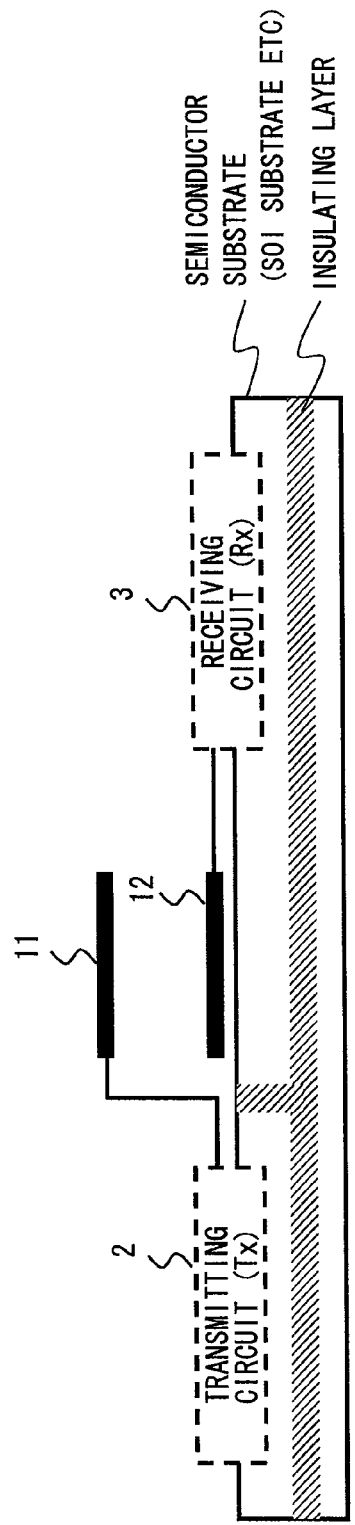
FIG. 34 is a schematic diagram showing implementation of a signal transmission system according to the present invention.
Figure 35:
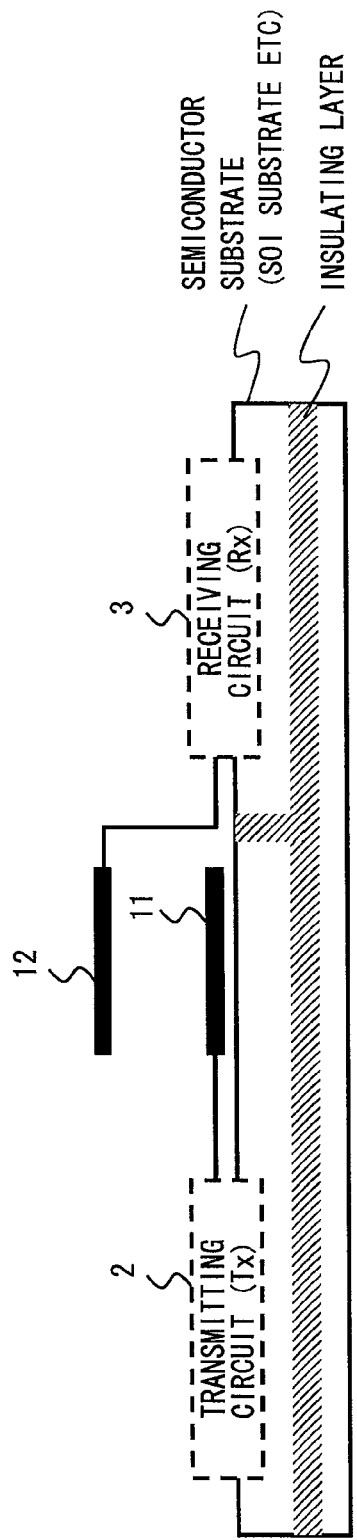
FIG. 35 is a schematic diagram showing implementation of a signal transmission system according to the present invention.

FIGS. 34 and 35 show cross section diagrams of the substrate of the semiconductor chip 9. In the example shown in FIG. 34, the area where the transmitting circuit 2 is formed and the area where the receiving circuit 3 is formed are electrically disconnected by an insulating layer. The primary coil 11 and the secondary coil 12 are placed in the area where the receiving circuit 3 is formed. On the other hand, in the example shown in FIG. 35, the area where the transmitting circuit 2 is formed and the area where the receiving circuit 3 is formed are electrically disconnected by an insulating layer. The primary coil 11 and the secondary coil 12 are placed in the area where the transmitting circuit 2 is formed.

Figure 36:
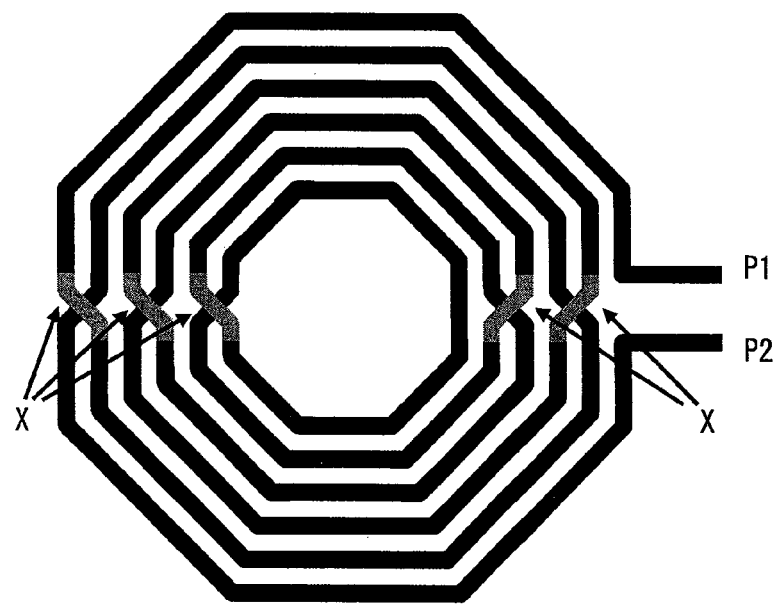
FIG. 36 is a diagram showing an example of the layout of a secondary coil according to the present invention.
Figure 37:
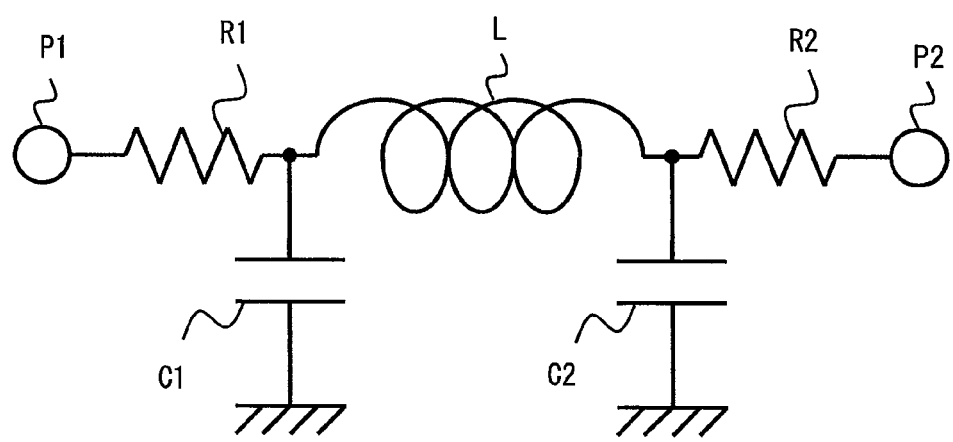
FIG. 37 is a diagram showing an equivalent circuit in FIG. 36.

FIG. 36 shows a layout example of the secondary coil 12. FIG. 37 is an equivalent circuit of FIG. 36. One end P1 and the other end P2 of the secondary coil 12 are connected to the receiving circuit 3, which is not shown. As shown in FIG. 36, it is preferred that the shape of the winding is close to a line symmetric shape. Consequently, the capacitance of the parasitic coupling capacitor C1 that is formed at one end P1 of the secondary coil 12 and the capacitance of the parasitic coupling capacitor C2 that is formed at the other end P2 of the secondary coil 12 are substantially the same as shown in FIG. 37. As a result, the differential amplifier 32 placed in the subsequent stage of the receiving circuit 3 can eliminate the in-phase common mode voltages with high accuracy. Note that, when the secondary coil 12 is mainly placed in the first wiring layer, either one of the two crossing wires is placed in an adjacent wiring layer (for example, the second wiring layer) at the wire crossing part X of the secondary coil 12. For example, in the case where a coil is traced from one end P1 of the secondary coil 12 as the start point to the other end P2 as the end point, for example, the coil is preferably placed in alternate wiring layers, such as the second wiring layer, the first wiring layer, the second wiring layer and the first wiring layer sequentially in this order, at a plurality of crossing parts X.

Figure 38:
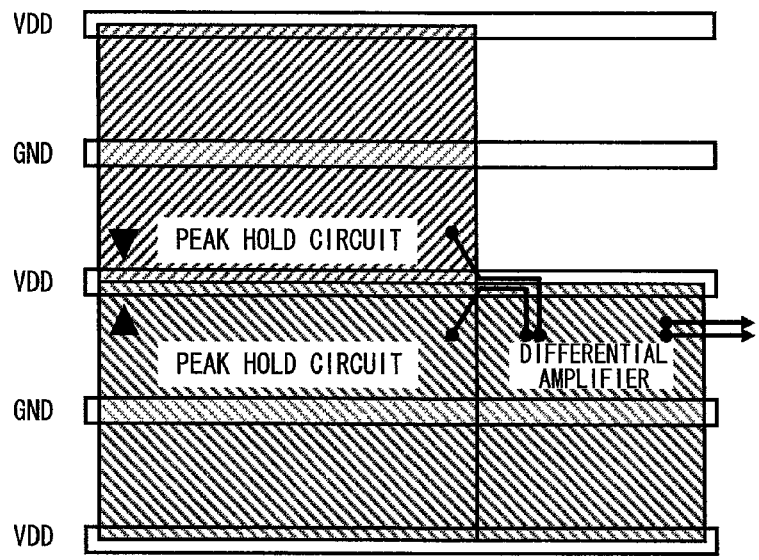
FIG. 38 is a diagram showing an example of the layout of a receiving circuit according to the present invention.
Figure 39:
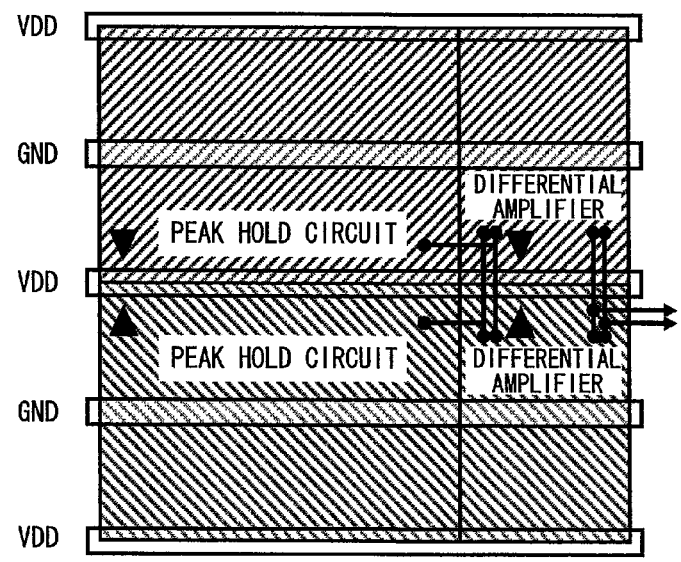
FIG. 39 is a diagram showing an example of the layout of a receiving circuit according to the present invention.

FIGS. 38 and 39 show examples of the layout of two peak hold circuits and the differential amplifier 32 in the subsequent stage placed on the receiving circuit 3. As shown in FIGS. 38 and 39, the two peak hold circuits are preferably arranged line-symmetrically to each other, and wires between the two peak hold circuits and the differential amplifier 32 in the subsequent stage are preferably equal to each other in length, shape and the like. Further, as shown in FIG. 39, the differential amplifier 32 may be divided into two and laid out line-symmetrically.

(Comparison with Related Art)

Figure 44:
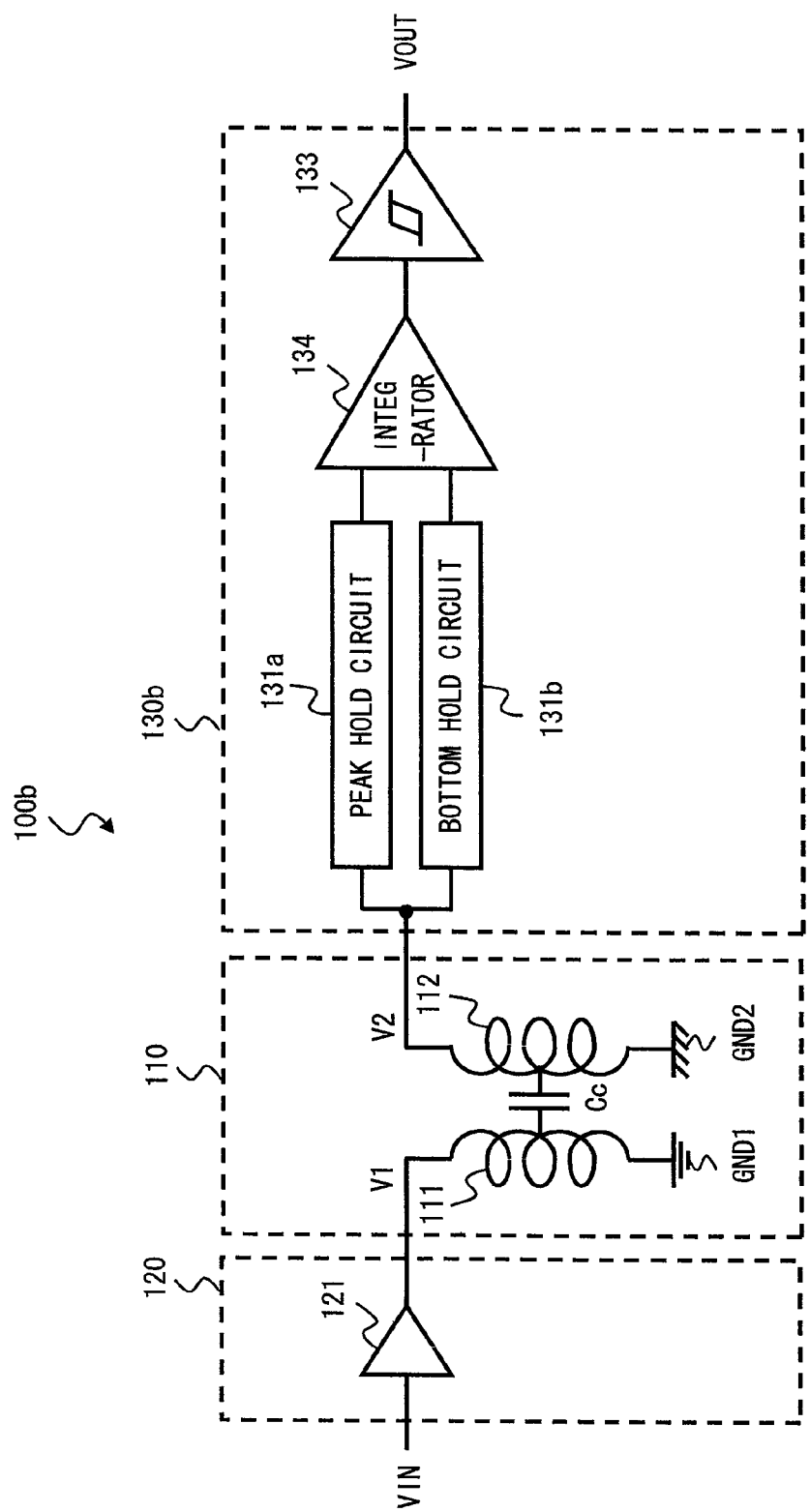
FIG. 44 is a block diagram showing a signal transmission system according to an idea before reaching the present invention.

Note that the inventor has studied a signal transmission system 100b as shown in FIG. 44 as well. The signal transmission system 100b shown in FIG. 44 includes a transmitting circuit 120, a receiving circuit 130b, and a transformer 110. The transmitting circuit 120 and the transformer 110 shown in FIG. 44 have the same circuit structures as the transmitting circuit 120 and the transformer 110 shown in FIG. 40 and not redundantly described.

The receiving circuit 130b includes a peak hold circuit 131a, a bottom hold circuit 131b, a comparator circuit 134, and a receiving buffer 133.

An input terminal of the peak hold circuit 131a and an input terminal of the bottom hold circuit 131b are connected to one terminal of the secondary coil 12. An output terminal of the peak hold circuit 131a is connected to one input terminal of the comparator circuit 134. An output terminal of the bottom hold circuit 131b is connected to the other input terminal of the comparator circuit 134. An output terminal of the comparator circuit 134 is connected to an input terminal of the receiving buffer 133. An output terminal of the receiving buffer 133 is connected to an external output terminal of the receiving circuit 130b.

Figure 45:
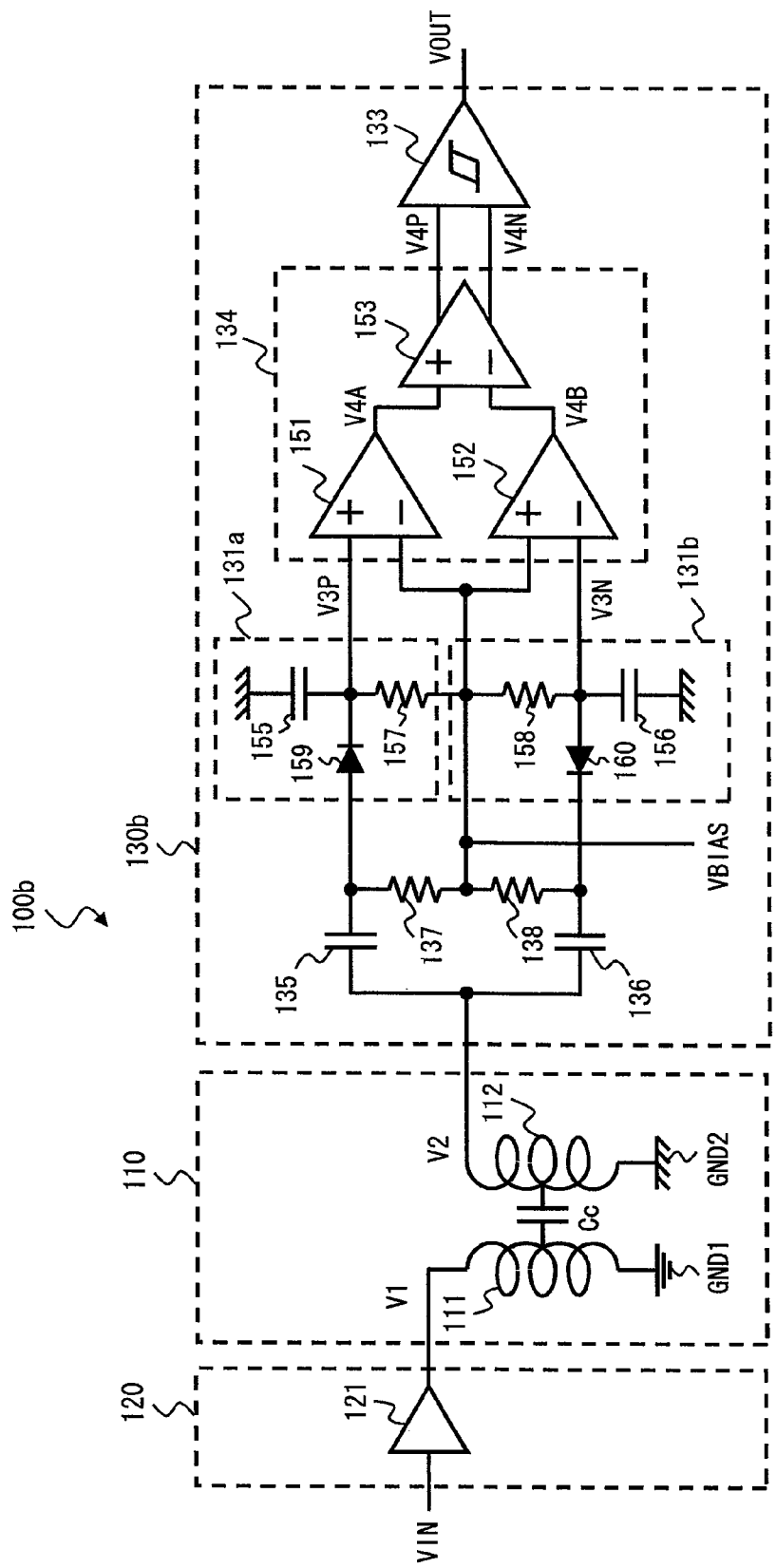
FIG. 45 is a block diagram showing a signal transmission system according to an idea before reaching the present invention.

FIG. 45 is a diagram showing a specific structural example of the peak hold circuit 131a, the bottom hold circuit 131b and the comparator circuit 134 shown in FIG. 44. Note that the signal transmission system 100b shown in FIG. 45 further includes resistor elements 137 and 138 and capacitor elements 135 and 136 in order to supply a bias voltage VBIAS between the input and output terminals of the peak hold circuit 131a and the bottom hold circuit 131b.

The peak hold circuit 131a includes a diode 159, a capacitor element 155, and a resistor element 157. The bottom hold circuit 131b includes a diode 160, a capacitor element 156, and a resistor element 158. The comparator circuit 134 includes differential amplifiers 151 to 153.

In the diode 159, the anode is connected to one end of the capacitor element 135, and the cathode is connected to the non-inverting input terminal of the differential amplifier 151. In the capacitor element 155, one end is connected to the cathode of the diode 159, and the other end is connected to the ground voltage terminal GND2. In the resistor element 157, one end is connected to the cathode of the diode 159, and the bias voltage VBIAS is supplied to the other end. In the resistor element 137, one end is connected to the anode of the diode 159, and the bias voltage VBIAS is supplied to the other end. The other end of the capacitor element 135 is connected to one end of the secondary coil 112.

In the diode 160, the cathode is connected to one end of the capacitor element 136, and the anode is connected to the non-inverting input terminal of the differential amplifier 152. In the capacitor element 156, one end is connected to the anode of the diode 160, and the other end is connected to the ground voltage terminal GND2. In the resistor element 158, one end is connected to the anode of the diode 160, and the bias voltage VBIAS is supplied to the other end. In the resistor element 138, one end is connected to the cathode of the diode 160, and the bias voltage VBIAS is supplied to the other end. The other end of the capacitor element 136 is connected to one end of the secondary coil 112.

In the differential amplifier 151, the bias voltage VBIAS is supplied to the inverting input terminal, and the output terminal is connected to the non-inverting input terminal of the differential amplifier 153. In the differential amplifier 152, the bias voltage VBIAS is supplied to the non-inverting input terminal, and the output terminal is connected to the inverting input terminal of the differential amplifier 153. A pair of output terminals of the differential amplifier 153 are respectively connected to the corresponding input terminals of the receiving buffer 133.

The peak hold circuit 131a detects a pulse signal with a positive amplitude in the pulse signal superimposed on the received signal V2, holds it for a specified period of time and then outputs the hold signal V3P. The bottom hold circuit 131b detects a pulse signal with a negative amplitude in the pulse signal superimposed on the received signal V2, holds it for a specified period of time and then outputs the hold signal V3N.

In the comparator circuit 134, the differential amplifier 151 outputs an amplified signal V4A in accordance with a voltage difference between the hold signal V3P, which is a pulse signal with a positive amplitude with the increased pulse width, and the bias voltage VBIAS. The differential amplifier 152 outputs an amplified signal V4B in accordance with a voltage difference between the hold signal V3N, which is a pulse signal with a negative amplitude with the increased pulse width, and the bias voltage VBIAS. After that, the differential amplifier 153 outputs transmission signals V4P and V4N in accordance with a voltage difference between the amplified signal V4A and the amplified signal V4B. The receiving buffer 133 reproduces the transmission data VIN based on the transmission signals V4P and V4N and outputs it as output data VOUT.

As described above, in the signal transmission system 100b shown in FIGS. 44 and 45, the peak hold circuit 131a and the bottom hold circuit 131b increase the pulse width of the pulse signal superimposed on the received signal V2 and output the hold signals V3P and V3N, respectively. Therefore, the differential amplifier in the subsequent stage can operate even when it is not composed of a micro CMOS.

However, in the signal transmission system 100b, because the secondary coil 112 that constitutes the transformer 110 does not have the center tap, there is a problem that a signal transmission error occurs due to the effect of the common mode voltage.

The case where the circuit structure including one peak hold circuit and one bottom hold circuit as shown in FIGS. 44 and 45 and the structure of the secondary coil 12 having the center tap as shown in FIG. 42 are simply combined is considered.

Figure 46:
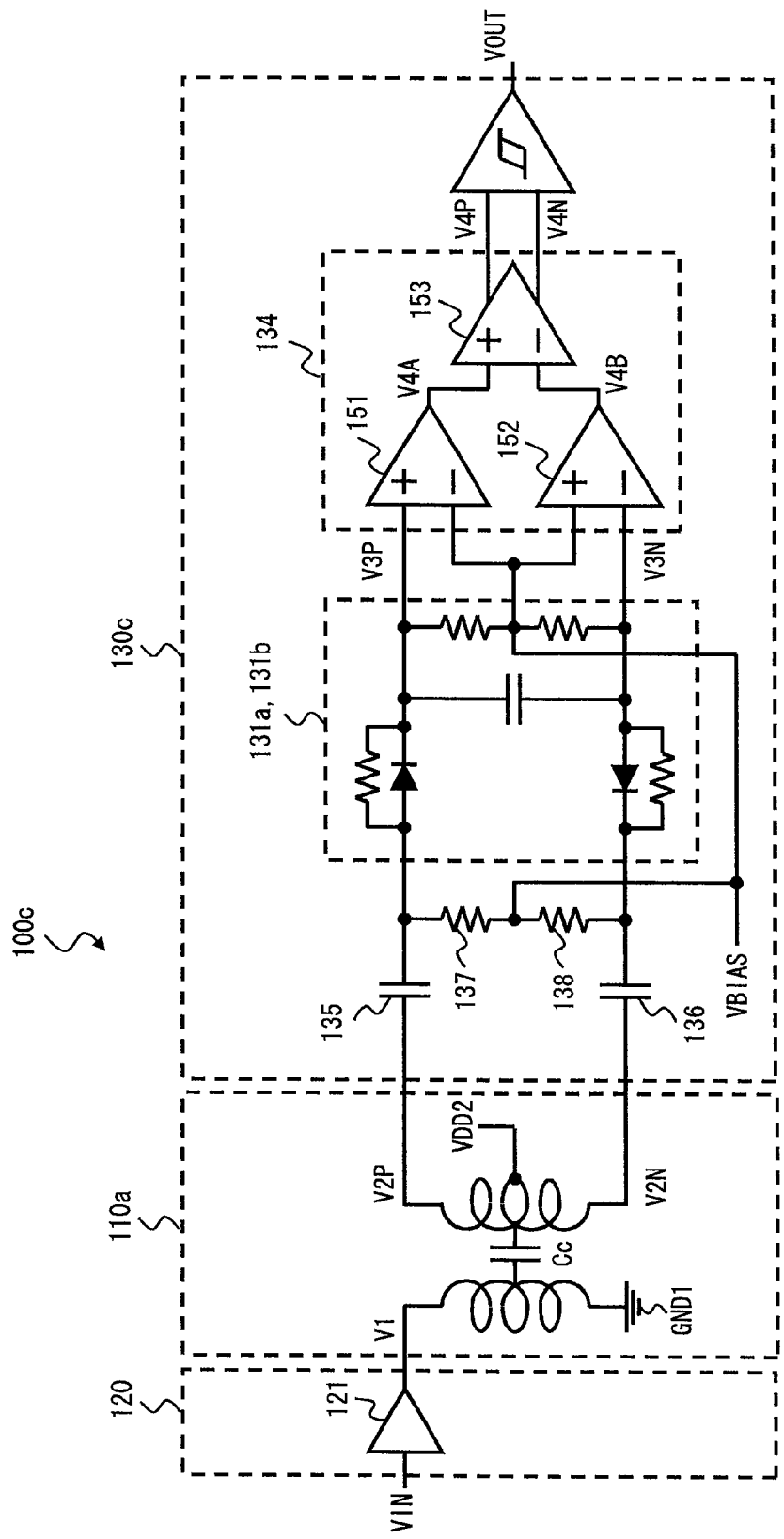
FIG. 46 is a block diagram showing a signal transmission system according to an idea before reaching the present invention.
Figure 47:
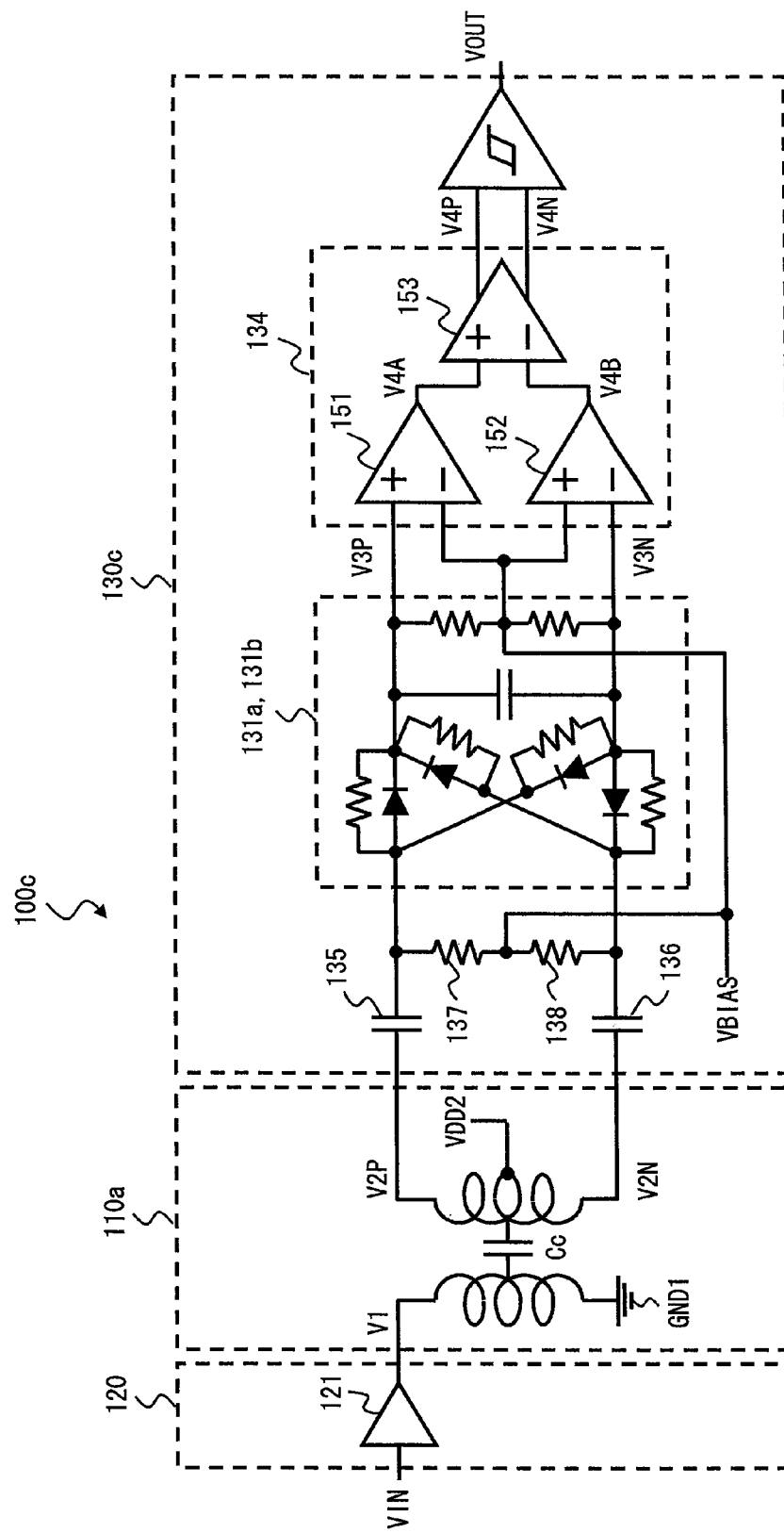
FIG. 47 is a block diagram showing a signal transmission system according to an idea before reaching the present invention.

FIGS. 46 and 47 show examples of the circuit structure where the circuit structure including one peak hold circuit and one bottom hold circuit and the structure of the secondary coil 12 having the center tap are simply combined. Note that FIG. 46 shows an example of the circuit structure that performs half-wave rectification of the received signals V2P and V2N, and FIG. 47 shows an example of the circuit structure that performs full-wave rectification of the received signals V2P and V2N.

In a signal transmission system 100c shown in FIG. 46 and a signal transmission system 100d shown in FIG. 47, the voltage level of the hold signal V3P that is output from the peak hold circuit 131a is always the bias voltage VBIAS or higher. On the other hand, the voltage level of the hold signal V3N that is output from the bottom hold circuit 131b is always the bias voltage VBIAS or lower. Accordingly, there is a high possibility that the output data VOUT is High level regardless of the value of the transmission data VIN.

In this manner, it is not possible to suppress the effect of the common mode voltage and allow the differential amplifier in the subsequent stage to operate with high accuracy without increasing the circuit size of the transformer by simply combining the circuit structure including one peak hold circuit and one bottom hold circuit as shown in FIGS. 44 and 45 and the structure of the secondary coil 12 having the center tap as shown in FIG. 42.

This application is based upon and claims the benefit of priority from Japanese patent application No. 2011-111615, filed on May 18, 2011, the disclosure of which is incorporated herein in its entirety by reference.

REFERENCE SIGNS LIST 1-1h SIGNAL TRANSMISSION SYSTEM
2 TRANSMITTING CIRCUIT
3 RECEIVING CIRCUIT
4 FIRST SEMICONDUCTOR CHIP
5 SECOND SEMICONDUCTOR CHIP
6 SEMICONDUCTOR PACKAGE
7 LEAD WIRE
8 THIRD SEMICONDUCTOR CHIP
9 SEMICONDUCTOR CHIP
10 TRANSFORMER
11 PRIMARY COIL
12 SECONDARY COIL
21 TRANSMITTING BUFFER
31 PULSE WIDTH AMPLIFIER CIRCUIT 32, 43, 44 DIFFERENTIAL AMPLIFIER
33 RECEIVING BUFFER
34 INTEGRATOR
35-38 PROTECTION DIODE
39, 40, 47, 48, 309, 310, 315, 316, 327, 328 RESISTOR ELEMENT
41, 42, 49, 50, 51, 317, 318, 321 CAPACITOR ELEMENT
45 RS LATCH
311, 312 PEAK HOLD CIRCUIT
313, 314 THRESHOLD CIRCUIT
319, 320, 323, 324 DIODE
325, 326 BOTTOM HOLD CIRCUIT

The invention claimed is:

1. A receiving circuit that operates in a power supply system different from a transmitting circuit outputting a transmission signal and receives the transmission signal through an AC coupling device where a primary coil through which the transmission signal flows and a secondary coil having first and second ends and a center tap to which a specified voltage is supplied from an external terminal are magnetically coupled, comprising:
a pulse width amplifier circuit including a first peak hold circuit that holds a first pulse signal with a positive amplitude appearing at a first end of the secondary coil for a first specified period of time and outputs the signal as a first hold signal, and a second peak hold circuit that holds a second pulse signal with a positive amplitude appearing at the second end of the secondary coil for a second specified period of time and outputs the signal as a second hold signal; and
a comparator circuit having a first anode and a second anode that compares a voltage of the first hold signal and a voltage of the second hold signal and outputs a comparison result,
wherein the first peak hold circuit comprises:
a first diode element having an anode connected to the first end of the secondary coil and a cathode connected to the first anode of the comparator circuit; and
a first resistor element having one end connected to the cathode of the first diode element and another end to which a reference voltage is supplied,
wherein the second peak hold circuit comprises:
a second diode element having an anode connected to the second end of the secondary coil and a cathode connected to the second anode of the comparator circuit; and
a second resistor element having one end connected to the cathode of the second diode and another end to which the reference voltage is supplied, and
wherein the pulse width amplifier circuit further includes either a third capacitor element having one end connected to the cathode of the first diode element and another end connected to the cathode of the second diode element, or a first capacitor element that accumulates charges supplied from the first end of the secondary coil through the first diode element and a second capacitor element that accumulates charges supplied from the second end of the secondary coil through the second diode element.

2. The receiving circuit according to claim 1, wherein the pulse width amplifier circuit holds pulse signals appearing at the first and second ends of the secondary coil for a specified period of time and thereby increases a pulse width of the pulse signals and outputs the signals as the first and second hold signals, respectively.

3. The receiving circuit according to claim 1, wherein a voltage of a second power supply of a power supply system different from a first power supply for driving the transmitting circuit is supplied from an external terminal to the center tap of the secondary coil.

4. The receiving circuit according to claim 1, wherein
the first resistor element has one end connected to the cathode of the first diode element and another end connected to the anode of the first diode element, where a specified voltage as the reference voltage is supplied from the center tap of the secondary coil to the other end of the first resistor element, and
the second resistor element has one end connected to the cathode of the second diode element and another end connected to the anode of the second diode element, where a specified voltage as the reference voltage is supplied from the center tap of the secondary coil to the other end of the second resistor element.

5. The receiving circuit according to claim 1, wherein the pulse width amplifier circuit includes:
a first bottom hold circuit that holds a third pulse signal with a negative amplitude appearing at the first end of the secondary coil for a third specified period of time and outputs the signal as a third hold signal; and
a second bottom hold circuit that holds a fourth pulse signal with a negative amplitude appearing at the second end of the secondary coil for a fourth specified period of time and outputs the signal as a fourth hold signal, and
the comparator circuit outputs the comparison result based on voltages of the third and fourth hold signals in addition to voltages of the first and second hold signals,
wherein the first bottom hold circuit includes:
a third diode element having a cathode connected to the first end of the secondary coil and an anode connected to the second anode of the comparator circuit; and
a third resistor element having one end connected to the anode of the third diode element and another end to which a reference voltage is supplied, and
the second bottom hold circuit includes:
a fourth diode element having a cathode connected to the second end of the secondary coil and an anode connected to the first anode of the comparator circuit; and
a fourth resistor element having one end connected to the anode of the fourth diode element and another end to which the reference voltage is supplied,
wherein the pulse width amplifier circuit includes either the third capacitor element and a fifth capacitor element having one end connected to the anode of the third diode element and another end connected to the anode of the forth diode element, or the first capacitor element having an end connected to the anode of the fourth diode element and the second capacitor element having an end connected to the anode of the third diode element.

6. A receiving circuit that operates in a power supply system different from a transmitting circuit outputting a transmission signal and receives the transmission signal through an AC coupling device where a primary coil through which the transmission signal flows and a secondary coil having first and second ends and a center tap to which a specified voltage is supplied from an external terminal are magnetically coupled, comprising:
a pulse width amplifier circuit including a first bottom hold circuit that holds a first pulse signal with a negative amplitude appearing at a first end of the secondary coil for a first specified period of time and outputs the signal as a first hold signal, and a second bottom hold circuit that holds a pulse signal with a negative amplitude appearing at the second end of the secondary coil for a second specified period of time and outputs the signal as a second hold signal; and a comparator circuit having a first anode and a second anode that compares a voltage of the first hold signal and a voltage of the second hold signal and outputs a comparison result, wherein the first bottom hold circuit includes:

a first diode element having a cathode connected to a first end of the secondary coil and an anode connected to the first anode of the comparator circuit; and a first resistor element having one end connected to the anode of the first diode element and another end to which a reference voltage is supplied, and the second bottom hold circuit includes:

a second diode element having a cathode connected to the second end of the secondary coil and an anode connected to the second anode of the comparator circuit; and a second resistor element having one end connected to the anode of the second diode element and another end to which the reference voltage is supplied, and wherein the pulse width amplifier circuit includes either a third capacitor element having one end connected to the anode of the first diode element and another end connected to the anode of the second diode element, or a first capacitor element that releases accumulated charges toward the first end of the secondary coil through the first diode element and a second capacitor element that releases accumulated charges toward the second end of the secondary coil through the first diode element.

7. The receiving circuit according to claim 6, wherein the first resistor element has one end connected to the anode of the first diode element and another end connected to the cathode of the first diode element, where a specified voltage as the reference voltage is supplied from the center tap of the secondary coil to the other end of the first resistor element, and the second resistor element has one end connected to the anode of the second diode element and another end connected to the cathode of the second diode element, where a specified voltage as the reference voltage is supplied from the center tap of the secondary coil to the other end of the second resistor element.

8. A receiving circuit that operates in a power supply system different from a transmitting circuit outputting a transmission signal and receives the transmission signal through an AC coupling device where a primary coil through which the transmission signal flows and a secondary coil having first and second ends and a center tap to which a specified voltage is supplied from an external terminal are magnetically coupled, comprising:

a pulse width amplifier circuit that holds a first pulse signal appearing at a first end of the secondary coil for a first specified period of time and outputs the signal as a first hold signal and holds a second pulse signal appearing at the second end of the secondary coil for a second specified period of time and outputs the signal as a second hold signal; and a comparator circuit having a first anode and a second anode that compares a voltage of the first hold signal and a voltage of the second hold signal and outputs a comparison result, wherein the pulse width amplifier circuit includes: a first threshold circuit including first and third diode elements through which current flows when a voltage difference between an anode and a cathode of the first and third diode elements becomes a specified value or larger, the first diode having an anode connected to the first end of the secondary coil and a cathode connected to the first anode of the comparator circuit, the third diode having a cathode connected to the first end of the secondary coil and an anode connected to the first anode of the comparator circuit;

a first resistor element having one end connected to the cathode of the first diode and another end to which a reference voltage is supplied;

a second threshold circuit including second and fourth diode elements through current flows when a voltage difference between an anode and a cathode of the second and fourth diode elements becomes a specified value or larger, the second diode having an anode connected to the second end of the secondary coil and a cathode connected to the second anode of the comparator circuit, and the fourth diode having a cathode connected to the second end of the secondary coil and an anode connected to the second anode of the comparator circuit; and a second resistor element having one end connected to the cathode of the second diode element and another end to which the reference voltage is supplied, wherein the pulse width amplifier circuit further includes either a third capacitor element having one end connected to the cathode of the first diode element and another end connected to the cathode of the second diode or a first capacitor element having one end connected to the cathode of the first diode element and another end to which the reference voltage is supplied and a second capacitor element having one end connected to the cathode of the second diode element and another end to which the reference voltage is supplied.

9. The receiving circuit according to claim 8, wherein the first resistor element has one end connected to the cathode of the first diode element and another end connected to the anode of the first diode element, where a specified voltage as the reference voltage is supplied from the center tap of the secondary coil to the other end of the first resistor element, and the second resistor element has one end connected to the cathode of the diode element and another end connected to the anode of the second diode element, where a specified voltage as the reference voltage is supplied from the center tap of the secondary coil to the other end of the second resistor element.

10. The receiving circuit according to claim 8, comprising:

a first input-side capacitor element connected between the first end of the secondary coil and the anode of the first diode element;

a second input-side capacitor element connected between the second end of the secondary coil and the anode of the second diode element;

a third input-side capacitor element connected between the first end of the secondary coil and the cathode of the third diode element; and a fourth input-side capacitor element connected between the other end of the secondary coil and the cathode of the fourth diode element, wherein a bias voltage is supplied through a resistor element to the anode of the first diode element, the anode of the second diode element, the cathode of the third diode element and the cathode of the fourth diode element as a reference voltage.

* * * * *